US009102872B2

(12) United States Patent
Ueno et al.

(10) Patent No.: US 9,102,872 B2
(45) Date of Patent: Aug. 11, 2015

(54) DEVICE MATERIAL FOR HOLE INJECTION TRANSPORT LAYER, INK FOR FORMING HOLE INJECTION TRANSPORT LAYER, DEVICE COMPRISING HOLE INJECTION TRANSPORT LAYER, AND METHOD FOR PRODUCING THE DEVICE

(75) Inventors: Shigehiro Ueno, Tokyo-to (JP); Masato Okada, Tokyo-to (JP); Yosuke Taguchi, Tokyo-to (JP); Seiji Take, Tokyo-to (JP); Masaya Shimogawara, Tokyo-to (JP); Nanae Tagaya, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 541 days.

(21) Appl. No.: 13/387,227

(22) PCT Filed: Jul. 29, 2010

(86) PCT No.: PCT/JP2010/062822
§ 371 (c)(1),
(2), (4) Date: Jan. 26, 2012

(87) PCT Pub. No.: WO2011/013759
PCT Pub. Date: Feb. 3, 2011

(65) Prior Publication Data
US 2012/0119200 A1 May 17, 2012

(30) Foreign Application Priority Data

Jul. 31, 2009 (JP) ................................ 2009-179440

(51) Int. Cl.
| | | |
|---|---|---|
| H01L 51/54 | (2006.01) | |
| C09D 11/00 | (2014.01) | |
| H01L 51/00 | (2006.01) | |
| C07F 11/00 | (2006.01) | |
| B82Y 10/00 | (2011.01) | |
| B82Y 30/00 | (2011.01) | |
| C09K 11/67 | (2006.01) | |
| C09K 11/02 | (2006.01) | |
| C09K 11/06 | (2006.01) | |
| H05B 33/14 | (2006.01) | |
| H01L 51/50 | (2006.01) | |

(52) U.S. Cl.
CPC ............... *C09K 11/671* (2013.01); *C09K 11/02* (2013.01); *C09K 11/06* (2013.01); *H05B 33/14* (2013.01); *H01L 51/5048* (2013.01); *H01L 51/5088* (2013.01); *H01L 2251/308* (2013.01)

(58) Field of Classification Search
None
See application file for complete search history.

(56) References Cited

U.S. PATENT DOCUMENTS

| | | | | |
|---|---|---|---|---|
| 6,650,047 | B2 * | 11/2003 | Aoki et al. ..................... | 313/506 |
| 2003/0059686 | A1 | 3/2003 | Kobayashi et al. | |
| 2004/0075384 | A1 | 4/2004 | Aoki | |
| 2006/0094189 | A1 | 5/2006 | Zurcher et al. | |
| 2008/0169755 | A1 * | 7/2008 | Kim et al. ...................... | 313/504 |
| 2008/0233432 | A1 * | 9/2008 | Inoue et al. ................... | 428/691 |
| 2009/0001879 | A1 | 1/2009 | Ikeda et al. | |
| 2009/0085473 | A1 | 4/2009 | Iizumi et al. | |
| 2010/0019235 | A1 | 1/2010 | Iizumi et al. | |
| 2011/0037065 | A1 | 2/2011 | Ueno et al. | |
| 2011/0163327 | A1 | 7/2011 | Ueno et al. | |

FOREIGN PATENT DOCUMENTS

| | | |
|---|---|---|
| EP | 1128438 A1 | 8/2001 |
| JP | 59-075205 A | 4/1984 |
| JP | 09-063771 A | 3/1997 |
| JP | 11-329741 A | 11/1999 |
| JP | 2000-249821 A | 9/2000 |
| JP | 2004-071286 A | 3/2004 |
| JP | 2006-114521 A | 4/2006 |
| JP | 2006-155978 A | 6/2006 |
| JP | 2007-178783 A | 11/2007 |
| JP | 2007-287586 A | 11/2007 |
| JP | 2008-041894 A | 2/2008 |
| JP | 2008-153159 A | 7/2008 |
| JP | 2009-027154 A | 2/2009 |
| JP | 2009-087781 A | 4/2009 |
| KR | 20090016679 A | 2/2009 |
| WO | 2006/101018 A1 | 9/2006 |
| WO | 2007/125934 A1 | 11/2007 |
| WO | 2009/133903 A1 | 11/2009 |
| WO | 2009/133907 A1 | 11/2009 |

OTHER PUBLICATIONS

Tsunenori Suzuki, et al; "69.3: Polymer/Metal-Oxide Composite: A Novel Buffer Layer for Solution-Processible OLEDs", SID Symposium Digest of Technical Papers—May 2007—vol. 38, Issue 1, pp. 1840-1843.
Q. Pei, et al; "Solid state polymer light-emitting electrochemical cells: Recent developments", Synthethic Metals, vol. 85, Issued 1-3, Mar. 15, 1997, pp. 1229-1232.
International Search Report: mailed Sep. 7, 2010; PCT/JP2010/062822.
Angélina Gamard, et al; Conductive F-doped Tin Dioxide Sol-Gel Materials from Fluorinated β-Diketonate Tin(IV) Complexes, Characterization and Thermolytic Behavior, Chemistry of Materials, vol. 12, No. 11, Nov. 2000, pp. 3419-3426, XP55131584, ISSN: 0897-4756, DOI: 10.1021/cm001073k.
Shun-Li Li, et al; "Syntheses and Structures of Organic-Inorganic Hybrid Compounds Based on Metal-Fluconzazole Coordination Polymers and the β-$Mo_8O_{26}$Anion", Inorganic Chemistry, vol. 46, No. 20, Oct. 1, 2007, pp. 8283-8290, XP55131580, ISSN: 0020-1669, DOI: 10.1021/ic700913m.
Extended European Search Report dated May 8, 2014; Appln. No. 10804505.5-1354/461388 PCT/JP2010062822.

\* cited by examiner

*Primary Examiner* — Andrew K Bohaty
(74) *Attorney, Agent, or Firm* — Ladas & Parry LLP

(57) ABSTRACT

Disclosed is a device material for a hole injection transport layer. A fluorine-containing organic compound is attached to the surface of a transition metal-containing nanoparticle or nanocluster which contains at least a transition metal oxide. Also disclosed are a device and an ink for a hole injection transport layer, the device and ink including the device material each, and a method for producing the device.

20 Claims, 11 Drawing Sheets

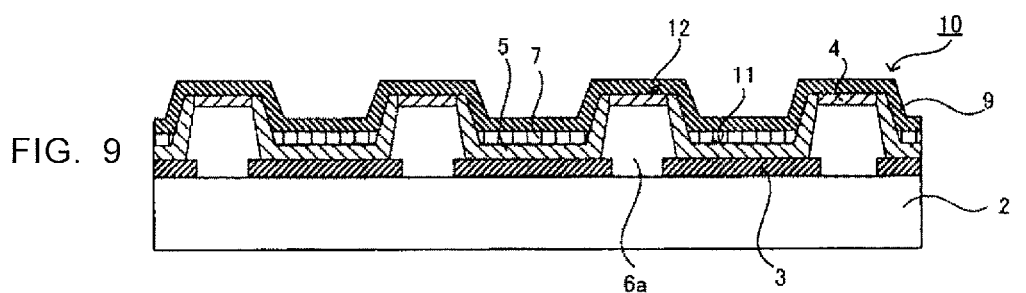
FIG. 9
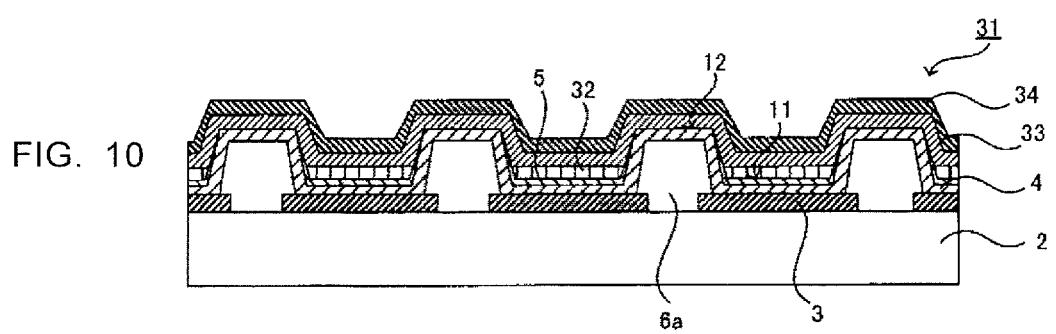
FIG. 10
FIG. 11
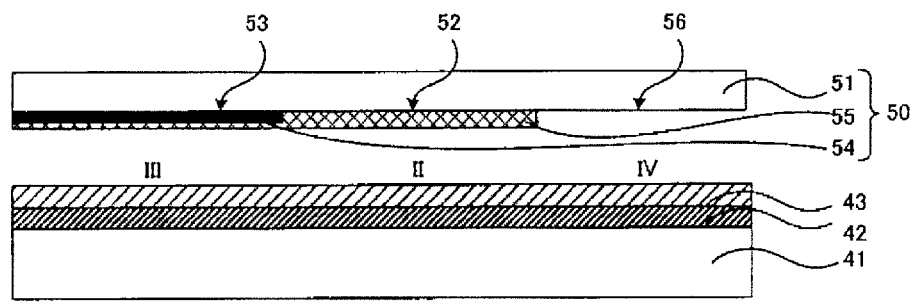

DEVICE MATERIAL FOR HOLE INJECTION TRANSPORT LAYER, INK FOR FORMING HOLE INJECTION TRANSPORT LAYER, DEVICE COMPRISING HOLE INJECTION TRANSPORT LAYER, AND METHOD FOR PRODUCING THE DEVICE

TECHNICAL FIELD

The present invention relates to a device material for a hole injection transport layer, which has wettability that can be altered by energy irradiation and a hole injecting transporting property. The present invention also relates to an ink for forming a hole injection transport layer, which comprises the device material, a device comprising a hole injection transport layer, and a method for producing the device.

BACKGROUND ART

A device comprising a hole injection transport layer is expected to be widely applied to organic devices such as an organic electroluminescence device (hereinafter referred to as organic EL device), an organic transistor, an organic solar cell and an organic semiconductor, and a broad range of basic devices and uses such as a quantum-dot light emitting device and an oxide-based compound solar cell.

For example, the organic EL device is a charge injection type light emitting device which uses emission of light that occurs when an electron and a hole reach a light emitting layer and they are recombined. Now, various kinds of multilayer structures are proposed to obtain high light emitting efficiency and long life, such as a five-layer structure comprising an electron injection layer/electron transport layer/light emitting layer/hole transport layer/hole injection layer.

The layers other than the light emitting layer, such as the electron injection layer, electron transport layer, hole transport layer and hole injection layer, are said to be effective in making it easy to inject or transport an electrical charge into a light emitting layer, blocking an electrical charge and thus maintaining the balance between electronic current and hole current, or preventing diffusion of light energy excitons.

It has been attempted to increase electrical conductivity by mixing an oxidizing compound with a hole transporting material in order to increase charge transport performance and charge injection performance.

In patent literatures 1 to 4, a metal oxide, which is a compound semiconductor, is used as an oxidizing compound, that is, an electron-accepting compound. For example, a thin film is formed from a metal oxide such as vanadium pentoxide or molybdenum trioxide by a vapor-deposition method, or a mixed film is formed by co-deposition of a molybdenum oxide and an amine-based low molecular compound.

In non-patent literature 1, as an attempt to form a coating film of vanadium pentoxide, a method for forming a charge transfer complex is disclosed, in which a solution in which oxovanadium(V)tri-i-propoxideoxide is dissolved as an oxidizing compound (that is, electron-accepting compound) is used, and after a coating film is formed from the mixture of the solution and a hole transporting polymer, the coating film is hydrolyzed with water vapor to make a vanadium oxide, thereby forming a charge transfer complex.

In non-patent literature 5, an attempt to form a coating film of molybdenum trioxide is described, in which fine particles produced by physically pulverizing molybdenum trioxide are dispersed in a solution to form a slurry, and a hole injection layer is formed by applying the slurry.

However, even though the oxidizing materials as disclosed in patent literatures 1 to 5 and non-patent literature 1 are used for hole transporting materials, it is difficult to obtain a long life or a further increase in life is needed. The metal oxides disclosed in patent literatures 1 to 4 can increase hole injection performance to some extent; however, interface adhesion to an adjacent organic compound layer becomes poor, and it is considered to have a negative effect on the life property.

In patent literature 5, it is described that a charge injection layer was produced by using a slurry obtained by dispersing oxidized molybdenum particles having an average particle diameter of 20 nm in a solvent and by a screen printing method. However, in the case of using the method of pulverizing $MoO_3$ powder as disclosed in patent literature 5, it is actually very difficult to produce fine particles of uniform size having a diameter of 10 nm or less to meet the request for forming a hole injection layer having a thickness of about 10 nm, for example. Also, it is very difficult to disperse oxidized molybdenum particles produced by pulverization stably in a solution, without aggregating the particles. If the solution of fine particles is unstable, only a film with large convexoconcaves and poor flatness can be formed from the solution, which leads to short circuit in devices. If a thin film can be formed only by the vapor-deposition method, there is a problem that even if a light emitting layer is formed by separately applying materials by a solution coating method such as an ink jet printing method, the advantages of the solution coating method are not fully utilized. That is, in order not to damage the liquid repellency of a bank between light emitting layers by a molybdenum oxide to be lyophilic, it is needed to deposit a hole injection layer or hole transport layer containing a molybdenum oxide, which is an inorganic compound, using a high resolution mask. Therefore, in terms of cost and yield, the advantages of the solution coating method cannot be utilized. In addition, the molybdenum oxide, which is an inorganic compound, is an oxygen-deficient oxide semiconductor, so that in terms of electrical conductivity, $Mo_2O_5$ having an oxidation number of +5 is a better conductor at normal temperature than $MoO_3$ having an oxidation number of +6. However, $Mo_2O_5$ having an oxidation number of +5 is unstable in the air; therefore, compounds that can be thermally vapor-deposited thereon easily are limited to oxidized compounds having a stable valence such as $MoO_3$ and $MoO_2$.

A film forming property and the stability of a thin film are largely concerned with the life property of devices. In general, the life of organic EL devices is a time to half-luminescence when the device is continuously driven in a given current operation, and it is said a device with a longer time to half-luminescence has a longer life.

In display production using an EL device, etc., a light emitting layer and so on are generally formed by patterning. Various kinds of patterning methods are proposed as the method for forming a light emitting layer and so on, such as a method for vapor-depositing materials through a shadow mask, a method for separately applying materials by ink jet printing, a method for transferring emitting dyes, a flexographic printing method and a gravure printing method. In the method for separately applying materials by ink jet printing, to order to form a high-resolution, fine pattern, it is proposed to form a bank and perform an ink repellent treatment on the bank surface by a plasma treatment with fluorine gas or the like (for example, see patent literature 6) and it is also proposed to form a bank using liquid repellent materials (for example, see patent literature 7). In addition, as the method for forming a light emitting layer by patterning, a method using a photocatalyst (for example, patent literature 8) and a method using vacuum ultraviolet light are proposed, both of which methods are able to form a high-resolution pattern.

In the above method of performing an ink repellent treatment on the bank surface by a plasma treatment with fluorine gas or the like, however, the heat resistance of the ink repellent treatment is low, so that problems are caused in subsequent processes. For example, there is a problem that due to heating at relatively high temperature (such as 200° C.) which is performed when a layer is formed in an opening of the bank after the ink repellent treatment, fluorine introduced into the bank is eliminated to provide the bank with ink-affinity; therefore, layers cannot be stacked and the properties of the resulting device are deteriorated. Also in the case where the bank is formed with an ink repellent material, in many ink repellent materials, fluorine is likely to be eliminated therefrom by heating at relatively high temperature and such materials have no resistance; therefore, they have a similar problem to the above. By such a method, a bank, in which the top is ink repellent but the side has ink affinity, cannot be formed.

The above method which uses a photocatalyst and that which uses vacuum ultraviolet light utilize such a phenomenon that, in a part affected by photocatalytic action associated with energy irradiation or in a part irradiated with vacuum ultraviolet light, the wettability of the part is altered so as to lower the liquid contact angle thereof. In particular, the methods utilizes the phenomenon that the part affected by photocatalytic action associated with energy irradiation or the part irradiated with vacuum ultraviolet light becomes a lyophilic region, while a part not affected by photocatalytic action associated with energy irradiation or a part not irradiated with vacuum ultraviolet light becomes a liquid repellent region. Because of this, a light emitting layer or the like is formed on the part affected by photocatalytic action associated with energy irradiation or the part irradiated with vacuum ultraviolet light. However, when a layer having alterable wettability has a hole transporting property or the like, there is a material deterioration in the part affected by photocatalytic action associated with energy irradiation or the part irradiated with vacuum ultraviolet light, resulting in a problem of damage to the hole transporting property or the like.

CITATION LIST

Patent Literature 1: Japanese Patent Application Laid-Open (JP-A) No. 2006-155978
Patent Literature 2: JP-A No. 2007-287586
Patent Literature 3: Japanese Patent No. 3748110
Patent Literature 4: Japanese Patent No. 2824411
Patent Literature 5: JP-A No. 2008-041894
Patent Literature 6: Japanese Patent No. 3951445
Patent Literature 7: JP-A No. S59-75205
Patent Literature 8: JP-A No. 2004-71286
Patent Literature 9: JP-A No. 2007-178783
Non-Patent Literature 1: SID 07 DIGEST pp. 1840-1843 (2007)

SUMMARY OF INVENTION

Technical Problem

The above method which uses a photocatalyst and that which uses vacuum ultraviolet light can form a pattern with different wettability only by energy irradiation, so that they can save the time needed for patterning of a light emitting layer or the like and thus are useful methods. However, there has been no material which keeps high resistance to energy irradiation such as ultraviolet irradiation and does not lose a hole injecting transporting property even when it is used in the above method which uses a photocatalyst or that which uses vacuum ultraviolet light, and which does not deteriorate lyophilic and liquid repellent patterning property in a heating process.

At the same time, there has been a demand for a hole injection transport material which can form a hole injection transport layer by a solution coating method and can make a production process easy, while having an excellent hole injecting transporting property and being able to increase the life of a device.

The present invention was achieved in view of the above problems, and an object of the present invention is to provide a device material for a hole injection transport layer, which has wettability that can be altered by energy irradiation, high process resistance and an excellent hole injecting transporting property and which can form a hole injection transport layer by a solution coating method, and an ink for a hole injection transport layer, which comprises the device material.

Another object of the present invention is to provide a device in which a layer to be provided on a hole injection transport layer can be patterned by forming the hole injection transport layer with the device material for a hole injection transport layer so as to have a pattern consisting of lyophilic regions and liquid repellent regions, and which can achieve a long life, and a method for producing the device.

Solution to Problem

As the result of diligent researches made to achieve the above objects, the inventors of the present invention found out that a transition metal-containing nanoparticle or nanocluster which contains a transition metal oxide and to which surface a fluorine-containing organic compound is attached, has wettability that can be altered by photocatalytic action or irradiation with vacuum ultraviolet light and high process resistance, and it can form a layer by a solution coating method and can make a production process easy, while having improved hole injection transport performance; moreover, the transition metal-containing nanoparticles or nanoclusters can be a highly stable layer with excellent adhesion to an adjacent electrode and a light emitting layer. Based on these findings, the inventors of the present invention completed the present invention.

In particular, the device material for a hole injection transport layer of the present invention is characterized by that a fluorine-containing organic compound is attached to the surface of a transition metal-containing nanoparticle or nanocluster which contains at least a transition metal oxide.

In the device material for a hole injection transport layer of the present invention, from the viewpoint of improving reduction in driving voltage and increasing device life, it is preferable that at least one kind of metal selected from the group consisting of molybdenum, tungsten and vanadium is contained as the transition metal in the transition metal oxide contained in the transition metal-containing nanoparticle or nanocluster.

In the device material for a hole injection transport layer of the present invention, it is preferable that the fluorine-containing organic compound contains a fluorinated alkyl group, from the point of view that an excellent alteration in wettability can be made by energy irradiation and an excellent patterning is obtained.

The ink for forming a hole injection transport layer of the present invention is characterized by comprising the device material for a hole injection transport layer of the present invention and an organic solvent.

The first embodiment of the method for producing a device according to the present invention is a method for producing a device comprising two or more electrodes facing each other on a substrate and a hole injection transport layer disposed between two of the electrodes, the method comprising the steps of:

forming a hole injection transport layer comprising the device material for a hole injection transport layer of the present invention on a substrate on which first electrode layers are formed in a pattern, and forming a pattern with altered wettability on a surface of the hole injection transport layer by disposing a photocatalyst-containing layer substrate in which a photocatalyst-containing layer containing at least a photocatalyst is formed on a base above the hole injection transport layer, with a gap which allows photocatalytic action associated with energy irradiation to affect the hole injection transport layer, and then by performing patterned energy irradiation.

The second embodiment of the method for producing a device according to the present invention is a method for producing a device comprising two or more electrodes facing each other on a substrate and a hole injection transport layer disposed between two of the electrodes, the method comprising the steps of:

forming a hole injection transport layer comprising the device material for a hole injection transport layer of the present invention on a substrate on which electrode layers are formed in a pattern, and forming a pattern with altered wettability on a surface of the hole injection transport layer by patterned vacuum ultraviolet irradiation.

According to the device and the method for producing the same of the present invention, the hole injection transport layer comprises a material to which a liquid-repellent, fluorine-containing organic compound is attached. The fluorine-containing organic compound is decomposed and removed by photocatalytic action or by vacuum ultraviolet irradiation; therefore, a large difference can be made between the wettability of a part irradiated with energy and that of a part not irradiated with energy. It is possible to form a pattern with altered wettability by energy irradiation through a photocatalyst-containing layer or vacuum ultraviolet irradiation to the hole injection transport layer with alterable wettability, and it is thus possible to easily stack a layer in a pattern on the hole injection transport layer by using the difference in wettability of the pattern with altered wettability.

According to the device and the method for producing the same of the present invention, the transition metal-containing nanoparticle or nanocluster which contains a transition metal oxide and is contained in the device material for a hole injection transport layer of the present invention that is contained in the hole injection transport layer, has resistance to ultraviolet light which is used in the step of forming a pattern with altered wettability; therefore, the nanoparticle or nanocluster is advantageous in that there is no deterioration in and no loss of their excellent hole injecting transporting property even after the step of forming a pattern with altered wettability. The device material for a hole injection transport layer of the present invention is resistant to heating at relatively high temperature (such as 200° C.), so that the pattern with altered wettability is not damaged during a heating process and the step of stacking layers on the hole injection transport layer in a pattern is possible. In addition, the device material for a hole injection transport layer of the present invention has excellent heat and light resistance and is unlikely to deteriorate; therefore, the device produced by the production method of the present invention has an improved life.

In the device production method of the present invention, the hole injection transport layer forming step preferably comprises the steps of preparing an ink for forming a hole injection transport layer, which comprises the device material for a hole injection transport layer of the present invention and an organic solvent, and heating the ink in the presence of oxygen, from the point of view that the production process is simple and an excellent hole injection transport property is achieved.

In the first embodiment of the device production method of the present invention, the method can further comprise the step of forming a divider such as an insulation layer or bank between the first electrode layers formed in a pattern on the substrate before the step of forming a hole injection transport layer.

Also in the first embodiment of the device production method of the present invention, it is preferable that the substrate on which the first electrode layers are formed is a transparent substrate; the divider is a divider which reflects or absorbs the energy rays applied in the step of forming a pattern with altered wettability; and in the step of forming a pattern with altered wettability, the pattern with altered wettability is formed on a surface of the hole injection transport layer by applying energy from the transparent substrate side. In this case, a divider which reflects or absorbs applied energy functions similarly to a mask, so that the hole injection transport layer can be irradiated with energy in a pattern without using a mask. The device material for a hole injection transport layer of the present invention, which is used for the hole injection transport layer of the same, has high transmittance and is unlikely to deteriorate device properties even after UV irradiation, so that such a hole injection transport layer can be irradiated with energy from the back side thereof.

In the first embodiment of the device production method of the present invention, the method of performing patterned energy irradiation in the step of forming a pattern with altered wettability can be a method of performing patterned energy irradiation using a mask or a method of performing patterned energy irradiation by scanning ultraviolet laser in a pattern.

The first embodiment of the device of the present invention is a device comprising two or more electrodes facing each other on a substrate and a hole injection transport layer disposed between two of the electrodes, wherein the hole injection transport layer comprises the device material for a hole injection transport layer of the present invention, and the fluorine-containing organic compound of the device material in the surface part of the hole injection transport layer is decomposed and removed.

The second embodiment of the device of the present invention is a device comprising two or more electrodes facing each other on a substrate and a hole injection transport layer disposed between two of the electrodes, wherein the device has a divider between the first electrode layers formed in a pattern on the substrate, and the device has the continuous hole injection transport layer on the first electrode layers in an opening of the divider and on the divider, and wherein, in the hole injection transport layer on the first electrode layers in the opening of the divider and on the side of the divider, at least part of the fluorine-containing organic compound of the device material for a hole injection transport layer of the present invention is decomposed and removed, and the hole injection transport layer on the top of the divider contains the device material for a hole injection transport layer of the present invention.

In the device of the present invention, the hole injection transport layer comprises the device material for a hole injection transport layer according to the present invention, in which at least part of the fluorine-containing organic compound is decomposed and removed; therefore, the device can make a production process easy, while having an excellent hole injecting transporting property and being able to achieve a long life. The device of the present invention can be obtained by the method for producing a device according to the present invention.

The device of the present invention is suitably used as an organic EL device comprising an organic layer which comprises at least a light emitting layer.

Advantageous Effects of Invention

According to the present invention, it is possible to provide a device material for a hole injection transport layer, which has wettability that can be altered by energy irradiation, high process resistance and an excellent hole injecting transporting property and which can form a hole injection transport layer by a solution coating method, and an ink for a hole injection transport layer, which comprises the device material.

According to the method for producing a device of the present invention, while a device can make a production process easy, it is possible to utilize a pattern with excellent altered wettability of the hole injection transport layer and an excellent hole injection transport layer can be obtained. Therefore, it is possible to provide a device which can achieve a long life.

The device of the present invention has an excellent hole injecting transporting property and can achieve a long life, while it can be produced by a simple production process.

BRIEF DESCRIPTION OF DRAWINGS

FIG. 9 is a different schematic sectional view of an example of the device of the present invention.

FIG. 10 is a schematic sectional view of an example of the organic EL device of the present invention.

FIG. 11 is a schematic sectional view of the organic EL device of the present invention in an experiment in wettability alteration.

FIG. 12(A) is a partially enlarged schematic sectional view. FIG. 12(B) is a partially enlarged schematic plan view.

DESCRIPTION OF EMBODIMENTS

Figure 1A:
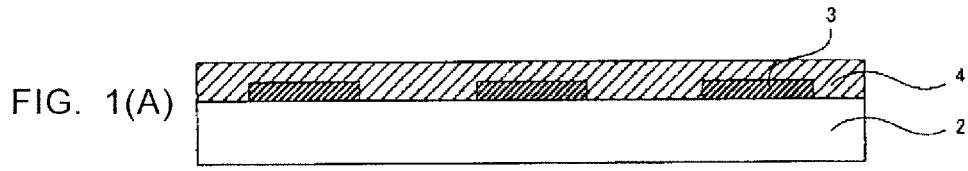
FIGS. 1(A) to (C) show an example of the process of the method of producing the device of the present invention.

I. Device Material for a Hole Injection Transport Layer

The device material for a hole injection transport layer of the present invention is characterized by that a fluorine-containing organic compound is attached to the surface of transition a metal-containing nanoparticle or nanocluster which contains at least a transition metal oxide.

The device material for a hole injection transport layer of the present invention is transition metal-containing nanoparticle or nanocluster which contains a transition metal oxide and to which surface a fluorine-containing organic compound is attached; therefore, the fluorine-containing organic compound attached to the surface can be decomposed and removed by photocatalytic action associated with energy irradiation or by vacuum ultraviolet irradiation, and it is thus a material having wettability that can be altered from liquid repellent one to lyophilic one. When the device material for a hole injection transport layer of the present invention is used, a part affected by photocatalytic action associated with energy irradiation or a part irradiated with vacuum ultraviolet light becomes a lyophilic region, while a part not affected by photocatalytic action associated with energy irradiation or a part not irradiated with vacuum ultraviolet light becomes a liquid repellent region. In the device material for a hole injection transport layer of the present invention, the fluorine-containing organic compound attached to the surface is decomposed and removed by photocatalytic action associated with energy irradiation or by vacuum ultraviolet irradiation; however, the transition metal-containing nanoparticle or nanocluster which contains a transition metal oxide itself is resistant to ultraviolet light or heating at relatively high temperature, so that the nanoparticle or nanocluster is advantageous in that there is no damage to the excellent hole injecting transporting property of the nanoparticle or nanocluster during energy irradiation process, when being affected by photocatalytic action, upon heating, etc. In addition, there is an advantage that the device material for a hole injection transport layer of the present invention is oxidized through a treatment such as a photocatalytic treatment for decomposing fluorine, resulting in an increase in ionization potential, so that there is an increase in hole injecting property.

Unlike the case of using a molybdenum oxide, which is an inorganic compound, the device material for a hole injection transport layer of the present invention has an organic part which contains as a protective agent at least a fluorine-containing organic compound on the surface of the transition metal-containing nanoparticle or nanocluster, so that the interface adhesion to an adjacent organic layer is excellent. Normally, an embodiment is employed in which a lyophilic region is formed by decomposing the fluorine-containing organic compound in at least a surface part of the hole injection transport layer comprising the device material for a hole injection transport layer of the present invention, and an organic layer is stacked on the lyophilic region, so that effects of water repellency derived from the fluorine-containing organic compound are lost at the interface with the adjacent organic layer and excellent adhesion is provided to the interface.

It is considered that the transition metal oxide or compound contained in the transition metal-containing nanoparticle or nanocluster is highly reactive, so that the nanoparticle or nanocluster is likely to form a charge transfer complex. Because of this, the device material for a hole injection transport layer of the present invention can form a hole injection transport layer which can realize a device that can be driven at low voltage and has high power efficiency and long life.

Moreover, unlike the case of using a molybdenum oxide, which is an inorganic compound, the transition metal-containing nanoparticle or nanocluster used for the device material for a hole injection transport layer of the present invention, which contains a transition metal oxide, has an organic part on the surface thereof, which contains at least a fluorine-containing organic compound as a protective agent, so that the transition metal-containing nanoparticle or nanocluster can be dispersed in solvents. Therefore, it is possible to form a thin film by a solution coating method and is thus possible to form layers from a hole injection transport layer to a stacked organic layer such as a light emitting layer on the substrate sequentially only by a coating process and there is a great advantage in terms of production method. Accordingly, there are advantages that a device can be produced by a simpler process and at lower cost than such a process that, as in the case of using a molybdenum oxide, which is an inorganic compound, after a hole injection layer is vapor-deposited using a high resolution mask, a hole transport layer and light emitting layer are formed by a vapor-deposition or solution coating method, and a second electrode is vapor-deposited further.

Hereinafter, the components of the device material for a hole injection transport layer of the present invention will be explained in order.

<Transition Metal-containing Nanoparticle and Nanocluster>

The transition metal-containing nanoparticle contained in the device material for a hole injection transport layer of the present invention contains at least a transition metal oxide. The nanoparticle refers to a particle having a diameter in nanometers, that is, a diameter less than 1 μm.

The transition metal-containing nanoparticle which contains at least a transition metal oxide can have a single or composite structure, or it can have a core-shell structure, be an alloy or have an island structure. Depending on the treatment condition, the nanoparticle can contain transition metal atoms or compounds having various valences, such as a carbide, sulfide, boride, selenide, halide and complex of a transition metal.

On the other hand, the transition metal-containing nanocluster which contains a transition metal oxide and is contained in the device material for a hole injection transport layer of the present invention, refers to an atomic group which consists of at least transition metal atoms and oxygen atoms that form a specific structural unit, a compound which contains the atomic group, or an aggregate of the compounds. A nanocluster refers to one in which the longest part of the shape is in nanometers, that is, less than 1 μm.

The transition metal-containing nanocluster of the present invention is preferably a large molecule which contains chemically-synthesized polyoxometalate (POM). POM has a polyacid structure comprising oxo acid. The transition metal-containing nanocluster containing chemically-synthesized POM is a large molecule, so that the nanocluster is characterized by that the size and weight are defined by molecular weight, and although an isomer is present therein, the nanoclusters are basically the same in shape and size. The transition metal-containing nanocluster containing chemically-synthesized POM is also characterized by that the electric nature is anionic and the properties of the clusters are similar. For example, in the case of $Na_{15}[Mo^{VI}_{126}Mo^{V}_{28}O_{462}H_{14}(H_2O)_{70}]_{0.5}[Mo^{VI}_{124}Mo^{V}_{28}O_{457}H_{14}(H_2O)_{68}]_{0.5} \cdot 40 \cdot 0H_2O$.cluster (a kind of {Mo154}) used in Examples, the molecule is in a doughnut shape and has a diameter of about 4 nm. In addition, the molybdenum oxide nanocluster is mixed-valence polyoxometalate in which hexavalent molybdenum ($Mo^{VI}$) coexists with pentavalent molybdenum ($Mo^{V}$) in each of the molecules thereof, and it is characterized by that it becomes an anionic cluster.

In the present invention, a transition metal oxide is always contained in the transition metal-containing nanoparticle and nanocluster. Due to certainly containing a transition metal oxide, it is possible to obtain an optimum ionization potential or to improve reduction in driving voltage and increase device life by inhibiting changes resulted from oxidization of an unstable metal having an oxidation number of +0. It is particularly preferable that transition metal oxides having different oxidation numbers coexist and are contained in the transition metal-containing nanoparticle and nanocluster. Due to the certain coexistence and containing of transition metal oxides having different oxidation numbers, the hole transporting property and hole injecting property are appropriately controlled by the balance of the oxidation numbers; therefore, it is possible to improve reduction in driving voltage and increase device life.

The transition metal contained in the transition metal-containing nanoparticle and nanocluster and the transition metal contained in the transition metal compound are a general term for metal elements of the third to eleventh groups of the periodic table. Specific examples thereof include molybdenum, tungsten, vanadium, rhenium, nickel, copper, titanium, platinum and silver.

From the viewpoint of high reactivity, it is particularly preferable that at least one kind of metal selected from the group consisting of molybdenum, tungsten and vanadium is contained as the transition metal in the transition metal oxide contained in the transition metal-containing nanoparticle and nanocluster, so that it is easy to form a charge transfer complex and there is an improvement in driving voltage reduction and an increase in device life.

The metal contained in the transition metal-containing nanoparticle and nanocluster can be a single metal or two or more kinds of metals. The embodiment in which two or more kinds of metals are contained in the nanoparticle can be one in which two or more kinds of metal fine particles or metal oxide fine particles are combined and contained, or one in which two or more kinds of metals are contained as an alloy.

A non-transition metal can be contained in the metal contained in the transition metal-containing nanoparticle and nanocluster, as long as at least a transition metal is contained therein.

By containing two or more kinds of metals, there is an advantage that it is possible to complement a hole transport property and a hole injection property with each other and to form a hole injection transport layer which also has other functions to provide a photocatalytic property and control the refractive index or transmittance of a thin film.

From the viewpoint of improving driving voltage reduction and increasing device life, the transition metal oxide contained in the transition metal-containing nanoparticle used in the present invention is preferably such that the transition metal oxide contained in the transition metal or transition metal compound is 30% by mole or more, and more preferably 50% by mole or more.

As the transition metal-containing nanocluster used in the present invention, polyoxometalate represented by the following formula can be used:

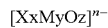

wherein X is at least one kind of element selected from the $13^{th}$ to $18^{th}$ groups of the periodic table, cobalt, or at least one kind of element selected from rare earths; M is at least one kind of transition metal element selected from the fourth to eleventh groups of the periodic table or aluminum; a transition metal element is contained in at least any one of X and M; and O is an oxygen atom.

Examples of M include Mo, W, Cr, V, Nb, Fe, Ta and Al. Examples of X include P, As, Si, B and Co. In the formula, x is an integer of 0 or more; y is an integer of 1 or more; and z is an integer of 1 or more. When x is zero (x=0), the resultant is isopoly acid. When x is an integer of 1 or more, the resultant is heteropoly acid. X and M are each independently one kind of element or two or more kinds of elements.

Specific examples of the isopoly acid include $[MO_6O_{19}]^{2-}$ and $[Mo_{10}O_{32}]^{4-}$. Specific examples of the heteropoly acid include $[Pmo_{12}O_{40}]^{3-}$, $[BW_{12}O_{40}]^{5-}$, $[SbW_6O_{24}]^{8-}$, $[SiV_2W_{10}O_{40}]^{6-}$, $[V_{18}O_{44}N_3]^{n-}$, $[PWnMomO40]^{3-}$ (n+m=12, n and m are each 0, 1, 2, 3 or so on), $[SiWnMomO40]^{4-}$ (n+m=12, and m are each 0, 1, 2, 3 or so on), $[PVnWmO40]^{r-}$ (n+m=1, n=1, 2, 3 or 4, r−n=3) and $[PVnMomO40]^{r-}$ (n+m=12, n=1, 2, or 4, r−n=3). While the composition formula of a general molybdenum oxide such as $MoO_3$ is $Mo^{VI}{}_nO_{3n}$, that of poly acid such as $[Mo^{VI}{}_6O_{19}]^{2-}$ is $Mo_nO_{3n+m}$ (m=1, 2, 3, . . . ) and it is clear from this that although they are molybdenums having the same valence, hexavalent molybdenums, poly acid contains more oxygen and contributes to the anionic state.

In general, these anionic clusters are present in combination with a counter cation in the form of a hydrate. For example, in the case of $[BW_{12}O_{40}]^{5-}$, it is known to be present as $K_5[BW_{12}O_{40}]$ $13H_2O$.

The structure of the transition metal-containing nanocluster used in the present invention can be a Keggin type, Dawson type or Anderson type, for example. In POM, four to six oxide ions can be coordinated with a transition metal ion, so that using a polyhedron such as tetrahedron, quadrangular pyramid or octahedron as the basic unit, the polyhedora are stacked to form the structure. A large number of molecular structures can be conceived from the combination of atoms and structures; moreover, there are structural isomers such as α, β, γ and σ isomers.

As the transition metal-containing nanocluster used in the present invention, a reduced mixed-valence polyoxometalate can be used. Any POM can be in a mixed-valence state readily by reduction reaction. For example, $[PMo^{VI}{}_{12}O_{40}]^{3-}$ can be reduced to $[PMo^{VI}{}_{11} Mo^VO_{40}]^{3-}$ or $[Pmo^{VI}{}_{10} Mo^V{}_2O_{40}]^{4-}$ and can have a structure having different atomic valences in a molecule. POM can be reduced by a donor guest molecule, for example. A reduced anion is characterized by that it is stably reduced electron by electron, and it is different from a general molybdenum oxide such as $MoO_3$.

As the transition metal-containing nanocluster used in the present invention, a large mixed-valence POM obtained by combining the above structures can be used. For example, as a cluster used in one of Examples, there may be mentioned $Na_{15}[Mo^{VI}{}_{126}Mo^V{}_{28}O_{462}H_{14}(H_2O)_{70}]_{0.5}$ $[Mo^{VI}{}_{124}Mo^V{}_{28}O_{457}H_{14}(H_2O)_{68}]_{0.5}$.40 $0H_2O$. Since these clusters have complex molecular structures, for ease of explanation, a method of representing the structure by the transition metal contained in the molecules thereof and describing the same as $\{Mo_{154}\}$ is generally employed herein. Examples of the type of transition metal-containing nanocluster that can be suitably used in the present invention include $\{Mo_{132}\}$ in a spherical shape, $\{Mo_{142}\}$, $\{Mo_{154}\}$ and $\{Mo_{176}\}$ in a ring shape, $\{Mo_{248}\}$ in a wheel shape and $\{Mo_{368}\}$ in a lemon shape. In addition, there may be used $[PMo_6O_{19}]^{2-}$, $[PMo_{12}O_{40}]^{3-}$ and so on.

Examples of the type of transition metal-containing nanocluster which contain tungsten or vanadium include $[KAs_4W_{40}(VO)_2O_{140}]^{23-}$, $Mo_8V_2O_{28}\cdot 7H_2O$, $[alpha-P_2W_{18}O_{62}]^{6-}$, $[alpha-P_2W_{17}V (V)O_{62}]^{7-}$, $[alpha-1,2,3-P_2W_{15}V (V) {}_3O_{62}]^{9-}$, $[[alpha-PW_{12}O_{40}]^{3-}W^-)$, $[alpha-P W_{11}V(V)O_{40}]^{4-}$, $[alpha-1,2-PW_{10}V(V)_2O_{40}]^{5-}$, $[alpha-1,2,3-PW_9V(V)_3O_{40}]^{6-}$, $[alpha-1,4,9-PW_9V(V)_3O_{40}]^{6-}$ and $[V_{10}O_{28}]^{6-}$. In these examples, "V(V)" means pentavalent vanadium.

Besides the above, there may be used $\{W_{72}Mo_{60}\}$ which contains two or more kinds of transition metal elements. An example is $\{W_{72}Mo_{60}\}$ in which part of $\{Mo_{132}\}$ is replaced with tungsten. Furthermore, there may be used $\{Mo_{57}V_6\}$, $\{Mo_{57}Fe_6\}$, $\{Mo_{72}Cr_{30}\}$, $\{W_{72}Mo_{60}\}$, $\{Ag_2Mo_8\}$ and so on.

The mixed-valence POM used in the present invention as the transition metal-containing nanocluster, is obtained in such a manner that POM is synthesized by reduction by a chemical reaction and a metal with a different atomic valence is introduced and bound to the POM (for example, a pentavalent Mo is introduced to a hexavalent Mo). Therefore, the mixed-valence POM is structurally stable, and the metal with a different atomic valence thus introduced (for example, the pentavalent Mo) can also stably exist therein. Because a different atomic valence can stably exist and a stable anionic state can be kept, a hole injection layer with an excellent life property. In the case of a general molybdenum oxide such as $MoO_3$, most molybdenums are $Mo^{VI}$, so that it is represented by the following composition formula: $Mo_nO_{3n}$. However, it is turned into $Mo_nO_{3n-m}$ due to oxygen defect upon vapor-deposition or oxygen defect present on the particle surface, etc., caused by physical pulverization upon forming a slurry, and some $Mo^V$ may also exist. However, $Mo^V$ introduced to $MoO_3$ are caused by oxygen defect, so that they are not uniform and stable.

Like metal oxide clusters containing chemically synthesized POM, many of the transition metal-containing nanoclusters used in the present invention can contain a counter cation. As the counter cation, $H^+$, $Na^+$ and $K^+$ can be suitably used. A cationic organic substance or ionic liquid can be also used.

Depending on the synthesis condition, the transition metal-containing nanocluster can contain transition metal atoms or compounds having various oxidation numbers, such as a sulfide, a boride, a selenide and a halide of a transition metal, a ligand and a non-transition metal atom.

<Fluorine-containing Organic Compound Attached to Surface>

In the device material for a hole injection transport layer of the present invention, a fluorine-containing organic compound is attached to the surface of the transition metal-containing nanoparticle or nanocluster which contains at least a transition metal oxide.

In the device material for a hole injection transport layer of the present invention, "attached" or the like means that the fluorine-containing organic compound is fixed to the surface of the transition metal-containing nanoparticle or nanocluster to the extent that the fluorine-containing organic compound is not detached even if the nanoparticles or nanoclusters are dispersed in an organic solvent. The term "attached" or the like includes absorption and coordination; however, it is preferably chemical binding such as ionic binding and covalent binding. The embodiment of the term "attached" or the like can be one in which a fluorine-containing organic compound is attached to the surface of the transition metal-containing nanoparticle or nanocluster so as to cover the whole surface of the nanoparticle or nanocluster, or one in which a fluorine-containing organic compound is attached to part of the surface.

In the device material for a hole injection transport layer of the present invention, especially, an organic compound which contains at least a fluorine-containing organic compound is attached to the surface of the transition metal-containing nanoparticle or nanocluster. Therefore, unlike the particles of patent literature 5 which are produced by simply pulverizing a transition metal oxide, the nanoparticle or nanocluster has very high dispersion stability and it is possible to form a highly uniform thin film having a thickness in nanometers. Because of this, the thin film formed with the device material for a hole injection transport layer of the present invention has high stability over time and high uniformity, and it is unlikely to cause short circuit. In addition, it has excellent adhesion to an adjacent electrode or organic layer.

The type of the fluorine-containing organic compound attached to the surface is appropriately selected and is not particularly limited. As the fluorine-containing organic compound, there may be mentioned an organic compound which may contain a heteroatom other than fluorine and in which part or all of hydrogens contained in a linear, branched or cyclic, saturated or unsaturated hydrocarbon are replaced with fluorine. It can be an organic compound which is obtained by replacing part or all of hydrogens contained in an organic compound which has been used as a hole injection transport material and which may contain a heteroatom, with fluorine. Or, it can be a compound obtained by introducing a substituent containing a fluorine-containing organic compound in an organic compound which has been used as a hole injection transport material and which may contain a heteroatom.

Specific examples of the fluorine-containing organic compound include a fluorinated alkyl or aryl group obtained by partly or fully fluorinating a linear, branched or cyclic alkyl or aryl group, or combinations thereof. The carbon number of the fluorinated alkyl group is not particularly limited; however, it is preferably 2 to 10, more preferably 4 to 6. The carbon number of the fluorinated aryl group and that of the combination of a fluorinated alkyl group and a fluorinated aryl group such as a fluorinated, arylated alkyl group are also not particularly limited; however, they are preferably 6 to 12, more preferably 6 to 9.

The fluorine-containing organic compound preferably contains a fluorinated alkyl group, from the point of view that an excellent alteration in wettability can be made by energy irradiation and an excellent patterning is obtained.

The fluorine-containing organic compound preferably contains a heteroatom not forming a hetero ring, such as —NH—, —N=, —S—, —O—, —NH(C=O)—, —O—(C=O)—, —O—(SO$_2$)—, —O—(C=O)—O—, —S—(C=O)—O—, —SiR$_2$—(C=O)—O— and —SiR$_2$—, because the fluorine-containing organic compound is likely to be decomposed by energy irradiation and thus there is an increase in sensitivity in the step of forming a pattern with altered wettability.

An fluorinated alkyl group represented by $C_nF_{2n+1}C_mH_{2m}$— [wherein m is an integer of 0 to 20; n is an integer of 1 to 20; and m+n is 1 to 30] is particularly preferred because it has high oil repellency and, when m is 1 or more, the stability of the compound is increased by binding other element (e.g., ether bond) to $C_mH_{2m}$, rather than binding other element directly to $C_nF_{2n+1}$. Meanwhile, it is preferable that other element (e.g., ether bond) is directly bound to $C_nF_{2n+1}$ because, since the fluorinated organic compound is likely to be decomposed by energy irradiation, the sensitivity is increased in the step of forming a pattern with altered wettability, and residual organic components on the surface of the hole injection transport layer is decreased; therefore, there is an increase in the adhesion of thin film interface and an increase in device properties. Also, n is more preferably an integer of 2 to 10, still more preferably an integer of 4 to 6, and m is more preferably an integer of 0 to 10, still more preferably an integer of 2 to 8.

The fluorination rate of the fluorinated alkyl group (the ratio of fluorine atoms in the alkyl group) is preferably 50 to 100%, more preferably 80 to 100%. A perfluoroalkyl group in which all hydrogen atoms are replaced with fluorine atoms is particularly preferred in terms of achieving high oil repellency.

A fluorine-containing organic compound which contains an aromatic hydrocarbon and/or hetero ring is preferred because the boiling point of the fluorine-containing organic compound can be increased. For example, there are such advantages that the range of temperature for synthesis of the material for a hole injection transport layer of the present invention, to which a fluorine-containing organic compound is attached, can be broadened, and the high process temperature upon producing the device can be set higher.

The aromatic hydrocarbon and/or hetero ring often has a charge transporting property. It is thus possible to keep the charge mobility inside the hole injection transport layer produced with the fluorine-containing organic compound which contains an aromatic hydrocarbon and/or hetero ring high, so that it is advantageous in increasing the efficiencies of the device including lowering voltage. The fluorine-containing organic compound in the surface part of the film is removed by the below-described treatment of decomposing the fluorine-containing organic compound; however, the fluorine-containing organic compound which contains an aromatic hydrocarbon and/or hetero ring remains inside the film, so that a high charge transporting property thereof can contribute to an increase in the efficiencies of the device.

In general, a charge transport material which contains an aromatic hydrocarbon and/or hetero ring is contained in each of the layers of an organic device (e.g., organic EL device). Considering an improvement in the adhesion of the hole injection transport layer to an adjacent organic layer, the fluorine-containing organic compound preferably contains an aromatic hydrocarbon and/or hetero ring from the viewpoint of contributing to an increase in the device life.

Examples of the fluorinated alkyl group are as follows: $CF_3$—, $CF_3CF_2$—, $CHF_2CF_2$—, $CF_3(CF_2)_2$—, $CF_3(CF_2)_3$—, $CF_3(CF_2)_4$—, $CF_3(CF_2)_5$—, $CF_3(CF_2)_6$—, $CF_3(CF_2)_7$—, $CF_3(CF_2)_8$—, $CF_3(CF_2)_9$—, $CF_3(CF_2)_{11}$—, $CF_3(CF_2)_{15}$, $CF_3CH_2CH_2$—, $CF_3CF_2CH_2CH_2$—, $CHF_2CF_2CH_2CH_2$—, $CF_3(CF_2)_2CH_2CH_2$—, $CF_3(CF_2)_3CH_2CH_2$—, $CF_3(CF_2)_4CH_2CH_2$—, $CF_3(CF_2)_5CH_2CH_2$—, $CF_3(CF_2)_6CH_2CH_2$—, $CF_3(CF_2)_7CH_2CH_2$—, $CF_3(CF_2)_8CH_2CH_2$—, $CF_3(CF_2)_9CH_2CH_2$—, $CF_3(CF_2)_{11}CH_2CH_2$—, $CF_3(CF_2)_{15}CH_2CH_2$—, $CF_3(CF_2)_5O(CF_3)CF$—, $CF_3(CF_2)_2O(CF_3)CFCF_2O(CF_3)CF$—, $CF_3(CF_2)_2O(CF_3)CFCF_2O(CF_3)CFCF_2O(CF_3)CFCF_2O(CF_3)CF$— and $CF_3(CF_2)_5O$ ($CF_3$)CF—. These are examples having a linear structure; however, the fluorinated alkyl group can be one having a branched structure such as an isopropyl group.

Examples of the fluorine-containing organic compound which contains an aromatic hydrocarbon and/or hetero ring include a pentafluorophenyl group, 2,3,5,6-tetrafluorophenyl group, 3,4,5-trifluorophenyl group, 2,4-difluorophenyl group, 3,4-difluorophenyl group, 3,5-difluorophenyl group, nonafluorobiphenyl group, α,α,α,2,3,5,6-heptafluoro-p-tolyl group, heptafluoronaphthyl group, (trifluoromethyl)phenyl group, 3,5-bis(trifluoromethyl)phenyl group, pentafluorophenylmethyl group, 2,3,5,6-tetrafluorophenylmethyl group, 3,4,5-trifluorophenylmethyl group, 2,4-difluorophenylmethyl group, 3,4-difluorophenylmethyl group, 3,5-difluorophenylmethyl group, nonafluorobiphenylmethyl group, α,α,α,2,3,5,6-heptafluoro-p-tolylmethyl group, heptafluoronaphthylmethyl group, (trifluoromethyl)phenylmethyl group, 3,5-bis(trifluoromethyl)phenylmethyl group and 4,4',4"-trifluorotrityl group.

From the viewpoint of protecting the surface of the transition metal-containing nanoparticle or nanocluster and dispersion stability, the fluorine-containing organic compound is preferably attached to the surface of the transition metal-containing nanoparticle or nanocluster using a linking group which functions to link to the transition metal and/or transition metal compound. In particular, the fluorine-containing organic compound is preferably attached to the surface of the transition metal-containing nanoparticle or nanocluster by a protective agent in which a linking group is contained at the terminal end of a fluorine-containing organic compound.

The linking group is not particularly limited as long as it has a function to link to a transition metal and/or transition metal compound. "Link" or "linkage" include absorption and coordination; however, it is preferably chemical bonding such as ionic binding and covalent binding. The number of linking groups in the protective agent can be any number as long as one or more linking groups are contained in each molecule of the protective agent. However, considering solubility in solutions, dispersion stability and possibility of oil repellency, it is preferable that there is one linking group in each molecule of the protective agent. When there is one linking group in each molecule, the protective agent is bound to the particle or forms a dimer by a bimolecular reaction to stop the reaction. The dimer has weak adhesion to the transition metal-containing nanoparticle or nanocluster, so that it can be readily removed by adding a step of washing off the dimer to the step of preparing the transition metal-containing nanoparticle or nanocluster. If there are two or more linking groups in the molecule, the nanoparticles are bound to each other and they may be likely to be aggregated in the ink.

Examples of the linking group include hydrophilic groups such as a carboxyl group, amino group, hydroxyl group, thiol group, aldehyde group, sulfonic acid group, amide group, sulfonamide group, phosphate group, phosphinic acid group and P=O group, and ionic liquids of ammonium salt, imidazolium salt, pyridinium salt, sulfonium salt, phosphonium salt, morpholinium salt, piperidinium salt and so on. The linking group is preferably one or more kinds selected from functional groups represented by the following formulae (1a) to (1n):

[Chemical formulae 1]

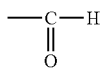  (1-a)

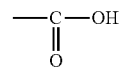  (1-b)

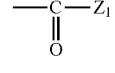  (1-c)

—SH  (1-d)

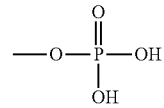  (1-e)

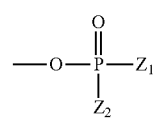  (1-f)

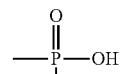  (1-g)

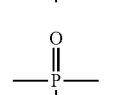  (1-h)

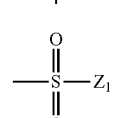  (1-i)

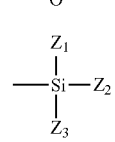  (1-j)

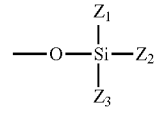  (1-k)

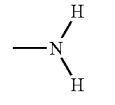  (1-l)

—N($CH_3$)$_3^+$ Cl$^-$  (1-m)

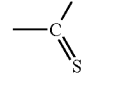  (1-n)

wherein $Z_1$, $Z_2$ and $Z_3$ are each independently a halogen atom or alkoxy group.

As the protective agent which is suitably used for the device material for a hole injection transport layer of the present invention and in which a linking group is contained at the terminal end of a fluorine-containing organic compound, there may be mentioned a protective agent represented by the following general formula (I), for example:

Y-Q-(A'-FQ')$_n$-(A-FQ)    General formula (I)

wherein Y is the linking group; Q is a linear, branched or cyclic aliphatic hydrocarbon group, aromatic hydrocarbon group, aliphatic heterocyclic group, aromatic heterocyclic group or a combination thereof, or a direct bond; A and A' are each independently —NH—, —N=, —S—, —O—, —NH(C=O)—, —O—(C=O)—, —O—(SO$_2$)—, —O—(C=O)—O—, —S—(C=O)—O—, —SiR$_2$—(C=O)—O—, —SiR$_2$— or a direct bond and R is a hydrogen or linear, branched or cyclic aliphatic hydrocarbon group; FQ and FQ' are each independently the fluorine-containing organic compound; and n is an integer of 0 or 1 or more.

A and/or A' is preferably —NH—, —N=, —S—, —O—, —NH(C=O)—, —O—(C=O)—, —O—(SO$_2$)—, —O—(C=O)—O—, —S—(C=O)—O—, —SiR$_2$—(C=O)—O— or —SiR$_2$— from the point of view that there in an increase in the sensitivity in the step of forming a pattern with altered wettability because the protective agent is likely to be cut at the A and/or A' part by energy irradiation and the fluorine-containing organic compound represented by FQ is likely to be decomposed.

When Q contains an aromatic hydrocarbon group or aromatic heterocyclic group, it is possible to contribute to an increase in the charge mobility in the hole injection transport layer, so that it is advantageous in increasing the efficiencies of the device including lowering voltage. When the protective agent is cut at the A and/or A' part by the below-described treatment of decomposing the fluorine-containing organic compound, fluorine-containing organic compound FQ is decomposed and removed; however, the Q part which contains an aromatic hydrocarbon and/or heteroatom remains on the surface of the transition metal-containing nanoparticle or nanocluster. Therefore, when Q has a high charge transporting property, it can contribute to an increase in the efficiencies of the device.

FQ is a monovalent fluorine-containing organic compound group, and FQ' is a divalent fluorine-containing organic compound group.

When n is 1 or more, the protective agent is likely to be cut at the A' part, so that the fluorine-containing organic compound represented by FQ is likely to be decomposed. When n is 1 or more, there may be mentioned —O—(CH$_2$)$_p$—O—(CH$_2$)$_2$—(CF$_2$)$_q$—CF$_3$, for example.

From the viewpoint of higher decomposition rate, n is preferably 5 or less, more preferably 4 or less.

As the protective agent represented by the general formula (I), there may be mentioned the following structures, for example; however, the protective agent is not limited to the following examples:

[Chemical formula 2]

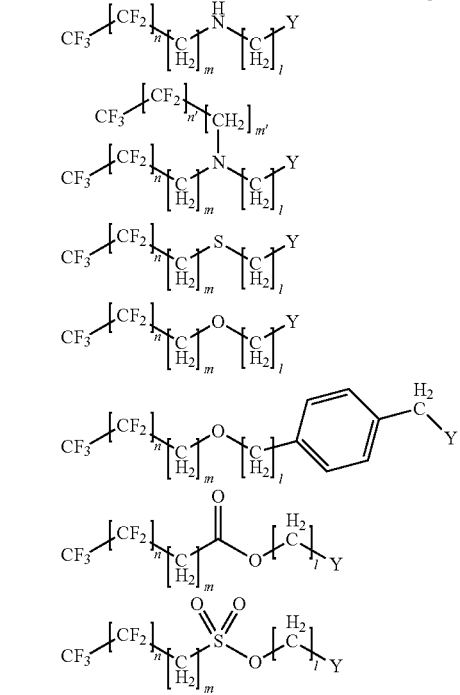

wherein n and n' are an integer of 1 to 5 each; m and m' are 0 or an integer of 1 to 5 each; l is 0 or an integer of 1 to 5; and Y is any one of the functional groups represented by the formulae (1a) to (1n);

[Chemical formula 3]

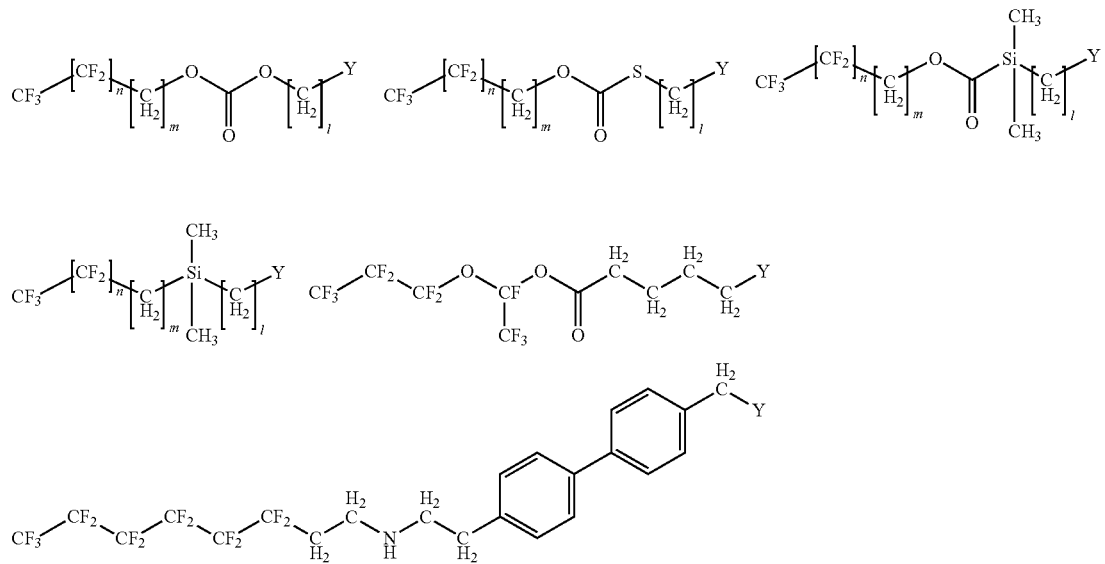

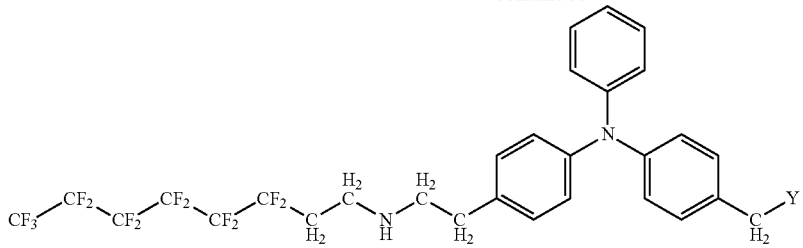

wherein n is an integer of 1 to 5; m is 0 or an integer of 1 to 5; l is 0 or an integer of 1 to 5; and Y is any one of the functional groups represented by the formulae (1a) to (1n);

[Chemical formula 4]

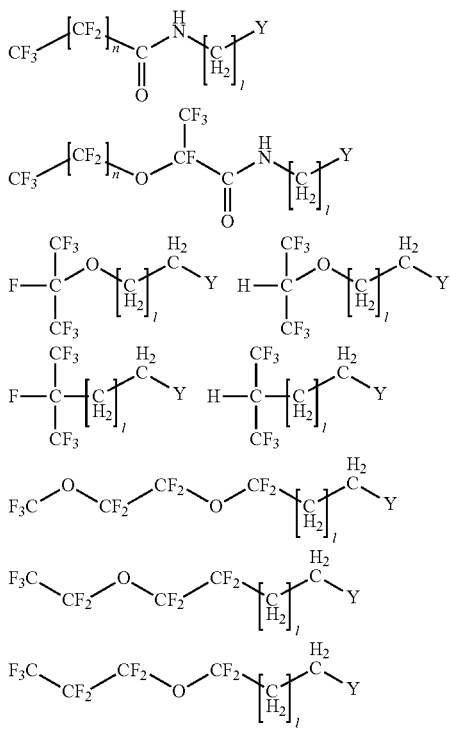

wherein n is an integer of 1 to 5; l is 0 or an integer of 1 to 5; and Y is any one of the functional groups represented by the formulae (1a) to (1n).

The fluorine-containing organic compound attached to the surface can be a polymer; however, it is preferably a compound having a molecular weight of 1,000 or less. The larger the molecular weight, the smaller the rate of linking groups with respect to the organic component in each molecule of the fluorine-containing organic compound. Therefore, there is a small possibility of binding to the nanoparticle, which may result in poor dispersibility, difficulty in controlling particle diameter uniformity, and large particle diameter. When the molecular weight of the fluorine-containing organic compound attached to the surface is large, in the device thus obtained, the rate of remaining organic component is large, so that the performance of the device may be negatively affected, such as high voltage. Moreover, in a photocatalytic treatment, it takes time to decompose the organic component and may result in poor throughput.

The molecular weight of the fluorine-containing organic component attached to the surface refers to the molecular weight of the compound itself when having no molecular weight distribution. When having a molecular weight distribution, it refers to the weight average molecular weight which is a polystyrene equivalent molecular weight measured by gel permeation chromatography (GPC).

In the device material for a hole injection transport layer of the present invention, at least a fluorine-containing organic component is attached to the surface of the transition metal-containing nanoparticle or nanocluster; however, an organic component which is not a fluorine-containing organic component can be attached thereto.

Examples of such an organic component which is not a fluorine-containing organic component include a protective agent which is allowed to be present on the surface of the transition metal-containing nanoparticle or nanocluster before replacing the protective agent containing a fluorine-containing organic compound in the production process, a charge transporting compound containing no fluorine, a crosslinkable compound and a compound for solubility control.

In the transition metal-containing nanoparticle or nanocluster used in the present invention, the content ratio of the transition metal compound and transition metal to the organic compound which is attached to the surface and contains a fluorine-containing organic compound, is appropriately selected and is not particularly limited. However, with respect to the transition metal compound and transition metal atoms of 100 parts by weight, the organic compound which is attached to the surface and contains a fluorine-containing organic compound is preferably 10 to 200 parts by weight, more preferably 10 to 20 parts by weight.

Also in the transition metal-containing nanoparticle or nanocluster, it is preferable to appropriately select the content ratio of the transition metal atoms to the fluorine-containing organic compound because, due to the size of the nanoparticle or nanocluster, the surface area is varied. The molar ratio of the transition metal atoms to the fluorine-containing organic compound is preferably selected from the ranges of 10:1 to 1:5, more preferably 5:1 to 1:2. These ratios can be obtained by NMR method or X-ray photoelectron spectroscopy.

Also in the device material for a hole injection transport layer of the present invention, the amount of the fluorine-containing organic compound attached to the surface can be appropriately selected in accordance with the demand for the liquid repellency of a layer formed with the device material for a hole injection transport layer.

For example, it can be selected so that the contact angle of a liquid having a surface tension of 28.5 mN/m is 25° or more, more preferably 45° or more, still more preferably 55° or more.

The average particle diameter of the device material for a hole injection transport layer used in the present invention is not particularly limited. For example, it is in the range of 0.5 nm to 999 nm, preferably in the range of 0.5 nm to 50 nm, more preferably in the range of 0.5 nm to 20 nm. Moreover, the average particle diameter of the device material for a hole injection transport layer used in the present invention is preferably 15 nm or less, and it is particularly preferably in the range of 1 nm to 10 nm. This is because when the particle diameter if 1 nm or less, such particles are beyond the resolving power of dynamic light scattering method, etc., so that it is difficult to prove the presence of the particles and to stably produce the same. On the other hand, if the particle diameter is too large, the surface area (specific surface area) per unit weight is small, so that there is a possibility that desired effects are not obtained. In addition, there is an increase in the surface roughness of the thin film, so that there may be a possibility of frequent occurrence of short circuit.

Herein, "average particle diameter" is a number average particle diameter measured by dynamic light scattering. In the state where the nanoparticles or nanoclusters are dispersed in the hole injection transport layer, the average particle diameter is a value obtained in such a manner that a region in which 20 or more transition metal-containing nanoparticles are present is specified in an image obtained by using a scanning electron microscope (SEM) or transmission electron microscope (TEM) and the particle diameter of all of the transition metal-containing nanoparticles in this region are measured to obtain the average value (particle diameter).

The particle diameter of the nanocluster, which is not spherical, refers to the longest diameter thereof. In particular, if the nanocluster is in a doughnut shape, the particle diameter is the diameter of the outer circle of the nanocluster. If the nanocluster is in a lemon shape, the particle diameter is the length of the long axis of the nanocluster.

The method for producing the device material for a hole injection transport layer used in the present invention is not particularly limited as long as it is a method by which the transition metal-containing nanoparticle or nanocluster to which surface a fluorine-containing organic compound is attached, can be obtained. Examples of the method for producing the transition metal-containing nanoparticle to which surface a fluorine-containing organic compound is attached, include a liquid phase method in which, for example, a transition metal complex is reacted in an organic solvent with a protective agent comprising a fluorine-containing organic compound having a linking group at the terminal end thereof. It is also possible that after a transition metal complex is reacted with a protective agent which contains no fluorine-containing organic compound in an organic solvent, the protective agent is partly or fully replaced by a protective agent which contains a fluorine-containing organic compound. The reaction temperature in the organic solvent upon producing the nanoparticle is preferably 150 to 300° C., more preferably 220 to 280° C.

Examples of the method for producing the transition metal-containing nanocluster to which surface a fluorine-containing organic compound is attached, include a method in which after the transition metal-containing nanocluster is synthesized, a protective agent comprising a fluorine-containing organic compound having a linking group at the terminal end thereof, is attached to the nanocluster by cation exchange, etc. As the salt used for cation exchange, the above-described ionic liquids of ammonium salt and so on can be suitably used. In this case, any of an inorganic anion and an organic anion can be used as a counter anion.

II. Ink for Forming a Hole Injection Transport Layer

The ink for forming a hole injection transport layer of the present invention is characterized by comprising the device material for a hole injection transport layer of the present invention and an organic solvent.

As needed, the ink for forming a hole injection transport layer of the present invention can further contain other component. The ink for forming a hole injection transport layer can be prepared by adding a hole transporting compound as described below and an additive such as a binder resin which does not function as a hole trap and a coatability improving agent to the device material for a hole injection transport layer of the present invention and an organic solvent, and dissolving or dispersing them.

The organic solvent used for the ink is not particularly limited as long as the transition metal-containing nanoparticle or nanocluster and a component which is added as needed are successfully dissolved or dispersed therein. Examples of the organic solvent include toluene, xylene, dodecylbenzene, cyclohexanone, cyclohexanol, tetralin, mesitylene, anisole, methylene chloride, tetrahydrofuran, dichloroethane, chloroform, ethyl benzoate, butyl benzoate, diphenyl ether, cyclohexylbenzene and 1-methylnaphthalene.

Also in the present invention, a fluorine-based solvent is suitably used because a fluorine-containing organic compound is attached to the surface of the transition metal-containing nanoparticle or nanocluster. The examples of the fluorine-based solvent include the above-mentioned solvents which are partly or fully fluorinated, such as trifluoromethylbenzene, heptafluoro-n-ethyl butyrate, heptafluoro-n-methyl butyrate, 1,1,3,3-hexafluoro-2-propanol, 1,1,3,3-hexafluoro-2-phenyl-2-propanol, 1H,1H-trifluoroethanol, 1H,1H,3H-tetrafluoropropanol, 1H,1H,5H-octafluoropentanol. These solvents can be used solely or in combination of two or more as a cosolvent.

The ink for forming a hole injection transport layer of the present invention can be prepared by mixing an organic solvent with the transition metal-containing nanoparticle or nanocluster to which surface a fluorine-containing organic compound is attached and which contain at least a transition metal oxide. Also, the ink for forming a hole injection transport layer of the present invention can be obtained by mixing an organic solvent with the transition metal-containing nanoparticle or nanocluster to which surface a fluorine-containing organic compound is attached and oxidizing the transition metal and/or transition metal compound contained in the transition metal-containing nanoparticle or nanocluster into a transition metal oxide. Examples of the oxidizing method include heating or irradiation of light in the presence of oxygen.

When heating is employed as the oxidizing method, the examples include heating on a hot plate and heating in an oven. The heating temperature is preferably 50 to 250° C.

When light irradiation is employed as the oxidizing method, the examples include irradiation with ultraviolet light.

Interaction of the transition metal-containing nanoparticles or nanoclusters is varied by heating temperature or light irradiance, so that it is preferable to appropriately control the temperature or irradiance.

The content of the device material for a hole injection transport layer of the present in the ink for forming a hole injection transport layer of the present invention can be appropriately controlled depending on the intended purpose and is not particularly limited. For example, the content is preferably 0.1 to 10.0% by weight in the total amount of the ink.

III. Device Production Method

The first embodiment of the device production method of the present invention is a method for producing a device comprising two or more electrodes facing each other on a substrate and a hole injection transport layer disposed between two of the electrodes, the method comprising the steps of:

forming a hole injection transport layer comprising the device material for a hole injection transport layer of the present invention on a substrate on which first electrode layers are formed in a pattern, and forming a pattern with altered wettability on a surface of the hole injection transport layer by disposing a photocatalyst-containing layer substrate in which a photocatalyst-containing layer containing at least a photocatalyst is formed on a base above the hole injection transport layer, with a gap which allows photocatalytic action associated with energy irradiation to affect the hole injection transport layer, and then by performing patterned energy irradiation.

The second embodiment of the device production method of the present invention is a method for producing a device comprising two or more electrodes facing each other on a substrate and a hole injection transport layer disposed between two of the electrodes, the method comprising the steps of:

forming a hole injection transport layer comprising the device material for a hole injection transport layer of the present invention on a substrate on which electrode layers are formed in a pattern, and forming a pattern with altered wettability on a surface of the hole injection transport layer by patterned vacuum ultraviolet irradiation.

According to the present invention, the hole injection transport layer comprises a material to which a liquid-repellent, fluorine-containing organic compound is attached. The fluorine-containing organic compound is decomposed and fluorine is removed by photocatalytic action or by vacuum ultraviolet irradiation; therefore, a large difference can be made between the wettability of a part irradiated with energy and that of a part not irradiated with energy. It is possible to form a pattern with altered wettability by energy irradiation through a photocatalyst-containing layer or vacuum ultraviolet irradiation to the hole injection transport layer with alterable wettability, and it is thus possible to easily stack a device layer in a pattern on the hole injection transport layer by a coating method, using the altered wettability of the pattern.

According to the present invention, the transition metal-containing nanoparticle or nanocluster which contains a transition metal oxide and is contained in the device material for a hole injection transport layer of the present invention that is contained in the hole injection transport layer, has resistance to ultraviolet which is used in the step of forming a pattern with altered wettability; therefore, the nanoparticle or nanocluster is advantageous in that there is no deterioration in and no loss of their excellent hole injecting transporting property even after the step of forming a pattern with altered wettability. In addition, after the device material for a hole injection transport layer of the present invention undergoes the step of forming a pattern with altered wettability, such as a photocatalytic treatment, there is an increase in the ionization potential of the device material and an improvement in the hole injection properties of the same. The device material for a hole injection transport layer of the present invention has excellent heat and light resistance and is unlikely to deteriorate, and the hole injection properties of the device material is improved through the step of forming a pattern with altered wettability; therefore, the device produced by the production method of the present invention has an improved life.

Also, the device material for a hole injection transport layer of the present invention is resistant to heating at relatively high temperature (such as 200° C.), so that the pattern with altered wettability is not damaged during a heating process and it is possible to perform the step of stacking layers on the hole injection transport layer in a pattern.

The device of the present invention is a device comprising two or more electrodes facing each other on a substrate and a hole injection transport layer disposed between two of the electrodes.

Examples of the device of the present invention include an organic EL device, an organic transistor, a dye-sensitized solar cell, an organic thin film solar cell, and organic devices encompassing an organic semiconductor; moreover, quantum-dot light emitting device having a hole injection transport layer, an oxide-based compound solar cell and so on are included therein.

The method for producing the device of the present invention will be explained in reference to figures.

Figure 1B:
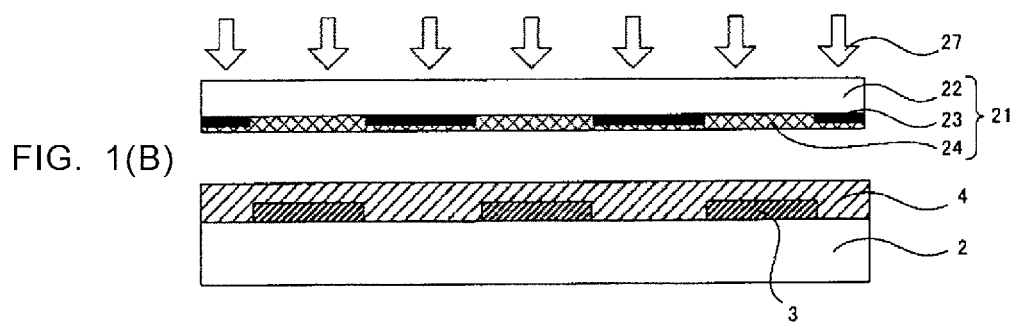
Figure 1C:
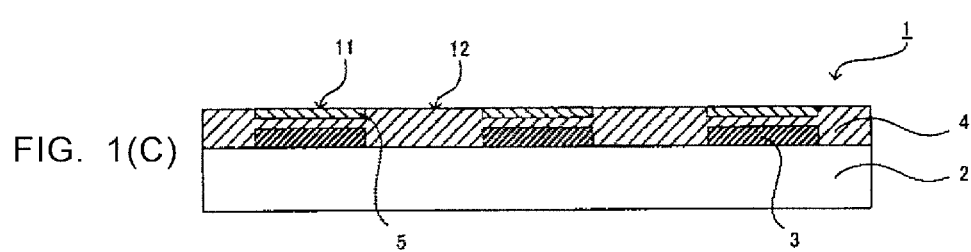

FIGS. 1(A) to (C) show an example of the process of the method of producing the device of the present invention.

First, as shown in FIG. 1(A), first electrode layers 3 are formed in a pattern on substrate 2, and hole injection transport layer 4 comprising the device material for a hole injection transport layer of the present invention is formed on first electrode layers 3 (the step of forming a hole injection transport layer). Next, as shown in FIG. 1(B), photocatalyst-containing layer substrate 21 is prepared, which comprises base 22, light shielding parts 23 formed in a pattern on base 22, and photocatalyst-containing layer 24 containing a photocatalyst and being formed on base 22 so as to cover light shielding parts 23. Then, after disposing photocatalyst-containing layer substrate 21 above hole injection transport layer 4, with a gap which allows photocatalytic action associated with energy irradiation to affect the hole injection transport layer, hole injection transport layer 4 is irradiated with energy rays 27 in a pattern through photocatalyst-containing layer substrate 21. As a result of the irradiation with energy rays 27, as shown in FIG. 1(C), in an exposed part of hole injection transport layer 4, fluorine-decomposed part 5 is formed in the hole injection transport layer by the action of the photocatalyst contained in photocatalyst-containing layer 24, in which part the fluorine-containing organic compound that is present on the surface of the device material for a hole injection transport layer in at least the surface part of hole injection transport layer 4, is decomposed and removed; therefore, lyophilic region 11 is formed on the surface of the exposed part of hole injection transport layer 4 by the action of the photocatalyst. On the other hand, in an unexposed part of hole injection transport layer 4, the fluorine-containing organic compound that is present on the surface of the device material for a hole injection transport layer in the surface part of hole injection transport layer 4 is left intact to be liquid-repellent region 12 (the step of forming a pattern with altered wettability). Device substrate 1 is obtained in this manner. Then, on lyophilic regions 11 on substrate 1, a patterned layer which is at least required for the device is stacked, followed by stacking a second electrode layer thereon, thereby forming a device.

Figure 2A:
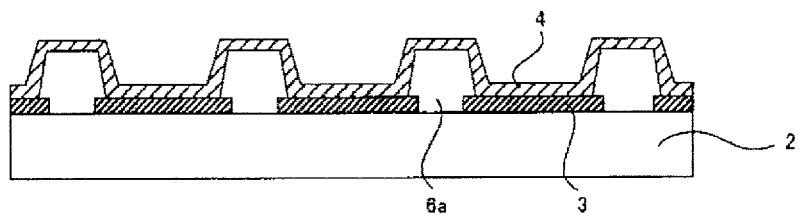
FIGS. 2(A) to 2(C) show a different example of the process of the method of producing the device of the present invention.
Figure 2B:
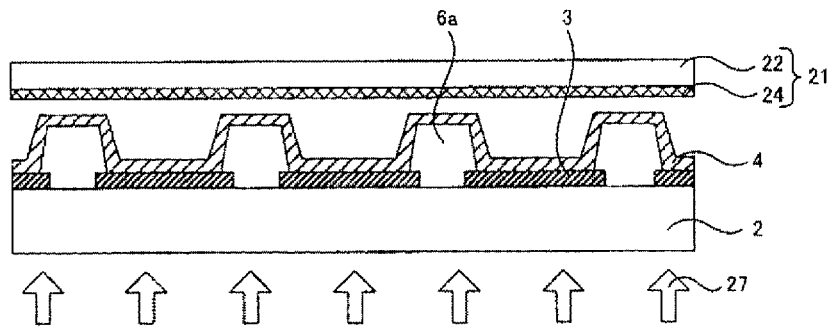
Figure 2C:
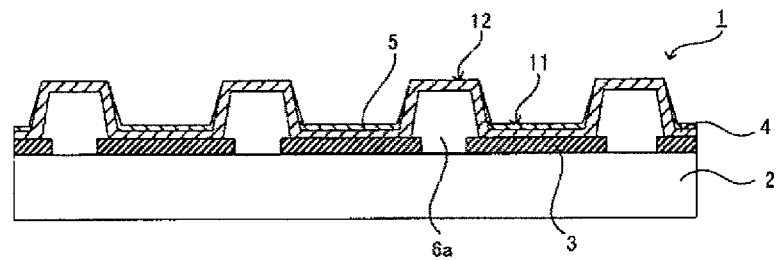

FIGS. 2(A) to 2(C) show a different example of the process of the method of producing the device of the present invention.

First, as shown in FIG. 2(A), first electrode layers 3 are formed in a pattern on substrate 2. A divider (bank 6a) is formed in an opening of the pattern, and hole injection transport layer 4 comprising the device material for a hole injection transport layer of the present invention is formed on first electrode layers 3 and the dividers (banks 6a) (the step of forming a hole injection transport layer). Substrate 2 is a transparent substrate and the divider (bank 6a) is a divider which reflects or absorbs the energy rays applied in the step of forming the pattern with altered wettability. Next, as shown in FIG. 2(B), photocatalyst-containing layer substrate 21 is prepared, which comprises base 22 and photocatalyst-containing layer 24 formed on base 22. Then, after disposing photocatalyst-containing layer substrate 21 above hole injection transport layer 4, with a gap which allows photocatalytic action associated with energy irradiation to affect the hole injection transport layer, hole injection transport layer 4 is irradiated with energy rays 27 from substrate 2 side (transparent substrate side). In this embodiment, the divider (bank 6a) reflects or absorbs energy rays, so that an area in which no divider (bank 6a) is formed is irradiated with energy rays 27, while an area in which a divider (bank 6a) is formed is not irradiated with energy rays 27. As a result of the irradiation with energy rays 27, as shown in FIG. 2(C), in an exposed part of hole injection transport layer 4, fluorine-decomposed part 5 is formed in the hole injection transport layer by the action of the photocatalyst contained in photocatalyst-containing layer 24, in which part the fluorine-containing organic compound that is present on the surface of the device material for a hole injection transport layer in at least the surface part of hole injection transport layer 4, is decomposed and removed; therefore, lyophilic region 11 is formed on the surface of the exposed part of hole injection transport layer 4 by the action of the photocatalyst. On the other hand, in an unexposed part of hole injection transport layer 4, the fluorine-containing organic compound that is present on the surface of the device material for a hole injection transport layer in the surface part of hole injection transport layer 4 is left intact to be liquid-repellent region 12 (the step of forming a pattern with altered wettability). Device substrate 1 is obtained in this manner. Then, on lyophilic regions 11 on substrate 1, a patterned device layer required for the device can be stacked by a coating method, followed by stacking a second electrode layer thereon, thereby forming a device.

In the production method shown in FIGS. 2(A) to 2(C), the divider which reflects or absorbs the applied energy rays functions as a mask, so that the hole injection transport layer can be irradiated with energy in a pattern without preparing the light shielding parts in the photocatalyst-containing layer substrate or a photomask, and a large advantage is provided to the manufacturing process. The device material for a hole injection transport layer used for the hole injection transport layer of the present invention has a larger transmittance in the ultraviolet wavelength region than conventional, organic compound-based hole injection transport materials; therefore, such an energy irradiation of the hole injection transport layer from the backside thereof is possible.

Figure 3A:
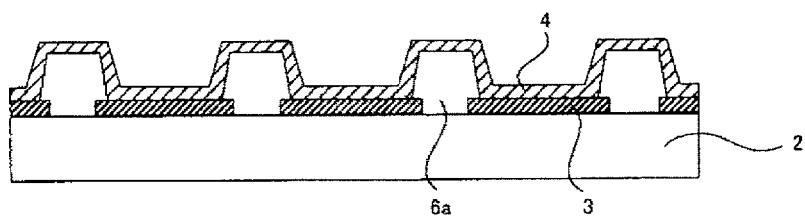
FIGS. 3(A) to 3(C) show a different example of the process of the method of producing the device of the present invention.
Figure 3B:
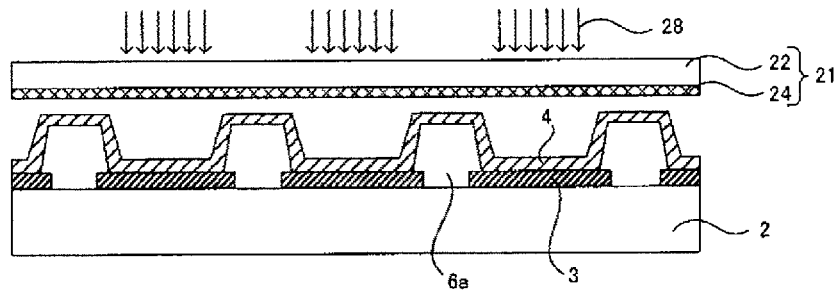
Figure 3C:
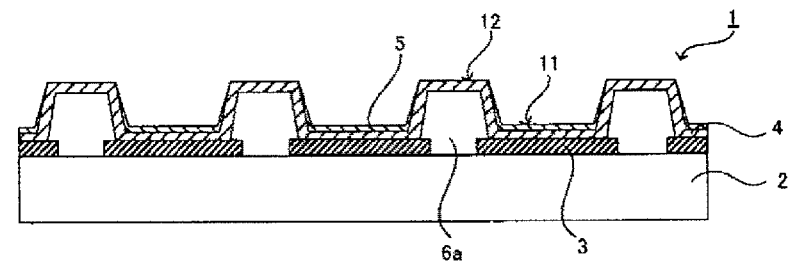

FIGS. 3(A) to 3(C) show an example of the process of the method of producing the device of the present invention.

First, as shown in FIG. 3(A), first electrode layers 3 are formed in a pattern on substrate 2. A divider (bank 6a) is formed in an opening of the pattern, and hole injection transport layer 4 comprising the device material for a hole injection transport layer of the present invention is formed on first electrode layers 3 and the dividers (banks 6a) (the step of forming a hole injection transport layer). Next, as shown in FIG. 3(B), photocatalyst-containing layer substrate 21 is prepared, which comprises base 22 and photocatalyst-containing layer 24 formed on base 22. Then, after disposing photocatalyst-containing layer substrate 21 above hole injection transport layer 4, with a gap which allows photocatalytic action associated with energy irradiation to affect the hole injection transport layer, ultraviolet laser light 28 is scanned in a pattern and applied to hole injection transport layer 4 through photocatalyst-containing layer substrate 21. As a result of the irradiation with ultraviolet laser light 28, as shown in FIG. 3(C), in an exposed part of hole injection transport layer 4, fluorine-decomposed part 5 is formed in the hole injection transport layer by the action of the photocatalyst contained in photocatalyst-containing layer 24, in which part the fluorine-containing organic compound that is present on the surface of the device material for a hole injection transport layer in at least the surface part of hole injection transport layer 4, is decomposed and removed; therefore, lyophilic region 11 is formed on the surface of the exposed part of hole injection transport layer 4 by the action of the photocatalyst. On the other hand, in an unexposed part of hole injection transport layer 4, the fluorine-containing organic compound that is present on the surface of the device material for a hole injection transport layer in the surface part of hole injection transport layer 4 is left intact to be liquid-repellent region 12 (the step of forming a pattern with altered wettability). Device substrate 1 is obtained in this manner. Then, on lyophilic regions 11 on substrate 1, a patterned device layer required for the device can be formed by a coating method, followed by stacking a second electrode layer thereon, thereby forming a device.

Figure 4A:
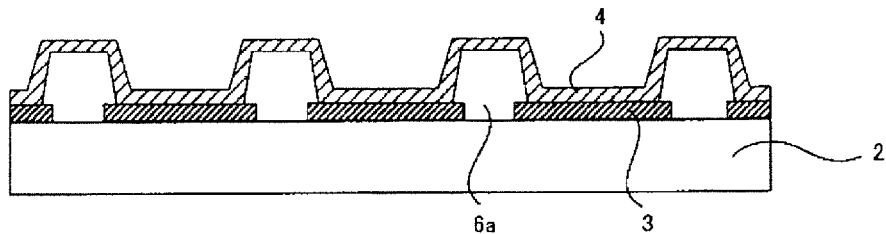
FIGS. 4(A) to 4(C) show a different example of the process of the method of producing the device of the present invention.
Figure 4B:
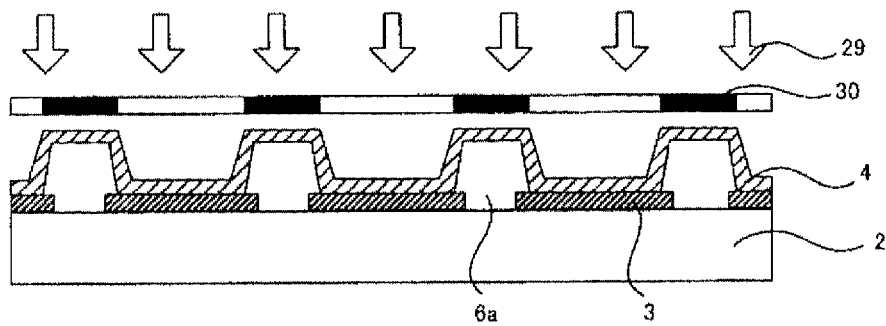
Figure 4C:
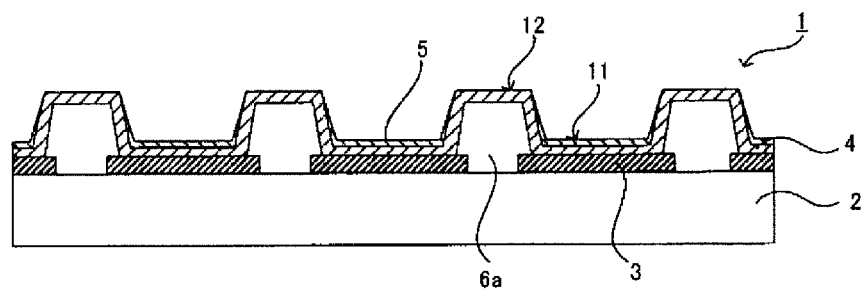

FIGS. 4(A) to 4(C) show an example of the process of the method of producing the device of the present invention.

First, as shown in FIG. 4(A), first electrode layers 3 are formed in a pattern on substrate 2. A divider(bank 6a) is formed in an opening of the pattern, and hole injection transport layer 4 comprising the device material for a hole injection transport layer of the present invention is formed on first electrode layers 3 and the dividers (banks 6a) (the step of forming a hole injection transport layer). Next, as shown in FIG. 4(B), metal mask 30 is disposed above hole injection transport layer 4, and hole injection transport layer 4 is irradiated with vacuum ultraviolet light 29 through metal mask 30. As a result of the irradiation with vacuum ultraviolet light 29, as shown in FIG. 4(C), in an exposed part of hole injection transport layer 4, fluorine-decomposed part 5 is formed in the hole injection transport layer in which part the fluorine-containing organic compound that is present on the surface of the device material for a hole injection transport layer in at least the surface part of hole injection transport layer 4, is decomposed and removed; therefore, lyophilic region 11 is formed on the surface of the exposed part of hole injection transport layer 4 by the action of the photocatalyst. On the other hand, in an unexposed part of hole injection transport layer 4, the fluorine-containing organic compound that is present on the surface of the device material for a hole injection transport layer in the surface part of hole injection transport layer 4 is left intact to be liquid-repellent region 12 (the step of forming a pattern with altered wettability). Device substrate 1 is obtained in this manner. Then, on lyophilic regions 11 on substrate 1, a patterned device layer required for the device can be formed by a coating method, followed by stacking a second electrode layer thereon, thereby forming a device.

As just described, in the part affected by photocatalytic action associated with the energy irradiation or in the part irradiated with vacuum ultraviolet light, lyophilic region 11 is formed in at least the surface part of hole injection transport layer 4. It is considered that this is because the fluorine-containing organic compound that is present on the surface of the device material for a hole injection transport layer in at least the surface part of hole injection transport layer 4, is decomposed and removed by photocatalytic action associated with the energy irradiation, the irradiation with vacuum ultraviolet light or the like to form a fluorine-decomposed part, and the fluorine-decomposed part becomes a region with liquid affinity (lyophilic region) relative to the liquid repellency of the hole injection transport layer on which surface the fluorine-containing organic compound is present. Therefore, as exemplified in FIGS. 1(C), 2(C), 3(C) and 4(C), it is possible to form a pattern comprising lyophilic region 11 and liquid-repellent region 12, the lyophilic region comprising the surface of fluorine-decomposed part 5 in the hole injection transport layer, in and from which region fluorine in constituent materials of hole injection transport layer 4 is decomposed and removed, and the liquid-repellent region being a region other than lyophilic region 11, in and from which region fluorine in constituent materials of hole injection transport layer 4 is not decomposed and removed.

"Lyophilic region" is a region in which the contact angle of liquid is smaller than the liquid-repellent region, and it is a region which has excellent wettability for, for example, an ink for forming layers adjacently formed on the hole injection transport layer. "Liquid-repellent region" is a region in which the contact angle of liquid is larger than the lyophilic region, and it is a region which has poor wettability for the ink for forming layers.

The liquid contact angle of the liquid-repellent region is preferably 10 degrees or higher than that of the lyophilic region, more preferably 20 degrees higher than that of the lyophilic region, still more preferably 40 degrees higher than that of the lyophilic region, in the case of using a liquid having a surface tension of 28.5 mN/m.

Also in the liquid-repellent region, the contact angle of a liquid having a surface tension of 28.5 mN/m is preferably 25° or more, more preferably 45° or more, still more preferably 55° or more. This is because the liquid-repellent region is a region which is required to have liquid repellency, so that if the liquid contact angle is too small, there is a possibility that the liquid repellency of the liquid-repellent region is not sufficient and the ink for forming layers, etc., can be attached to the region.

On the other hand, in the lyophilic region, the contact angle of a liquid having a surface tension of 28.5 mN/m is preferably 20° or less, more preferably 10° or less, still more preferably 5° or less. If the liquid contact angle is too high, there is a possibility that the ink for forming layers is unlikely to wet and spread, and an adjacently formed layer can be imperfect.

The liquid contact angle can be obtained from a result which is obtained by measuring the contact angle of liquids having various surface tensions (five seconds after a droplet is dropped from a microsyringe) using a contact angle measuring apparatus (CA-Z type apparatus manufactured by Kyowa Interface Science Co., Ltd.) Or, it can be obtained by making the result a graph. In this measurement, a wettability standard solution manufactured by Junsei Chemical Co., Ltd. is used as the liquids having various surface tensions.

1. Step of Forming a Hole Injection Transport Layer

The step of forming a hole injection transport layer in the present invention is a step of forming a hole injection transport layer comprising the device material for a hole injection transport layer of the present invention on the substrate on which the first electrode layers are formed in a pattern.

(Method for Forming a Hole Injection Transport Layer)

The method for forming the hole injection transport layer is not particularly limited as long as it is a method which can form a film from the device material for a hole injection transport layer of the present invention entirely on a surface of the substrate on which the first electrode layers are formed in a pattern. For example, from the viewpoint of process advantages, preferred is a wet process comprising the steps of preparing an ink for forming a hole injection transport layer, which comprises the device material for a hole injection transport layer of the present invention and an organic solvent, and applying the ink to form a layer. It is also possible to use a transfer method in which a layer formed by applying the ink is transferred. The hole injection transport layer of the present invention can be formed on, for example, a hole injection layer formed on the first electrode layers, as long as it is formed on the substrate on which the first electrode layers are formed in a pattern.

The ink for forming a hole injection transport layer which comprises the device material for a hole injection transport layer of the present invention and an organic solvent can be formed in the same manner as "II. Ink for forming a hole injection transport layer." By appropriately adding other component as described above to the ink for forming a hole injection transport layer, a hole injection transport layer which further contains other component can be formed.

The method can further comprise the step of heating the ink for forming a hole injection transport layer in the presence of oxygen before applying the ink. In this case, the amount of the transition metal oxide in the device material for a hole injection transport layer is increased, and there is a possible increase in hole injecting transporting property. Or, the outer shell of the transition metal-containing nanoparticle is oxidized and stabilized, and there is a possible increase in drive resistance.

The method for applying the ink for forming a hole injection transport layer is only required to be a method that can uniformly and entirely apply the above material onto a surface of the substrate, and the examples include a die coating method, a spin coating method, a dip coating method, a roll coating method, a bead coating method, a spray coating method, a bar coating method, a gravure coating method, a blade coating method, a cast method, an ink-jet method, a nozzle printing method, an aerosol method, a flexographic printing method, a screen printing method and an offset printing method.

Drying can be performed after the ink for forming a hole injection transport layer is applied. The drying can be performed by a general drying method such as heating. The heating can be performed by the following methods, for example: a method of conveying the layer through or placing the layer in an apparatus which heats an entire specific space (e.g., an oven), a method of applying hot air, a method of directly heating the layer with far infrared rays, etc., and a method of heating on a hot plate. When heated in the presence of oxygen, the content of the transition metal oxide in the device material for a hole injection transport layer of the present invention contained in the layer is increased, and there is a possible increase in hole injecting transporting property.

The thickness of the hole injection transport layer can be appropriately determined depending on the intended purpose or an adjacent layer. It is generally 0.1 to 1,000 nm, preferably 1 to 500 nm.

From the viewpoint of hole injection efficiency, the hole injection transport layer preferably has a work function of 5.0 to 6.0 eV, more preferably 5.0 to 5.8 eV.

(Substrate)

The substrate can be a transparent substrate which transmits light, or it can be a non-transparent substrate. For example, in the device of the present invention, the substrate is preferably transparent when light is obtained from the substrate side or when, in the process of producing the device of the present invention, energy is applied from the substrate side to form a pattern comprising lyophilic and liquid-repellent regions. Examples of the transparent substrate include a quartz substrate and a glass substrate. Examples of the substrate which is not required to be transparent include metal substrates such as a substrate of aluminum and an alloy thereof, a plastic substrate, a substrate of woven fabric and a substrate of nonwoven fabric.

(First Electrode Layer)

The first electrode layers used in the present invention are formed on the substrate in a pattern.

The material for forming the first electrode layers is not particularly limited as long as it is an electroconductive material.

The material for forming the first electrode layers can be transparent nor non-transparent. For example, in the device of the present invention, the first electrode layers are preferably transparent when light is obtained from the substrate side or when, in the process of producing the device of the present invention, energy is applied from the substrate side to form a pattern comprising lyophilic and liquid-repellent regions. Preferred examples of the electroconductive, transparent material include In—Zn—O (IZO), In—Sn—O (ITO), ZnO—Al and Zn—Sn—O. On the other hand, in the device of the present invention, the first electrode layers are not required to be transparent when light is obtained from the opposite side of the substrate. In this case, metals can be used as the electroconductive material, and specific examples thereof include Au, Ta, W, Pt, Ni, Pd, Cr, Al alloys, Ni alloys and Cr alloys.

The first electrode layers are formed in a pattern. The method for forming the first electrode layers can be a general electrode layer forming method such as a spattering method, an ion plating method or a vacuum vapor-deposition method. Examples of the method for patterning the first electrode layers include a photolithography method.

2. Step of Forming a Pattern with Altered Wettability

The step of forming a pattern with altered wettability of the present invention is a step of forming a pattern with altered wettability on a surface of the hole injection transport layer.

The method of patterned energy irradiation in order to form a pattern with altered wettability on a surface of the hole injection transport layer is not particularly limited as long as it is a method that can decompose the material contained in the hole injection transport layer in a pattern. In general, a method that can produce an active oxygen species such as oxygen radicals by energy irradiation is used because the fluorine-containing organic compound attached to the surface of the material contained in the hole injection transport layer can be decomposed by the strong oxidation or reduction power of this active oxygen species.

As the step of forming a pattern with altered wettability of the present invention, there may be mentioned (1) a step of forming a pattern comprising a lyophilic region in and from which fluorine is decomposed and removed, and a liquid-repellent region in and from which no fluorine is decomposed and removed, in such a manner that a photocatalyst-containing layer substrate having a photocatalyst-containing layer containing a photocatalyst is used and fluorine contained in the hole injection transport layer is decomposed and removed by photocatalyitic action associated with patterned energy irradiation and (2) a step of forming a pattern comprising a lyophilic region in and from which fluorine is decomposed and removed, and a liquid-repellent region in and from which no fluorine is decomposed and removed, in such a manner that fluorine contained in the hole injection transport layer is decomposed and removed by patterned vacuum ultraviolet irradiation. Also, there may be used a method of irradiation with electron beams, plasma or the like through a mask having openings in a pattern, or a method of spraying oxygen radicals through a mask in a vacuum.

The lyophilic region is a fluorine-decomposed part of the hole injection transport layer, in which, in the part affected by photocatalytic action associated with energy irradiation or in the part irradiated with vacuum ultraviolet light, the fluorine-containing organic compound attached to the surface of the device material for a hole injection transport layer contained in the hole injection transport layer is decomposed and fluorine is removed therefrom.

In the lyophilic region, the fluorine-containing organic compound attached to the surface of the device material for a hole injection transport layer is not contained. Or, in the lyophilic region, the fluorine-containing organic compound is contained in a smaller amount than the amount of the fluorine-containing organic compound attached to the surface of the material originally contained in the hole injection transport layer.

It is possible to confirm that the lyophilic region is that in which the fluorine-containing organic compound attached to the surface of the device material for a hole injection transport layer contained in the hole injection transport layer is decomposed and fluorine is removed therefrom, by analyzing fluorine distribution in the hole injection transport layer at the device and at the bank by TOF-SIMS, etc., and comparing them, for example.

The position for forming the lyophilic region and the liquid-repellent position are not particularly limited as long as a functional layer of the device such as a light emitting layer can be patterned in a desired pattern. For example, when the first electrode layers are formed in a pattern, it is preferable that the lyophilic region is disposed above the first electrode layers formed in a pattern and, as shown in FIG. 1(C), the liquid-repellent region is disposed on an opening of the pattern of the first electrode layers.

Figure 5:
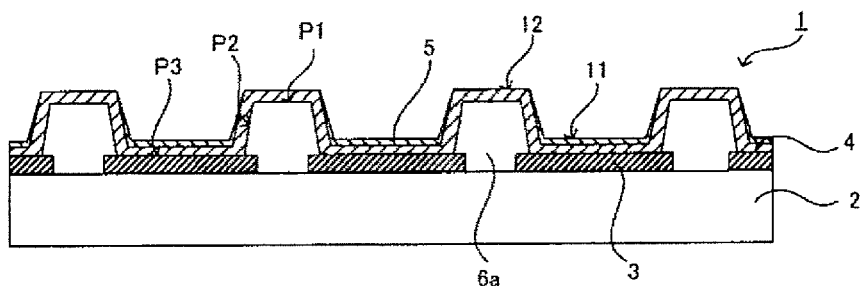
FIG. 5 is a schematic sectional view of an example of the device substrate which is a part of the device of the present invention.

As shown in FIG. 5, when a divider (bank 6a) is formed on substrate 2 on which first electrode layers 3 are formed, it is preferable that liquid-repellent region 12 is disposed on top P1 of the divider (bank 6a) and lyophilic region 11 is disposed on side P2 of the divider (bank 6a) and on opening P3 of the same. This is because, when forming an adjacent layer on such a hole injection transport layer, the ink of the adjacent layer is not attached onto the liquid-repellent region disposed on the top of the divider and thus no layer is formed, so that an adjacent layer and so on can be patterned with accuracy on the hole injection transport layer.

Moreover, in a conventional bank comprising a liquid-repellent material or a bank subjected to a liquid repellent treatment, not only the top of the bank but also the side become liquid-repellent. As a result, there is a problem that the light emitting layer is physically detached from the side of the divider or there is an area in which the thickness of the light emitting layer or the like is thin or no light emitting layer or the like is formed. In the present invention, however, a lyophilic region can be disposed on the side of the divider, so that it is possible to prevent physical detachment of the light emitting layer from the side of the divider or occurrence of the area in which the thickness of the light emitting layer or the like is thin or no light emitting layer or the like is formed.

When the divider is formed, the liquid-repellent region forming position can be on the top of the divider. As shown in FIG. 5, liquid-repellent region 12 can be disposed only on top P1 of the divider (bank 6a) or it can be disposed on top P1 and part of side P2 of the divider (bank 6a) (not shown). In the former case, the liquid-repellent region can be formed all over the top of the divider or it can be formed on part of the top of the same. In the latter case, appropriately depending on the device design, liquid-repellent region 12 can be formed up to a height which is lower than the height that is expected when the surface of an ink for layers to be patterned and stacked on the hole injection transport layer becomes even, or it can be formed up to a height which is higher than the height.

The pattern shape of the lyophilic and liquid-repellent regions is not particularly limited as long as layers to be stacked in a desired pattern on the hole injection transport layer can be patterned thereon. For example, when the first electrode layers are formed in a pattern, the pattern shape of the lyophilic and liquid-repellent regions is appropriately selected depending of the pattern shape of the first electrode layers. In particular, when the first electrode layers are formed in a stripe pattern, the lyophilic regions are formed in a stripe pattern corresponding to the stripe pattern of the first electrode layers. When the first electrode layers are formed in a mosaic pattern corresponding to pixels, the lyophilic regions can be formed in a stripe, checkered or mosaic pattern.

Hereinafter, the above steps (1) and (2) of the step of forming a pattern with altered wettability will be explained each.

(1) Method of Using Photocatalytic Action

The method of using photocatalytic action associated with energy irradiation is a method such that a photocatalyst-containing layer substrate in which a photocatalyst-containing layer containing at least a photocatalyst is formed on a base is used; the photocatalyst-containing layer substrate is disposed above the hole injection transport layer, with a gap which allows photocatalytic action associated with energy irradiation to affect the hole injection transport layer; and then patterned energy irradiation is performed.

The mechanism in which the fluorine-containing organic compound attached to the surface of the device material for a hole injection transport layer contained in the hole injection transport layer is decomposed by photo catalytic action associated with energy irradiation, is not clear. However, it is considered as follows. The photocatalyst contained in the photocatalyst-containing layer cause an oxidation-reduction reaction by energy irradiation, and the thus-obtained active oxygen species such as a super oxide radical ($.O^{2-}$) or hydroxyl radical ($.OH$) exerts an effect on the fluorine-containing organic compound, thereby making the fluorine-containing organic compound a decomposed product. As a result of volatilizing and removing the decomposed product, the fluorine-containing organic product attached to the surface of the device material for a hole injection transport layer contained in the hole injection transport layer is decomposed, thereby forming a region from which fluorine is removed.

Hereinafter, the method of exerting photocatalytic action on the hole injection transport layer using a photocatalyst-containing layer substrate, will be explained.

(Photocatalyst-containing Layer Substrate)

In the photocatalyst-containing layer substrate used in the present invention, a photocatalyst-containing layer containing at least a photocatalyst is formed on a base.

Figure 6A:
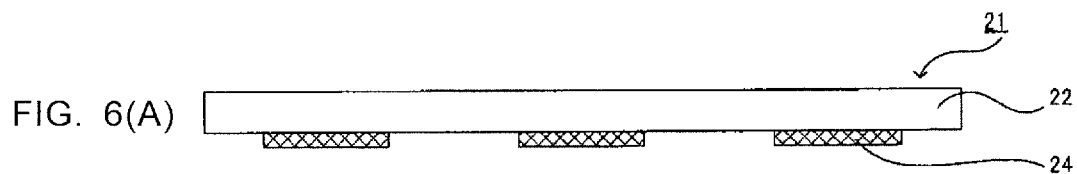
FIGS. 6(A) and 6(B) are schematic sectional views of examples of the photocatalyst-containing layer substrate used in the present invention.

The photocatalyst-containing layer forming position can be as follows: photocatalyst-containing layer 24 can be entirely formed on a surface of base 22 as shown in FIG. 2(B) or photocatalyst-containing layers 24 can be formed in a pattern on base 22 as shown in FIG. 6(A).

When the photocatalyst-containing layers are formed in a pattern, it is not necessary to dispose the photocatalyst-containing layers above the hole injection transport layer, with a predetermined gap therebetween, and it is also not necessary to perform patterned irradiation using a photomask or the like upon energy irradiation. By thoroughly irradiating it with energy, liquid-repellent regions can be formed in a pattern, in each of which the material contained in the hole injection transport layer is decomposed. Also in this case, the energy irradiation direction can be any direction as long as energy is applied to the part in which the hole injection transport layer faces the photocatalyst-containing layers. In addition, the applied energy is not limited to linear energy such as parallel light.

Also in the photocatalyst-containing layer substrate, the light shielding parts can be formed in a pattern. In the case of using a photocatalyst-containing layer substrate having light shielding parts formed in a pattern, it is not necessary to use a photomask or to use laser beam lithography upon energy irradiation. In this case, therefore, it is not necessary to set the position of the photocatalyst-containing layer substrate and photomask, so that process simplification is possible and there is a cost advantage because there is no need for an expensive apparatus required for lithography.

Figure 6B:
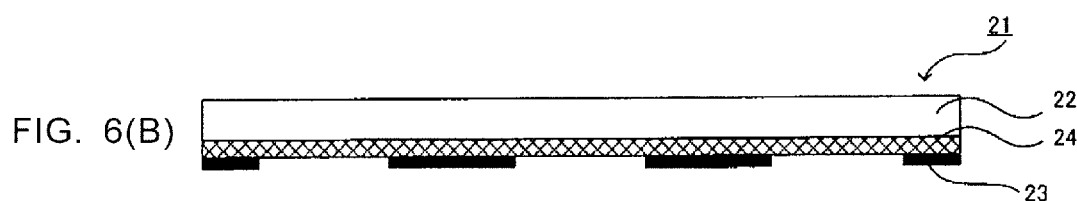

The light shielding parts forming position can be as follows: light shielding parts 23 are formed in a pattern on base 22 and photocatalyst-containing layer 24 is formed on light shielding parts 23 as shown in FIG. 1(B); photocatalyst-containing layer 24 is formed on base 22 and light shielding parts 23 are formed in a pattern on photocatalyst-containing layer 24 as shown in FIG. 6(B); or the light shielding parts can be formed in a pattern on a surface of the base, on which surface no photocatalyst-containing layer is formed (not shown).

When the light shielding parts are formed on the base and when the light shielding parts are formed on the photocatalyst-containing layer, compared with the case of using a photomask, the light shielding parts are disposed in the vicinity of the part where the photocatalyst-containing layer and the hole injection transport layer are disposed having a gap therebetween, so that it is possible to minimize effects caused by energy scattering inside the base, etc. Therefore, patterned energy irradiation can be performed very accurately.

When the light shielding parts are formed on a surface of the base, on which surface no photocatalyst-containing layer is formed, a photomask can be attached to the surface of the light shielding parts to the extent that the photomask can be attached to and removed from the surface. Therefore, it is suitable in the case where devices are produced in small lots.

In particular, the photocatalyst-containing layer substrate can be similar to a photocatalyst-containing layer side substrate disclosed in Japanese Patent Application Laid-Open (JP-A) No. 2000-249821, etc.

(Disposition of Photocatalyst-containing Layer Substrate and Hole Injection Transport Layer)

In the present invention, the photocatalyst-containing layer substrate is disposed above the hole injection transport layer, with a gap which allows photocatalytic action associated with energy irradiation to affect the hole injection transport layer. "Gap" also encompasses a state in which the photocatalyst-containing layer is in contact with the hole injection transport layer.

In particular, the gap between the photocatalyst-containing layer and the hole injection transport layer is preferably 200 μm or less. This is because an active oxygen species produced from oxygen, water and photo catalytic action is likely to be desorbed by disposing the photocatalyst-containing layer and the hole injection transport layer, with a predetermined gap therebetween.

The gap is preferably in the range of 0.2 μm to 20 μm, more preferably in the range of 1 μm to 10 μm, considering excellent pattern accuracy; photocatalyst sensitivity is high; and decomposition and removal efficiency is excellent.

For example, in the case of producing a large-area device having a size of more than 300 mm×300 mm, it is extremely difficult to provide a narrow gap as described above between the photocatalyst-containing layer substrate and the hole injection transport layer. Moreover, there is concern about a decrease in productivity such as dirt attached to the photocatalyst-containing layer. In the case of producing a device with a relatively large area, therefore, the gap is preferably in the range of 50 μm to 150 μm, more preferably in the range of 80 μm to 120 μm. This is because, by setting the gap in the range, it is possible to prevent a decrease in pattern accuracy (e.g., blurred or detached pattern) and to prevent a deterioration in photocatalyst sensitivity and thus in decomposition and removal efficiency.

When such a relatively large area is irradiated with energy, it is preferable to set the gap in a positioning apparatus in an energy irradiation apparatus, which is for positioning the photocatalyst-containing layer substrate and the hole injection transport layer, in the range of 10 μm to 200 μm, more preferably in the range of 25 μm to 75 μm. This is because, by setting the set value of the gap in the range, it is possible to prevent a large decrease in pattern accuracy and a large deterioration in photocatalyst sensitivity, and it is also possible to dispose the photocatalyst-containing layer substrate and the hole injection transport layer without bringing the substrate into contact with the layer.

The above-described positioning state having such a gap is needed to be kept at least during energy irradiation.

(Energy Irradiation)

The wavelength of light used for energy irradiation is generally in the range of 450 nm or less, preferably in the range of 380 nm or less. This is because, as described above, the preferable photocatalyst used for the photocatalyst-containing layer is titanium dioxide and the light of a wavelength in the range is preferable as the energy which activates photocatalytic action by the help of titanium dioxide.

Light sources which are usable for energy irradiation include a mercury lamp, a metal halide lamp, a xenon lamp, an excimer lamp and other various kinds of light sources, for example.

As the method of patterned energy irradiation, there may be used a patterned energy irradiation method using a photomask, a pattern lithography method using laser such as excimer, YAG or the like.

Upon the energy irradiation, the energy irradiance is an irradiance that is required to alter the wettability of the surface of the charge injection transport layer by the action of the photocatalyst contained in the photocatalyst-containing layer.

At this time, it is preferable to perform energy irradiation while heating the photocatalyst-containing layer. This is because it is possible to increase the sensitivity and efficiently alter the wettability. Specifically, it is preferable to heat the substrate and the mask in the temperature range of 30° C. to 80° C. From the viewpoint of exposure accuracy, the temperature difference between the substrate and the mask is preferably as small as possible, and it is more preferably within 1° C.

The energy irradiation direction is determined depending on whether or not the light shielding parts are formed on the photocatalyst-containing layer substrate or depending on the direction of light emission of the device. For example, when the light shielding parts are formed on the photocatalyst-containing layer substrate and the base of the photocatalyst-containing layer substrate is transparent, energy is applied from the photocatalyst-containing layer substrate side. Or, for example, when the photocatalyst-containing layers are formed in a pattern, the energy irradiation direction can be any direction as described above as long as energy is applied to the part in which the hole injection transport layer faces the photocatalyst-containing layers. Also for example, in the case of using a photomask, energy is applied from the side above which a photomask is disposed. In this case, the side is needed to be transparent.

In the method of using photocatalytic action associated with energy irradiation, examples of the embodiment of performing patterned energy irradiation using the photocatalyst-containing layer substrate, include the following.

When the photocatalyst-containing layer 24 is entirely formed on a surface of base 22, energy is applied in a pattern through a photomask or, as shown in FIG. 2(B), energy is applied in a pattern from the transparent substrate side (the back side of the hole injection transport layer) which has a divider that reflects or absorbs energy rays as a mask. Also, as shown in FIG. 3(B), when photocatalyst-containing layer 24 is entirely formed on a surface of base 22, energy can be applied in such a manner that laser beam lithography is performed thereon in a pattern. Or, as shown in FIG. 6(A), when photocatalyst-containing layers 24 are formed in a pattern on base 22, energy is applied in a pattern by using the photocatalyst-containing layer substrate as a mask. Furthermore, as shown in FIG. 1(B), when light shielding parts 23 are formed in a pattern, energy is applied in a pattern by using the photocatalyst-containing layer substrate as a mask.

Specifically, the method of exerting photocatalytic action on the hole injection transport layer using the photocatalyst-containing layer substrate can be similar to a method disclosed in JP-A No. 2000-249821, which is a method of exerting photocatalytic action on a characteristic alterable layer using a photocatalyst-containing layer side substrate.

(2) Method of Patterned Vacuum Ultraviolet Irradiation

As the method of patterned vacuum ultraviolet irradiation, there may be mentioned a method of using a mask for vacuum ultraviolet light as the mask and applying vacuum ultraviolet light as the energy.

The mechanism in which the fluorine-containing organic compound attached to the surface of the device material for a hole injection transport layer contained in the hole injection transport layer is decomposed by vacuum ultraviolet irradiation, is not clear. However, it is considered as follows. When the hole injection transport layer is irradiated with vacuum ultraviolet light, molecular bonds of the fluorine-containing organic compound contained in the hole injection transport layer is cut by the action of the vacuum ultraviolet light or in the presence of oxygen, the fluorine-containing organic compound is subjected to the action of ozone or an oxygen radical produced by excitation of oxygen. Therefore, the fluorine fluorine-containing organic compound becomes a decomposed product, and as a result of volatilizing and removing the decomposed product, a fluorine-decomposed part from which fluorine is removed, can be formed.

The wavelength of the vacuum ultraviolet light is not particularly limited as long as it is in the range which can produce an oxygen radical by the action with oxygen. In general, it is preferably in the range of 100 nm to 250 nm, more preferably in the range of 150 nm to 200 nm. When the wavelength is longer than the range, there is a possibility that there is a decrease in oxygen radical production efficiency and thus a decrease in efficiency of decomposition and removal of the material contained in the hole injection transport layer. Also when the wavelength is shorter than the range, there is a possibility that stable vacuum ultraviolet irradiation is difficult.

Examples of the light source which is used to apply vacuum ultraviolet light in the above wavelength range include an excimer lamp, a low pressure mercury lamp and other various kinds of light sources.

The irradiance of vacuum ultraviolet light is not particularly limited as long as it is in the range which can remove a layer for forming the lyophilic layer. It can be appropriately controlled depending on the type of the material contained in the hole injection transport layer, the wavelength of the vacuum ultraviolet light, etc.

The mask for vacuum ultraviolet light used upon vacuum ultraviolet irradiation is needed to be one which can transmit vacuum ultraviolet light in a pattern. Examples of the mask include a metal mask which has openings in a pattern and a mask which has a transparent substrate which can transmit vacuum ultraviolet light and light shielding parts which are formed in a pattern on the transparent substrate and can shield vacuum ultraviolet light.

The material for the metal mask is needed to be one which can shield the vacuum ultraviolet light and there may be used materials disclosed in JP-A No. 2007-178783, etc.

The transparent substrate is needed to be one which can transmit vacuum ultraviolet light and there may be used a quartz substrate, etc. As the shielding material which constitutes the light shielding parts, there may be mentioned metals such as chrome and chrome oxide.

Vacuum ultraviolet light is a non-directional diffuse light. Therefore, in the case of applying vacuum ultraviolet light through a mask for vacuum ultraviolet light, it is preferable to bring the mask as close as possible to the hole injection transport layer so that vacuum ultraviolet light is not diffracted between the hole injection transport layer and the mask.

Especially when no divider such as a bank or insulation layer is formed, it is preferable to bring the mask for vacuum ultraviolet light as close as possible to the hole injection transport layer and to dispose the mask so as not to be in contact with the hole injection transport layer.

On the other hand, when a divider such as a bank or insulation layer is formed, it is possible to bring the mask for vacuum ultraviolet light as close as possible to the hole injection transport layer and to dispose the mask so as to be in contact with the hole injection transport layer, or it is possible to bring the mask for vacuum ultraviolet light as close as possible to the hole injection transport layer and to dispose the mask not so as to be in contact with the hole injection transport layer. When a divider such as a bank or insulation layer is formed and a mask for vacuum ultraviolet light in which light shielding parts are formed in a pattern on a transparent substrate is used, it is possible to fix the mask so as to be in close contact with the hole injection transport layer.

(3) Method of Controlling a Pattern with Altered Wettability

When the hole injection transport layer located on the top of the divider is irradiated with energy and a mask with transparent and light shielding regions is used, by controlling at least any one of the ratio of the area of the transparent region of the mask to the area of the top of the divider and the distance between the hole injection transport layer and the mask, a liquid-repellent region can be formed so that the liquid contact angle on the hole injection transport layer side surface is higher from the side to the top of the divider.

For example, in the case of the above method of using photocatalytic action associated with energy irradiation and when the light shielding parts are formed in a pattern in the photocatalyst-containing layer substrate, a photocatalyst-containing layer substrate having a light shielding region in which a light shielding part is provided on a base and a transparent region which is a region other than the light shielding region and in which only a photocatalyst-containing layer is provided on the base, can be used. In this case, by controlling at least any one of the ratio of area S2 of the transparent region of the photocatalyst-containing layer substrate to area S1 of the top of the divider (bank 6a) and distance D between the hole injection transport layer and the photocatalyst-containing layer substrate, liquid-repellent region 12 can be formed so that the liquid contact angle on the hole injection transport layer side surface is higher from the side to the top of the divider (bank 6a).

Also, for example, in the case of the above method of applying vacuum ultraviolet light, by controlling the ratio of area S2 of the transparent region of the metal mask to area S1 of the top of the divider (bank 6a), liquid-repellent region 12 can be formed so that the liquid contact angle on the hole injection transport layer side surface is higher from the side to the top of the divider (bank 6a).

This is because of diffraction phenomenon of light and effects of solid angle. The former is such that by controlling at least any one of the ratio of the area of the transparent region of the mask to the area of the top of the divider and the distance between the hole injection transport layer and the mask, there is a gradient in the irradiance of energy applied to the hole injection transport layer due to diffraction of light, etc., and thus there is a gradient in the decomposition amount of the material contained in the hole injection transport layer. The latter is such that while the top of the divider is perpendicular to incident light, the side of the divider is at an angle to incident light and results in a small solid angle, so that the apparent irradiance of light is small and thus there is a gradient in the decomposition amount of the material contained in the hole injection transport layer. Because of this, it is possible to provide a gradient to liquid contact angle so that liquid contact angle is higher from the side to the top of the divider on the hole injection transport layer side surface.

In the case of a divider having a relatively large thickness such as a bank, the distance between the hole injection transport layer and the mask is wider from the top to the side of the divider, so that it is possible to provide a gradient to liquid contact angle depending on the distance between the hole injection transport layer and the mask.

To provide a gradient to liquid contact angle by controlling the ratio of the area of the transparent region of the mask to the area of the top of the divider, it is preferable to make the transparent region of the mask equal to or larger than the area of the top of the divider. Because of this, it is easy to provide a gradient to liquid contact angle in the region around the boundary between the top and the side of the divider.

3. Divider Forming Step

In the present invention, as needed, the device production method can further comprise the step of forming a divider between the first electrode layers formed in a pattern on the substrate (divider forming step) before the hole injection transport layer forming step.

As the divider, for example, there may be mentioned a bank and an insulation layer. As shown by bank 6a in FIGS. 2(A), 3(A) and 4(A), the divider can be a combination of one that functions as a bank and one that functions as an insulation layer. Hereinafter, the step will be explained in two parts, bank and insulation layer.

In the device of the present invention, a part in which the divider is formed is generally a non-light emitting region.

(1) Bank

In the present invention, as shown in FIGS. 2(A), 3(A) and 4(A), banks 6a can be formed in a pattern on substrate 2 on which first electrode layers 3 are formed. When the first electrode layers are formed in a pattern, bank 6a is generally formed in an opening of the pattern of first electrode layers 3.

The banks are provided to separately apply materials in a pattern and thus to form a patterned layer on the hole injection transport layer.

The material for forming the bank is not particularly limited and can be an organic material, an inorganic material, or there may be used a material which is generally used to form banks in devices such as an organic EL device.

Examples of the organic material include an ethylene-vinyl acetate copolymer, an ethylene-vinyl chloride copolymer, an ethylene-vinyl copolymer, polystyrene, an acrylonitrile-styrene copolymer, ABS resin, polymethacrylic acid resin, ethylene-methacrylic acid resin, polyvinyl chloride resin, chlorinated vinyl chloride, polyvinyl alcohol, cellulose acetate propionate, cellulose acetate butyrate, nylon 6, nylon 66, nylon 12, polyethylene terephthalate, polybutylene terephthalate, polycarbonate, polyvinyl acetal, polyether ether ketone, polyethersulfone, polyphenylene sulfide, polyarylate, polyvinyl butyral, epoxy resin, phenoxy resin, polyimide resin, polyamideimide resin, polyamic acid resin, polyetherimide resin, phenol resin and urea resin.

Examples of the inorganic material include $SiO_2$.

The height of the bank can be about 0.01 μm to 50 μm.

Figure 7A:
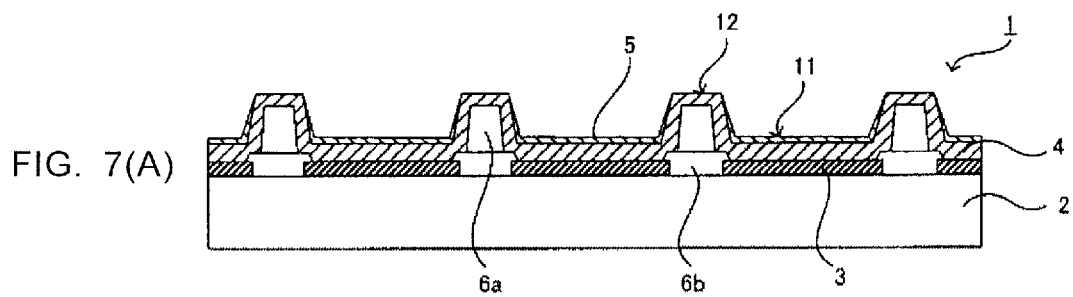
FIGS. 7(A) and 7(B) are schematic sectional views of examples of the device substrate which is a part of the device of the present invention.
Figure 7B:
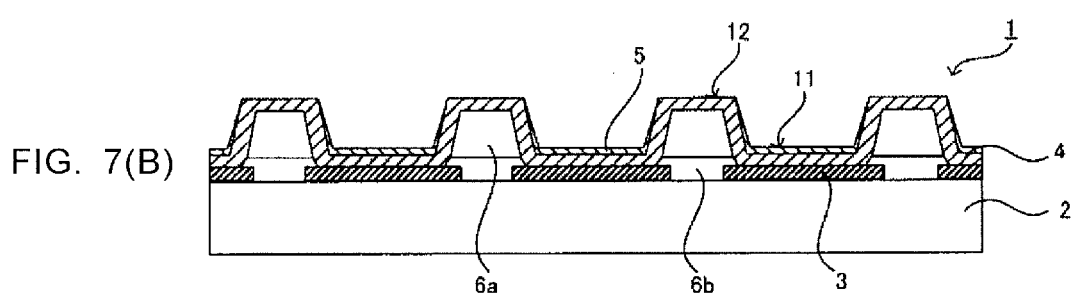

When the bank is separately formed on the insulation layer, the width of the bank can be as follows: as shown in FIG. 7(A), the width of bank 6a can be narrower than the distance between first electrode layers 3 formed in a pattern, or as shown in FIG. 7(B), the width of bank 6a can be wider than the distance between first electrode layers 3 formed in a pattern.

To form the bank, there may be used a general method such as a photolithography method or printing method.

(2) Insulation Layer

In the present invention, as shown in FIGS. 7(A) and 7(B), insulation layers 6b can be formed in a pattern on substrate 2 on which first electrode layers 3 are formed. When the first electrode layers are formed in a pattern, insulation layer 6b is generally formed in an opening of the pattern of first electrode layers 3 so as to cover the edges of first electrode layers 3 formed in a pattern. In FIGS. 7(A) and 7(B), bank 6a is formed on insulation layer 6b; however, it is also possible to employ an embodiment in which only insulation layers 6b are formed and banks 6a are not formed.

The insulation layers are provided to prevent conduction between the adjacent first electrode layers formed in a pattern and to prevent conduction between the first electrode layers and the second electrode layer.

The material for forming the insulation layers is not particularly limited as long as it has an insulation property, and it may be an organic material, an inorganic material, or there may be used a material which is generally used to form insulation layers in devices such as an organic EL device.

To form the insulation layers, there may be used a general method such as a photolithography method or printing method.

The thickness of the insulation layers can be about 10 nm to 50 μm.

4. Other Steps

As for other steps in the device production method, conventionally known steps can be appropriately used depending on a desired device.

The second electrode layer of the present invention, which is an essential component, can be formed by appropriately using a conventionally-known material and by a conventionally-known step, depending on a desired device. In the device of the present invention, the second electrode layer is preferably formed with a metal or metal oxide, and it can be generally formed with a metal such as aluminum, gold, silver, nickel, palladium or platinum, or a metal oxide such as an oxide of indium and/or tin.

In general, electrodes are often formed on a substrate by a method such as a sputtering method or vacuum vapor-deposition method; however, they can be formed by a wet method such as a coating method or dipping method. The thickness of electrodes varies depending on transparency and so on required for each electrode. When there is a need for transparency, the transmittance of light in the visible wavelength range of electrodes is generally 60% or more, preferably 80% or more, and the thickness in this case is generally 10 to 1,000 nm, preferably 20 to 500 nm.

IV. Device

The first embodiment of the device of the present invention is a device comprising two or more electrodes facing each other on a substrate and a hole injection transport layer disposed between two of the electrodes, wherein the hole injection transport layer comprises the device material for a hole injection transport layer of the present invention, and the fluorine-containing organic compound of the device material in the surface part of the hole injection transport layer is decomposed and removed.

The second embodiment of the device of the present invention is a device comprising two or more electrodes facing each other on a substrate and a hole injection transport layer disposed between two of the electrodes, wherein the device has a divider between the first electrode layers formed in a pattern on the substrate, and the device has the continuous hole injection transport layer on the first electrode layers in an opening of the divider and on the divider, and wherein, in the hole injection transport layer on the first electrode layers in the opening of the divider and on the side of the divider, at least part of the fluorine-containing organic compound of the device material for a hole injection transport layer of the present invention is decomposed and removed, and the hole injection transport layer on the top of the divider contains the device material for a hole injection transport layer of the present invention.

In any of the embodiments, the device of the present invention can be obtained by the above device production method of the present invention.

Hereinafter, the layer structure of the device of the present invention will be explained in reference to figures.

Figure 8:
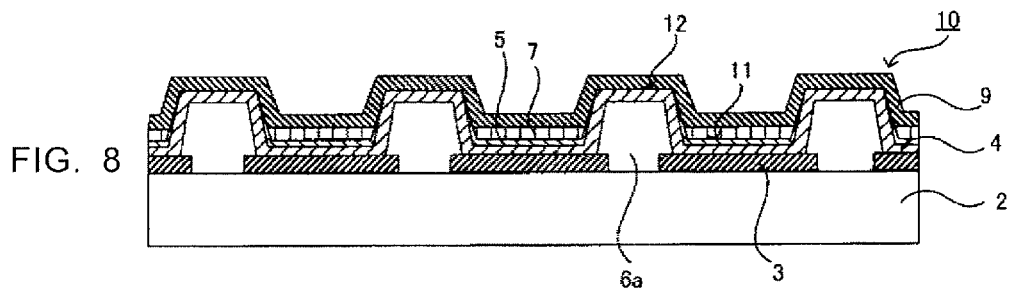
FIG. 8 is a schematic sectional view of an example of the device of the present invention.

FIG. 8 is a schematic sectional view of a basic layer structure of the device of the first embodiment of the present invention. The basic layer structure of device 10 of the present invention is such that the structure comprises two electrodes (3 and 9) facing each other on substrate 2 and hole injection transport layer 4 disposed between the two electrodes (3 and 9), and hole injection transport layer 4 comprises the device material for a hole injection transport layer of the present invention and includes fluorine-decomposed part 5 in which the fluorine-containing organic compound of the device material in the surface part of the hole injection transport layer is decomposed and removed. A pattern comprising lyophilic region 11 and liquid-repellent region 12 is formed, the lyophilic region being in the surface part of hole injection transport layer 4 which is present on first electrode layer 3 and on the side of divider 6a, while the liquid-repellent region being on the top of divider 6a. Device layer 7 is formed on lyophilic region 11 of hole injection transport layer 4, the device layer comprising a layer which is central to the function of the device (hereinafter referred to as functional layer)

and a layer which plays a supporting role for the functional layer (hereinafter referred to as supporting layer).

Substrate 7 is a base for forming layers which constitute the device. It is not necessarily needed to be provided on a surface of electrode 1 and is just needed to be provided on an outermost surface of the device.

Hole injection transport layer 4 comprises at least the device material for a hole injection transport layer of the present invention and is a layer which is responsible for injection and/or transport of a hole from electrode 3 to device layer V.

Device layer 7 is a layer which, depending on the device type, fulfills various functions by hole injection transportation and is composed of a single layer or multiple layers. When device layer 7 is composed of multiple layers, the layers include the functional layer and supporting layer. For example, in the case of organic EL devices, the hole transport layer which is further stacked on the hole injection transport layer corresponds to the supporting layer. The light emitting layer stacked on the hole transport layer corresponds to the functional layer.

Second electrode layer 9 is at least provided in the area where hole injection transport layer 4 and device layer 7 are present between electrodes 1 which face each other. As needed, the device can have a third electrode (not shown). The device can function by applying an electric field between these electrodes.

FIG. 9 is a schematic sectional view of the basic layer structure of the device of the first embodiment of the present invention. The basic layer structure of the device of the present invention is such that the device has divider 6a between first electrode layers 3 formed in a pattern on substrate 2, and the device has a continuous hole injection transport layer (4 and 5) on first electrode layers 3 in an opening of divider 6a and on divider 6a; moreover, in hole injection transport layer 4 on first electrode layers 3 in the opening of divider 6a and on the side of divider 6a, at least part of the fluorine-containing organic compound of the device material for a hole injection transport layer of the present invention is decomposed and removed to form fluorine-decomposed part 5 of the hole injection transport layer, and hole injection transport layer 4 on the top of the divider contains the device material for a hole injection transport layer of the present invention, while no fluorine is decomposed therein. FIG. 9 shows that in hole injection transport layer 4 on first electrode layers 3 in the opening of divider 6a and on the side of divider 6a, all the fluorine-containing organic compound of the device material for a hole injection transport layer of the present invention is decomposed and removed to be fluorine-decomposed part 5 of the hole injection transport layer.

A pattern comprising lyophilic region 11 and liquid-repellent region 12 is formed therefore, the lyophilic region being fluorine-decomposed part 5 of the hole injection transport layer which is present on first electrode layer 3 and on the side of divider 6a, while the liquid-repellent region being on the top of divider 6a. Device layer 7 is formed on lyophilic region 11 of hole injection transport layer 4. In addition, second electrode layer 9 is formed so as to have hole injection transport layer 4 disposed between two electrodes (3 and 9) facing each other on substrate 2.

The continuous hole injection transport layer (4 and 5) on first electrode layers 3 in the opening of divider 6a and on divider 6a has no interface which is provided in the hole injection transport layer as a separate layer. Fluorine-decomposed parts 5 of the hole injection transport layer are contained in a pattern in the hole injection transport layer as the parts in which at least part of the fluorine-containing organic compound of the device material is decomposed and removed among the same materials as those of hole injection transport layer 4.

In the device of the present invention, as described above, device layer 7 is formed on fluorine-decomposed part 5 (lyophilic region 11) of the hole injection transport layer. The device material for a hole injection transport layer of the present invention, which is contained in fluorine-decomposed part 5 of the hole injection transport layer, is oxidized through a treatment such as a photocatalytic treatment for decomposing fluorine, resulting in an increase in ionization potential, so that there is an increase in hole injecting property. In the device of the present invention, the device layer is formed on the hole injection transport layer with such an increased hole injecting property, so that while the production process is easy, the device has an excellent hole injecting transporting property and can achieve a long life.

The layer structure of the device of the present invention is not limited to the above examples. Any that has the substantially same essential features as the technical ideas described in claims of the present invention and exerts the same effects and advantages is included in the technical scope of the present invention.

In the device of the present invention, the first electrode layer, the second electrode layer, the hole injection transport layer and the device material for a hole injection transport layer, which is used for the hole injection transport layer, may be the same as those explained above under "I. Device material for a hole injection transport layer," "II. Ink for forming a hole injection transport layer" and "III. Device production method." Moreover, the device layers contained in the device (the functional layer and supporting layer) will be explained in detail in the below-described specific examples of the device.

Herein, the hole injection transport layer will be further complemented.

<Hole Injection Transport Layer>

The hole injection transport layer of the device of the present invention comprises at least the device material for a hole injection transport layer of the present invention. The hole injection transport layer can comprise the device material for a hole injection transport layer only, or other component can be further contained therein.

As such other component, a hole transporting compound other than the device material for a hole injection transport layer of the present invention can be appropriately used as long as the effects of the present invention are not deteriorated and the hole transporting compound is a compound with a hole transporting property. "Hole transporting property" means that overcurrent due to hole transport is observed by a commonly-known photocurrent method.

As the hole transporting compound, a high-molecular compound is suitably used, in addition to a low-molecular compound. The hole transporting high-molecular compound is a high-molecular compound which has a hole transporting property and a weight average molecular weight of 2,000 or more which is a polystyrene-equivalent value obtained by gel permeation chromatography. In the hole injection transport layer of the present invention, in order to form a stable film by a solution coating method, a high-molecular compound which is readily dissolved in organic solvents and is unlikely to be aggregated is preferably used as a hole transporting material.

The hole transporting compound is not particularly limited and the examples include an arylamine derivative, an anthracene derivative, a carbazole derivative, a thiophene derivative, a fluorene derivative, a distyrylbenzene derivative and a spiro compound. Specific examples of the arylamine derivative include N,N'-bis-(3-methylphenyl)-N,N'-bis-(phenyl)-benzidine (TPD), bis(N-(1-naphthyl-N-phenyl)benzidine) (α-NPD), 4,4',4"-tris(3-methylphenylphenylamino) triphenylamine (MTDATA), 4,4',4"-tris(N-(2-naphthyl)-N-phenylamino)triphenylamine (2-TNATA). Specific examples of the carbazole derivative include 4,4-N,N'-dicarbazole-biphenyl (CBP). Specific example of the fluorene derivative include N,N'-bis(3-methylphenyl)-N,N'-bis(phenyl)-9,9-dimethylfluorene (DMFL-TPD). Specific examples of the distyrylbenzene derivative include 4-(di-p-tolylamino)-4'-[(di-p-tolylamino)styryl]stilbene (DPAVB). Specific examples of the spiro compound include 2,7-bis(N-naphthalene-1-yl-N-phenylamino)-9,9-spirobifluorene (Spiro-NPB) and 2,2',7,7'-tetrakis(N,N-diphenylamino)-9,9'-spirobifluorene (Spiro-TAD).

As the hole transporting high-molecular compound, for example, there may be used polyaniline, polythiophene, poly phenylenevinylene derivatives, etc. Electroconductive polymers such as polyaniline, polythiophene and poly phenylenevinylene derivatives can be doped with acid. Furthermore, there may be mentioned polymers which contain an arylamine derivative, an anthracene derivative, a carbazole derivative, a thiophene derivative, a fluorene derivative, a distyrylbenzene derivative, a spiro compound or the like in the repeating unit.

When a hole transporting compound other than the device material for a hole injection transport layer of the present invention is used for the hole injection transport layer of the present invention, the content of the hole transporting compound is preferably 10 to 10,000 parts by weight with respect to 100 parts by weight of the device material for a hole injection transport layer of the present invention, from the viewpoint of increasing the hole injecting transporting property, obtaining high film stability and achieving a long life.

The hole injection transport layer of the present invention can contain an additive such as a binder resin, curable resin and coatability improving agent as long as the effects of the present invention are not deteriorated. Examples of the binder resin include polycarbonate, polystyrene, polyarylate and polyester. A binder resin which can be cured by heat, light or the like can be contained. As the material which can be cured by heat, light or the like, there may be used the hole transporting compound in which a curable functional group is introduced in the molecule, a curable resin, etc. More specifically, examples of the curable functional group include acrylic functional groups such as an acryloyl group and a methacryloyl group, a vinylene group, an epoxy group and an isocyanate group. The curable resin can be a thermosetting or photocurable resin, and the examples include epoxy resin, phenol resin, melamine resin, polyester resin, polyurethane resin, silicon resin, silane coupling agents, etc.

<Organic EL Device>

An embodiment of the device of the present invention is an organic EL device comprising an organic layer which comprises at least the hole injection transport layer of the present invention and a light emitting layer.

Hereinafter, layers constituting the organic EL device will be explained in order in reference to FIG. 10.

FIG. 10 is a schematic sectional view of an example of the organic EL device of the present invention. Organic EL device 31 shown in FIG. 10 is such that first electrode layers 3 are formed in a pattern on substrate 2; bank 6a is formed in an opening of the pattern of first electrode layers 3; hole injection transport layer 4 is formed on first electrode layers 3 and banks 6a; the fluorine-containing organic compound of the device material for a hole injection transport layer in the surface part of hole injection transport layer 4 is decomposed and removed to form fluorine-removed layer 5; a pattern comprising lyophilic region 11 and liquid-repellent region 12 is formed, the lyophilic region being on fluorine-removed layer 5, while the liquid-repellent region being on the top of bank 6a; and organic EL device 31 has light emitting layer 32 formed on lyophilic region 11, electron injection transport layer 33 formed on light emitting layer 32, and second electrode layer 34 formed on electron injection transport layer 33.

In addition, a hole transport layer (not shown in FIG. 10) can be formed between lyophilic region 11 of the hole injection transport layer and light emitting layer 32.

In FIG. 10, first electrode layer 3 functions as the anode, while second electrode layer 34 functions as the cathode. In the organic EL device, when an electric field is applied between the anode and cathode, a hole is injected into light emitting layer 32 from the anode through hole injection transport layer 4; moreover, by injecting an electron from the cathode into the light emitting layer, the injected hole and electrode are recombined inside light emitting layer 5, thereby having a function to emit light to the outside of the device.

To emit light to the outside of the device, all the layers present on at least one surface of the light emitting layer is needed to transmit light of at least some of wavelengths in the visible region. As needed, electron injection transport layer 33 is provided between the light emitting layer and electrode 6 (the cathode).

Hereinafter, the layers of the organic EL device of the present will be described in detail each.

As the substrate and electrode layers, there may be used those mentioned above in the explanation of the device.

(Hole Injection Transport Layer, Hole Transport Layer and Hole Injection Layer)

In addition to the hole injection transport layer comprising the device material for a hole injection transport layer of the present invention or a decomposed product thereof, which is an essential component of the device of the present invention, a hole injection transport layer, a hole transport layer and a hole injection layer can be further formed between the light emitting layer and the first electrode layer. A hole transport layer can be further stacked on the hole injection transport layer comprising the device material for a hole injection transport layer of the present invention or a decomposed product thereof, and a light emitting layer can be stacked thereon. Or, the hole injection transport layer comprising the device material for a hole injection transport layer of the present invention or a decomposed product thereof can be further stacked on a hole injection layer, and a light emitting layer can be stacked thereon.

No particular limitation is imposed on the hole transporting compound which is used for the hole transport layer when the hole transport layer is further stacked on the hole injection transport layer of the present invention which is an essential component of the present invention. A hole injecting transporting compound as mentioned above in the supplementary explanation of the hole injection transport layer can be appropriately selected and used. When a hole injecting transporting compound which is different from the device material for a hole injection transport layer of the present invention and a decomposed product thereof, is further contained in the hole injection transport layer which is an essential component of the present invention, it is preferable to use the same compound for the adjacent hole transport layer as the hole transporting compound contained in the hole injection transport layer which is an essential component of the present invention, from the viewpoint of increasing the stability of adhesion between the hole injection transport layer which is an essential component of the present invention and the hole transport layer, and contributing to a long life.

The hole transport layer can be formed by using a hole injecting transporting compound and a method which is the same as that of the below-described light emitting layer. The thickness of the hole transport layer is generally 0.1 to 1 µm, preferably 1 to 500 nm.

No particular limitation is imposed on the hole injection material which is used for the hole injection layer when the hole injection transport layer which is an essential component of the present invention is further stacked on the hole injection layer. As the hole injection material, a conventionally-known compound can be used. The examples include oxides of the phenylamine series, starburst-type amine series, phthalocyanine series, oxides such as a vanadium oxide, a molybdenum oxide, a ruthenium oxide and an aluminum oxide, amorphous carbon, poly aniline and poly thiophene derivatives.

The hole injection layer can be formed by using a hole injection material and a method which is the same as that of the below-described light emitting layer. The thickness of the hole injection layer is generally 1 nm to 1 µm, preferably 2 nm to 500 nm, more preferably 5 nm to 200 nm.

Considering hole injection performance, it is preferable to minimize a hole injection energy barrier at each interface as much as possible by selecting a hole injecting material and hole transporting material so that the work function of each layer gradually increases from the first electrode layer side to light emitting layer 5, thereby supplementing a large hole injection energy barrier between the first electrode layer and the light emitting layer.

(Light Emitting Layer)

As shown in FIG. 10, light emitting layer 32 is formed on lyophilic region 11 which is on the hole injection transport layer and between substrate 2 on which first electrode layers 3 are formed and second electrode layer 34.

The material used for the light emitting layer of the present invention is not particularly limited as long as it is a material which is generally used as a light emitting material. Any of a light emitting material and a phosphorescent material can be used. More specifically, there may be mentioned materials such as dye-based light emitting materials and metal complex-based light emitting materials. Also, there may be used any of a low-molecular compound and a high-molecular compound.

[Specific Examples of Dye-based Light Emitting Materials]

The dye-based light emitting materials include an arylamine derivative, an anthracene derivative (phenylanthracene derivative), an oxadiazole derivative, an oxazole derivative, an oligothiophene derivative, a carbazole derivative, a cyclopentadiene derivative, a silole derivative, a distyrylbenzene derivative, a distyrylpyrazine derivative, a distyrylarylene derivative, a silole derivative, a stilbene derivative, a spiro compound, a thiophene ring compound, a tetraphenylbutadiene derivative, a triazole derivative, a triphenylamine derivative, a trifumanylamine derivative, a pyrazoloquinoline derivative, a hydrazone derivative, a pyrazoline dimer, a pyridine ring compound, a fluorene derivative, phenanthrolines, a perynon derivative and a perylene derivative, for example. Usable examples also include dimers, trimers and oligomers thereof and compounds each obtained from two or more of the derivatives.

These materials can be used solely or in combination of two or more kinds.

[Specific Examples of Metal Complex-based Light Emitting Materials]

The metal complex-based light emitting materials include, for example, an almiquinolinol complex, a benzoquinolinol beryllium complex, a benzoxazole zinc complex, a benzothiazole zinc complex, an azomethyl zinc complex, a porphyrin zinc complex, an europium complex and a metal complex comprising Al, Zn, Be or the like or a rare-earth metal such as Tb, Eu or Dy as the central metal, and an oxadiazole structure, thiadiazole structure, phenylpyridine structure, phenylbenzimidazole structure, quinoline structure or the like as a ligand.

These materials can be used solely or in combination of two or more kinds.

[Specific Examples of High-molecular Light Emitting Materials]

As the high-molecular light emitting material, there may be used one in which a low-molecular material is introduced in the molecule as a straight or side chain or a functional group, a polymer, a dendrimer, etc.

Examples of the high-molecular light emitting material include a poly p-phenylenevinylene derivative, a poly thiophene derivative, a poly p-phenylene derivative, a polysilane derivative, a polyacetylene derivative, a polyvinylcarbazole derivative, a polyfluorenone derivative, a polyfluorene derivative, a polyquinoxaline derivative, and copolymers thereof.

[Specific Examples of Dopants]

A doping material can be added to the light emitting layer in order to increase light emitting efficiency, change light emitting wavelength, etc. In the case of forming the light emitting layer with a high-molecular material, the molecular structure of the high-molecular material can contain a doping material as a light emitting group. Examples of such a doping material include a perylene derivative, a coumarin derivative, a rubrene derivative, a quinacridone derivative, a squarylium derivative, a porphyrin derivative, a styryl dye, a tetracene derivative, a pyrazoline derivative, decacyclene, phenoxazone, a quinoxaline derivative, a carbazole derivative and a fluorene derivative. Compounds obtained by introducing a spiro group in the derivatives are also usable.

These materials can be used solely or in combination of two or more kinds.

In the present invention, as the material for the light emitting layer, there may be used any of a fluorescent, low- or high-molecular compound and a phosphorescent, low- or high-molecular compound. In the present invention, when a base layer on which the light emitting layer will be formed is the hole injection transport layer, the hole injection transport layer forms a charge transfer complex and is thus likely to be insoluble in a non-aqueous solvent used in the solution coating method, such as xylene. Therefore, as the material for the light emitting layer, it is possible to use a high-molecular material which is soluble in non-aqueous solvents such as xylene and forms a layer by a solution coating method. In this case, there may be suitably used a fluorescent high-molecular compound or a high-molecular compound comprising a fluorescent low-molecular compound, or a phosphorescent high-molecular compound or a high-molecular compound comprising a phosphorescent low-molecular compound.

The light emitting layer can be formed by a solution coating method using a light emitting material, utilizing a pattern with altered wettability on a surface of the hole injection transport layer. The solution coating method can be the same method as explained above under "III. Device production method." When other layer such as a hole transport layer is formed by using a pattern with altered wettability on a surface of the hole injection transport layer, the light emitting layer can be formed by an vapor-deposition method or transfer method. When the vapor-deposition method is for example a vacuum vapor-deposition method, a material for the light emitting layer is put in a crucible which is disposed inside a vacuum vessel; the air inside the vessel is evacuated with an appropriate vacuum pump to about $10^{-4}$ Pa; then, the crucible is heated to vapor-deposit the material for the light emitting layer, thereby forming a light emitting layer on a laminate which is placed to face the crucible, the laminate comprising a substrate, a first electrode layer, a hole injection transport layer and a hole transport layer. In the transfer method, the light emitting layer is formed as follows: for example, a light emitting layer formed previously on a film by a solution coating method or vapor-deposition method, is attached to a hole injection transport layer provided on a first electrode layer; thereafter, the light emitting layer is transferred onto the hole injection transport layer.

The thickness of the light emitting layer is generally 1 to 500 nm, preferably about 20 to 1,000 nm. In the present invention, the hole injection transport layer is preferably formed by a solution coating method, and the light emitting layer can be also formed by the solution coating method utilizing the pattern with altered wettability on a surface of the hole injection transport layer. In this case, therefore, the present invention is advantageous in that a reduction in process cost can be achieved.

As to other organic devices including a dye-sensitized solar cell, an organic thin-film solar cell, an organic semiconductor, an organic transistor and the like, a quantum-dot light emitting device and an oxide-based compound solar cell comprising a hole injection transport layer, etc., as long as the hole injection transport layer thereof is the hole injection transport layer of the present invention, other structural components are not particularly limited and may be appropriately the same as conventionally-known structural components.

EXAMPLES

The present invention will be explained in more detail by way of examples. The scope of the present invention is not limited to the examples. Hereinafter, all designations of "part" or "parts" are part or parts by weight unless otherwise specifically indicated. The thickness of a layer or film is expressed in the average layer or film thickness.

In each of the following Synthesis Examples 1 to 4, transition metal-containing nanoparticles or nanoclusters were obtained, which are the device material for a hole injection transport layer of the present invention and to which surface a fluorine-containing organic compound is attached.

Synthesis Example 1

Molybdenum-containing nanoparticles protected by 4,4,5,5,6,6,7,7,8,8,9,9,10,10,11,11,11-heptadecafluoroundecylamine were synthesized in the following manner. First, 3.2 g of n-octyl ether (manufactured by Tokyo Chemical Industry Co., Ltd.) was weighed out and put into a 25 ml three-necked flask. The pressure inside the flask was reduced while stirring, and the flask was left for 1.5 hours at room temperature (24° C.) for removal of low volatility components. After switching from vacuum to air atmosphere, 0.2 g of molybdenum hexacarbonyl (manufactured by Kanto Chemical Co., Inc.) and 0.4 g of 4,4,5,5,6,6,7,7,8,8,9,9,10,10,11,11,11-heptadecafluoroundecylamine (manufactured by Fluka Chemical Corp.) were added thereto. The mixed solution was heated to 250° C. while stirring in an argon gas atmosphere, and kept at the temperature for one hour. Then, the mixed solution was cooled to room temperature (24° C.). After switching from the argon gas atmosphere to the air atmosphere, 5 g of ethanol was added to the mixed solution. The thus-produced precipitate was separated from the reaction solution by centrifugal separation. Then, the thus-obtained precipitate was washed with chloroform and ethanol, followed by drying, thereby obtaining a purified substance which is composed of molybdenum-containing black nanoparticles.

Synthesis Example 2

Molybdenum-containing nanoparticles protected by 4-(3,3,4,4,5,5,6,6,7,7,8,8,9,9,10,10,10-heptadecafluorodecyl)benzylamine were synthesized in the following manner. First, 6.4 g of n-octyl ether (manufactured by Tokyo Chemical Industry Co., Ltd.) was weighed out and put into a 25 ml three-necked flask. The pressure inside the flask was reduced while stirring, and the flask was left for 2.5 hours at room temperature (24° C.) for removal of low volatility components. After switching from vacuum to air atmosphere, 0.4 g of molybdenumhexacarbonyl (manufactured by Kanto Chemical Co., Inc.) and 0.9 g of 4-(3,3,4,4,5,5,6,6,7,7,8,8,9,9,10,10,10-heptadecafluorodecyl)benzylamine (manufactured by Sigma-Aldrich Corporation) were added thereto. The mixed solution was heated to 250° C. while stirring in an argon gas atmosphere, and kept at the temperature for one hour. Then, the mixed solution was cooled to room temperature (24° C.). After switching from the argon gas atmosphere to the air atmosphere, 10 g of ethanol was added to the mixed solution. The thus-produced precipitate was separated from the reaction solution by centrifugal separation. Then, the thus-obtained precipitate was washed with chloroform and ethanol, followed by drying, thereby obtaining a purified substance which is composed of molybdenum-containing black nanoparticles.

Synthesis Example 3

Tungsten-containing nanoparticles protected by 4,4,5,5,6,6,7,7,8,8,9,9,10,10,11,11,11-heptadecafluoroundecylamine were synthesized in the following manner. First, 6.4 g of n-octyl ether (manufactured by Tokyo Chemical Industry Co., Ltd.) was weighed out and put into a 25 ml three-necked flask. The pressure inside the flask was reduced while stirring, and the flask was left for 3 hours at room temperature (24° C.) for removal of low volatility components. After switching from vacuum to air atmosphere, 0.4 g of tungstenhexacarbonyl (manufactured by Sigma-Aldrich Corporation) and 0.8 g of 4,4,5,5,6,6,7,7,8,8,9,9,10,10,11,11,11-heptadecafluoroundecylamine (manufactured by Fluka Chemical Corp.) were added thereto. The mixed solution was heated to 250° C. while stirring in an argon gas atmosphere, and kept at the temperature for one hour. Then, the mixed solution was cooled to room temperature (24° C.). After switching from the argon gas atmosphere to the air atmosphere, 10 g of ethanol was added to the mixed solution. The thus-produced precipitate was separated from the reaction solution by centrifugal separation. Then, the thus-obtained precipitate was washed with chloroform and ethanol, followed by drying, thereby obtaining a purified substance which is composed of tungsten-containing brown nanoparticles.

Synthesis Example 4

Synthesis method of {Mo154 cluster}$Na_{15}[Mo^{VI}_{126}Mo^{V}_{28}O_{462}H_{14}(H_2O)_{70}]_{0.5}[Mo^{VI}_{124}Mo^{V}_{28}O_{457}H_{14}(H_2O)_{68}]_{0.5} \cdot 40\ 0H_2O$ cluster A magnetic stir bar was put into a 100 mL recovery flask. Sodium molybdate (VI) dihydrate (3.04 g), distilled water (25 mL) and 35% hydrochloric acid (2.47 mL) were put into the flask. Then, sodium dithionite (0.15 g) was added thereto, and the mixture was stirred at room temperature for 24 hours. Then, the mixture was left for 5 days, and the thus-precipitated perse solid was obtained by filtration and washed with cold water. The thus-obtained oily perse substance was transferred into a sample bottle and dried in a desiccator, thereby obtaining a water-soluble, perse solid (1.46 g) which is composed of molybdenum oxide clusters (hereinafter simply referred to as "Mo clusters"). It was confirmed by Fourier transform infrared spectroscopy (FT-IR method) and Raman spectroscopy that Mo clusters synthesis succeeded. In the FT-IR method, an FT-IR apparatus manufactured by Varian Technologies Japan Ltd. (FTS6000) was used and measured by KBr method. The type, bonding state (atomic group; partial structure) and amount of the elements each constituting the molybdenum oxide clusters, were analyzed by measuring intensity distribution at each wavelength in the FT-IR method. As a result, absorption was observed at the following wave numbers (vcm$^{-1}$): 1617, 974, 912, 820, 747, 632 and 557. The wave numbers at which absorption was observed correspond to the absorption wave numbers which are characteristic of the water-soluble Mo154 clusters described in non-patent literature 1 ("Synthetic Metals", (1997), vol. 85, pp. 1229-1232).

For the Raman spectroscopy, a laser Raman spectrometer manufactured by HORIBA, Ltd. (LabRAM HR-800L) was used. Measurement was performed by using 514 nm laser and in the condition of 1,800 gratings and a cumulated number of 10 times.

As a result, absorption was observed at the following wave numbers and it was confirmed that molybdenum was bound to oxygen: resonance Raman bands (solid; λe=514 nm): ν (cm$^{-1}$)=997, 824, 666, 465, 379, 339, 290, 242, 216, 199, 154, 129, 119.

To measure the average particle diameter of Mo clusters 1 thus synthesized, 0.4% by weight of Mo clusters 1 (Mo154) was dissolved in distilled water and dissolved for one hour by sonication, ten minutes in an ice bath at 80° C., and then another one hour by sonication. The resulting solution was filtered with 0.2 μm filter and measured.

At the measured intensity L.I. 0.045, the mean number diameter (MN) was 4 nm. Mo 154 is said to be in a doughnut shape and have a diameter of about 4 nm, so that it is in excellent agreement with the measurement result of mean number diameter of 4 nm.

Triethyl(1H,1H,2H,2H-tridecafluoro-n-octyl) ammonium iodide salt was adsorbed onto the above-synthesized Mo 154 cluster by a cation exchange method. A 0.5 wt % Mo154 cluster aqueous solution (navy blue) was mixed with a 0.5 wt % cyclohexanone solution of triethyl (1H,1H,2H,2H-tridecafluoro-n-octyl)ammonium iodide salt (light yellow). The mixed solution was heated at 60° C. for one hour; therefore, a slight amount of navy-blue component was extracted in the cyclohexanone solution. Only the cyclohexanone solution component was removed from the mixed solution, thereby obtaining an ink of Synthesis Example 4, which is the ink for forming a hole injection transport layer.

Synthesis Example 5

(1) Synthesis of Fluorine-containing Organic Compound F-1

Figure 13:
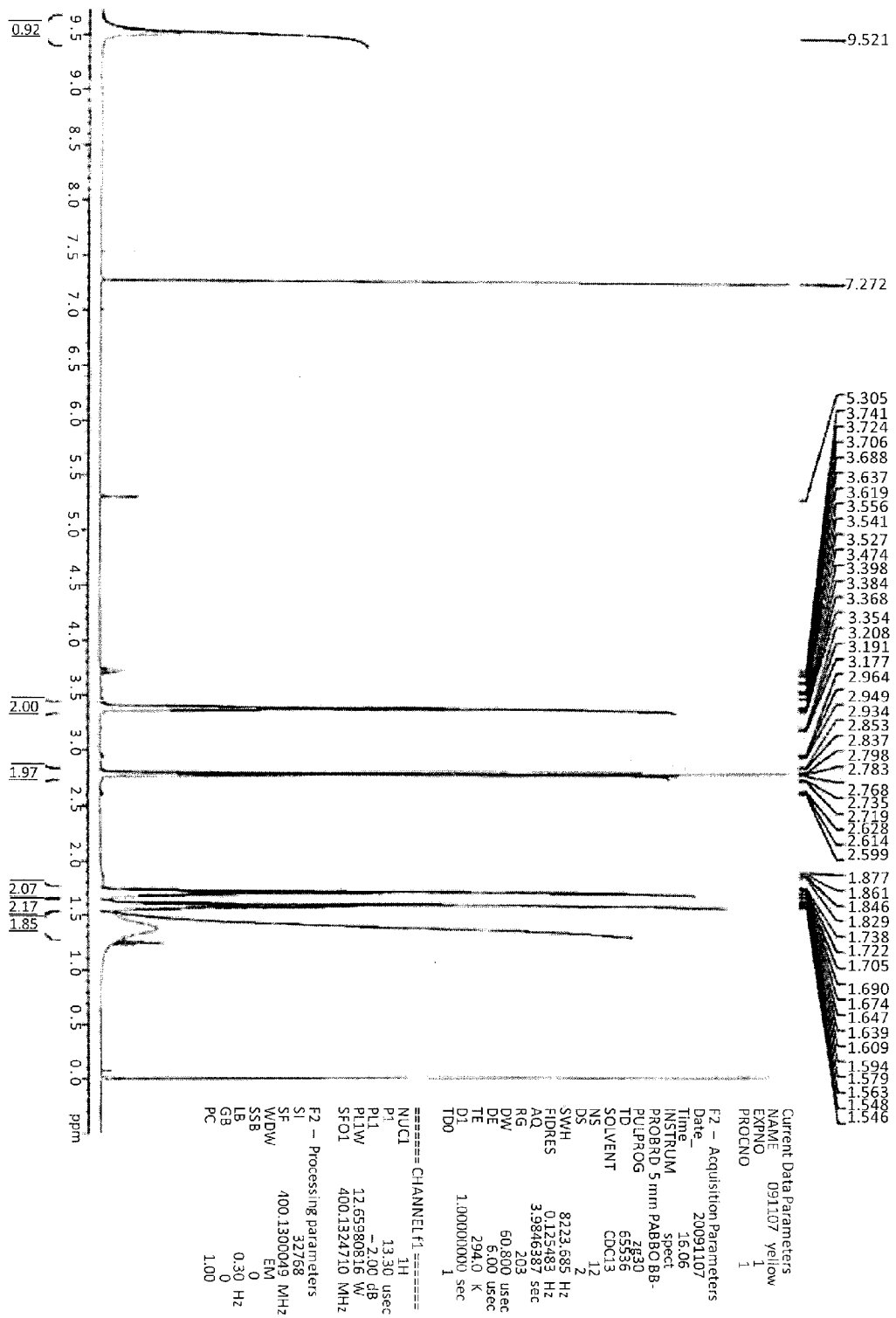
FIG. 13 is a 1H NMR spectrum of fluorine-containing organic compound F-1 obtained in synthesis example 5.

A condensation reaction of 2,2,3,3,4,4,5,5,6,6,7,7,7-tridecafluoroheptanoic acid (manufactured by Sigma-Aldrich Corporation) with 1,4-diaminobutane (manufactured by Tokyo Chemical Industry Co., Ltd.) was performed in a dichloromethane solvent using N,N'-dicyclohexylcarbodiimide (manufactured by Tokyo Chemical Industry Co., Ltd.), thereby synthesizing fluorine-containing organic compound F-1. The structure of the thus-obtained fluorine-containing organic compound was identified by 1H NMR (α-400 manufactured by JEOL Ltd.) and mass spectrometry (JMS600 manufactured by JEOL Ltd.) It was confirmed by mass spectrometry that the molecular weight of the thus-obtained compound F-1 was 434, and it was also confirmed by 1H NMR that a compound having the following structural formula was synthesized. The thus-obtained NMR spectrum is shown in FIG. 13.

[Chemical formula 5]

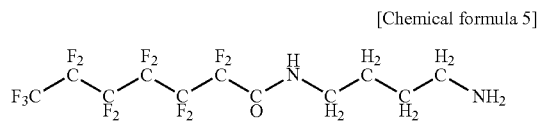

(2) Synthesis of Molybdenum-containing Nanoparticles Protected by Fluorine-Containing Organic Compound F-1

First, 6.4 g of n-octyl ether (manufactured by Tokyo Chemical Industry Co., Ltd.) was weighed out and put into a 100 ml three-necked flask. The pressure inside the flask was reduced while stirring, and the flask was left for 1.5 hours at room temperature (24° C.) for removal of low volatility components. After switching from vacuum to air atmosphere, 0.2 g of molybdenumhexacarbonyl (manufactured by Kanto Chemical Co., Inc.) and 0.7 g of fluorine-containing organic compound F-1 were added thereto. The mixed solution was heated to 220° C. while stirring in an argon gas atmosphere, and kept at the temperature for 30 minutes. Then, the mixed solution was cooled to room temperature (24° C.). After switching from the argon gas atmosphere to the air atmosphere, 5 g of ethanol was added to the mixed solution. The thus-produced precipitate was separated from the reaction solution by centrifugal separation. Then, the thus-obtained precipitate was washed with chloroform and ethanol, followed by drying, thereby obtaining a purified substance which is composed of molybdenum-containing black nanoparticles.

Synthesis Example 6

(1) Synthesis of Fluorine-containing Organic Compound F-2

Figure 14:
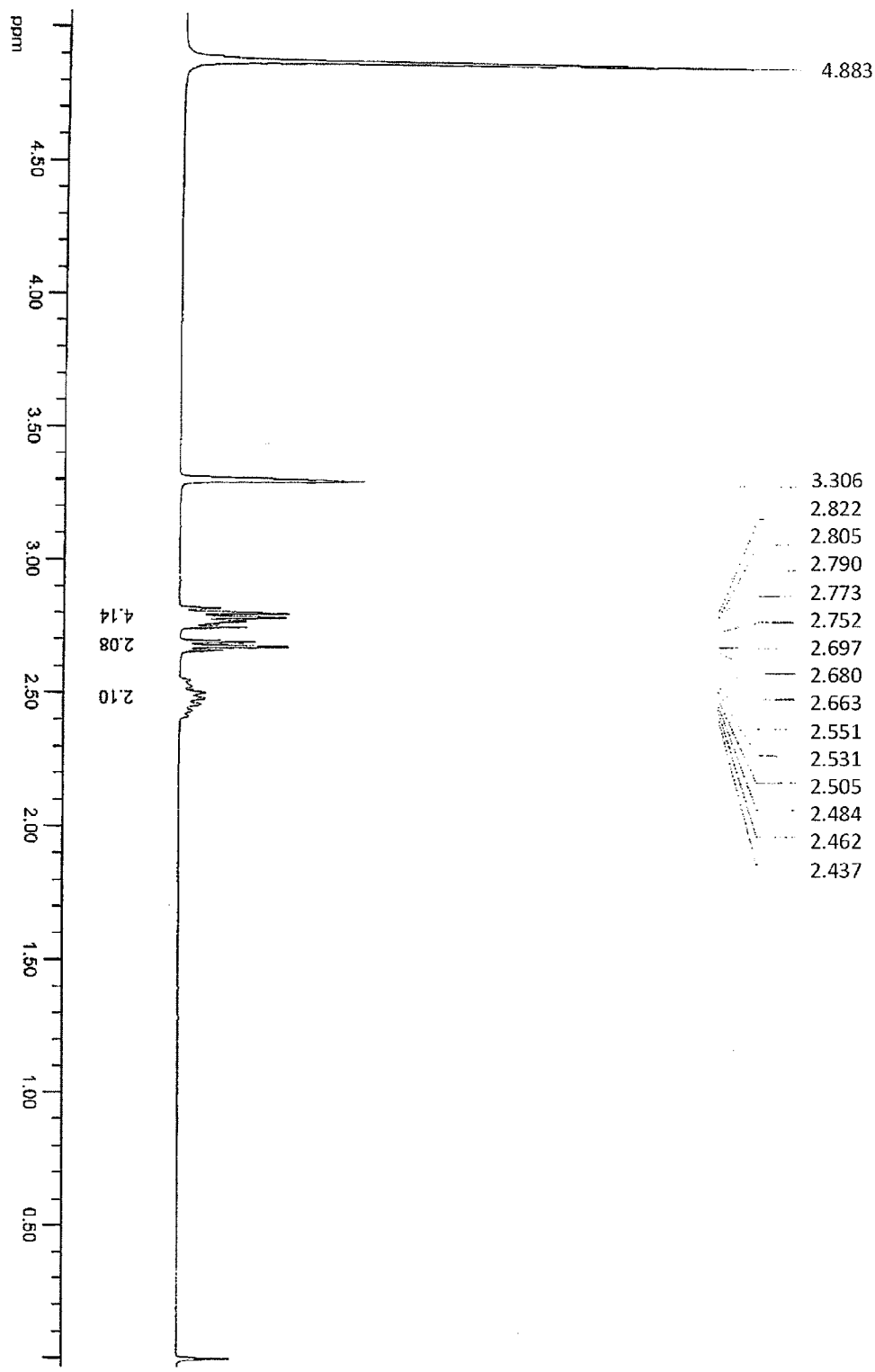
FIG. 14 is a 1H NMR spectrum of fluorine-containing organic compound F-2 obtained in synthesis example 6.

A condensation reaction of 1H,1H,2H,2H-tridecafluoro-n-octyl iodide (manufactured by Tokyo Chemical Industry Co., Ltd.) with 2-aminoethanethiol (manufactured by Tokyo Chemical Industry Co., Ltd.) was performed in chloroform in the presence of triethylamine, thereby synthesizing fluorine-containing organic compound F-2. It was confirmed by mass spectrometry that the molecular weight of the thus-obtained compound F-2 was 423, and it was also confirmed by 1H NMR that a compound having the following structural formula was synthesized. The thus-obtained NMR spectrum is shown in FIG. 14.

[Chemical formula 6]

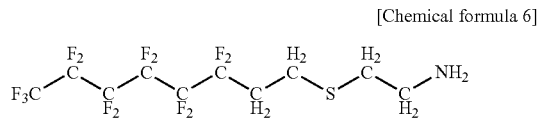

(2) Synthesis of Molybdenum-containing Nanoparticles Protected by Fluorine-containing Organic Compound F-2

A purified product which is composed of molybdenum-containing black nanoparticles was obtained in the same manner as Synthesis Example 5, except that fluorine-containing organic compound F-2 was used in place of fluorine-containing organic compound F-1.

Synthesis Example 7

(1) Synthesis of Fluorine-containing Organic Compound F-3

Figure 15:
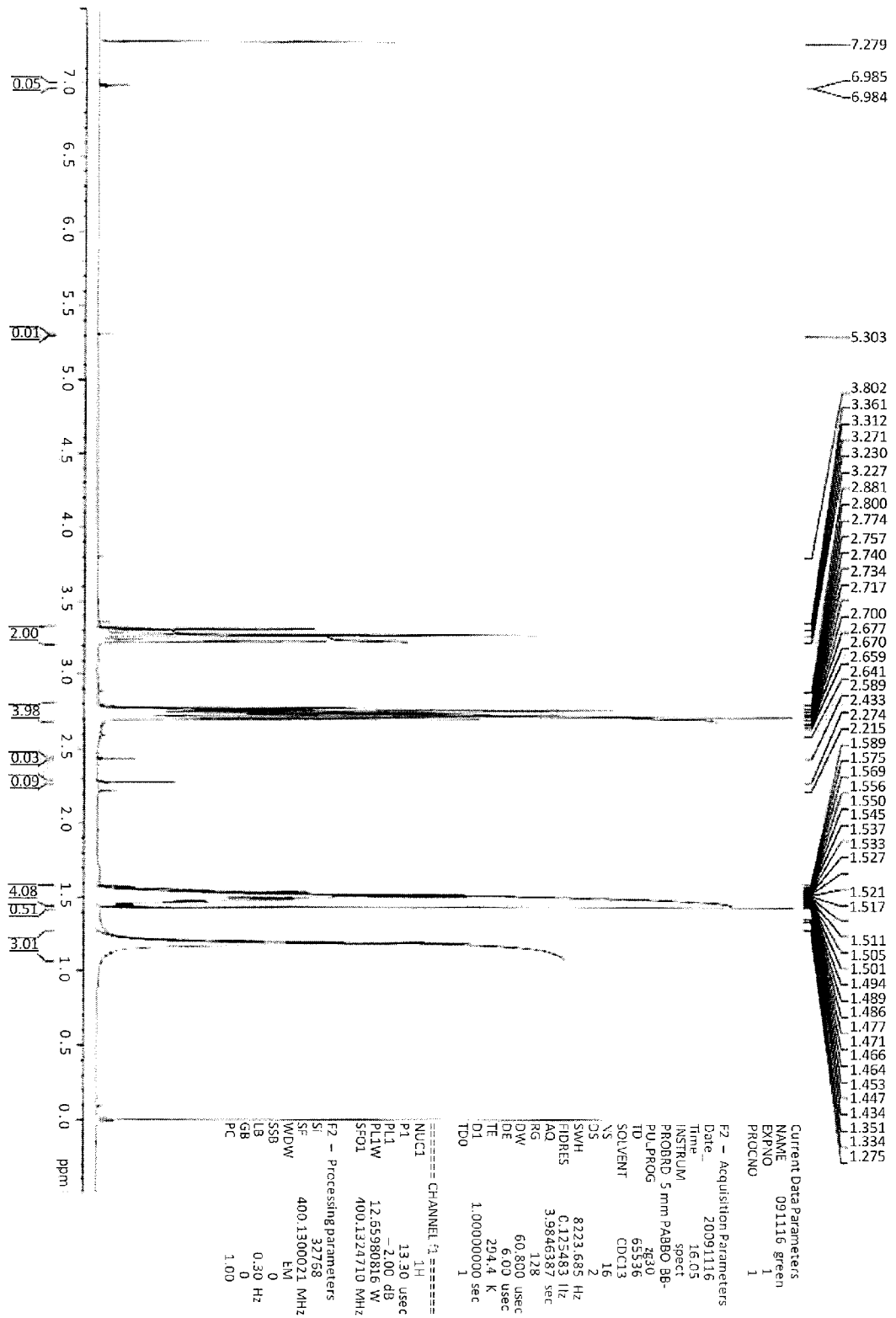
FIG. 15 is a 1H NMR spectrum of fluorine-containing organic compound F-3 obtained in synthesis example 7.

Fluorine-containing organic compound F-3 was obtained by reducing fluorine-containing organic compound F-1 obtained in Synthesis Example 1 using lithium aluminum hydride. It was confirmed by mass spectrometry that the molecular weight of the thus-obtained compound F-3 was 420, and it was also confirmed by 1H NMR that compound having the following structural formula was synthesized. The thus-obtained NMR spectrum is shown in FIG. 15.

[Chemical formula 7]

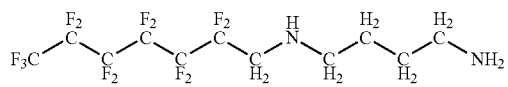

(2) Synthesis of Molybdenum-containing Nanoparticles Protected by Fluorine-containing Organic Compound F-3

A purified product which is composed of molybdenum-containing black nanoparticles was obtained in the same manner as Synthesis Example 5, except that fluorine-containing organic compound F-3 was used in place of fluorine-containing organic compound F-1.

Synthesis Example 8

(1) Synthesis of Fluorine-containing Organic Compound F-4

Figure 16:
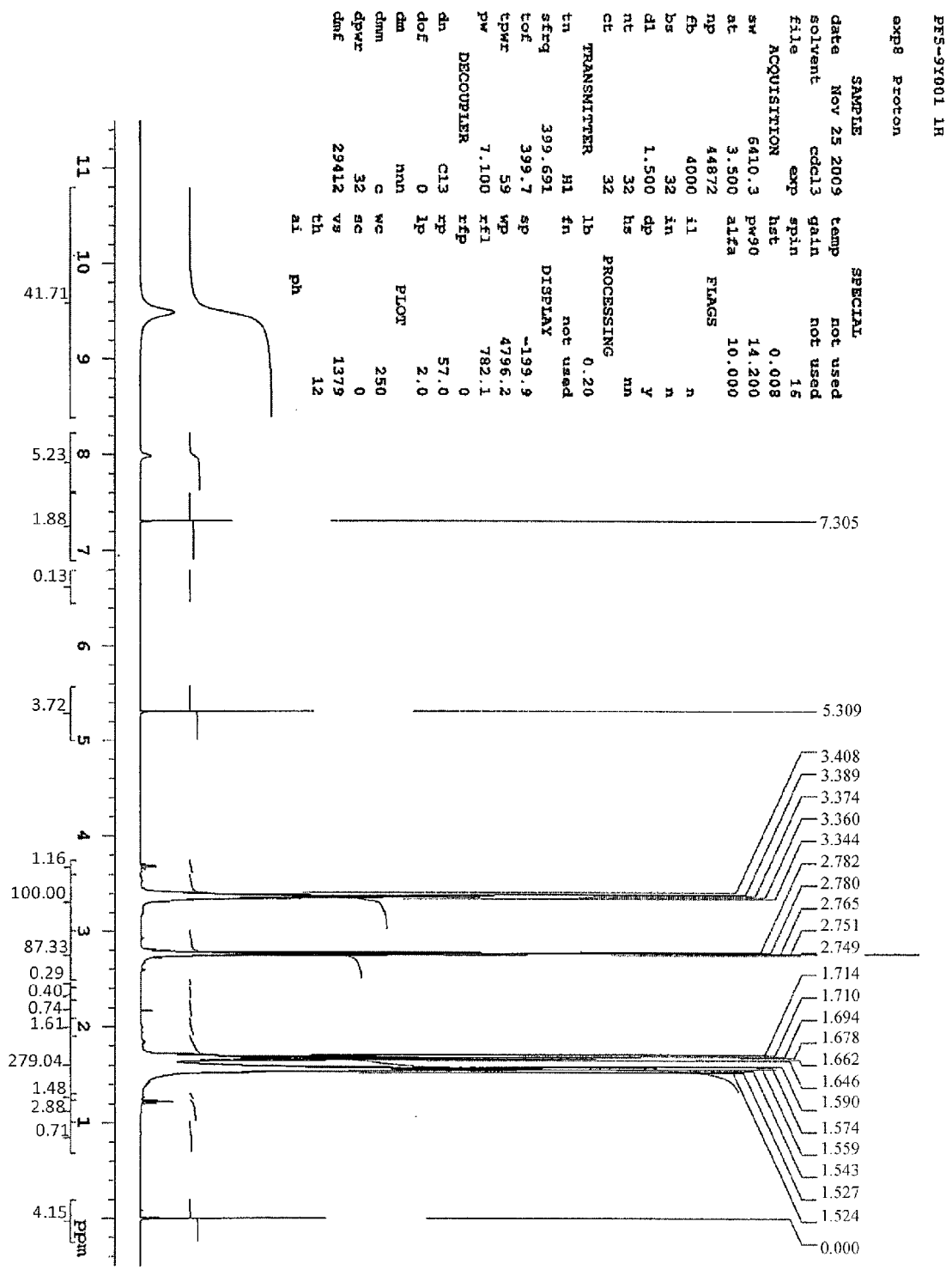
FIG. 16 is a 1H NMR spectrum of fluorine-containing organic compound F-4 obtained in synthesis example 8.

2,3,3,3-tetrafluoro-2-(1,1,2,2,3,3,3-heptafluoropropoxy) propanoic acid sodium salt (manufactured by Sigma-Aldrich Corporation) was turned into an acid fluoride by the reaction with a cyanuric fluoride (manufactured by Sigma-Aldrich Corporation) in a dichloromethane solvent in the coexistence of pyridine. A condensation reaction of the acid fluoride with 1,4-diaminobutane was performed in a dichloromethane solvent, thereby obtaining fluorine-containing organic compound F-4. It was confirmed by mass spectrometry that the molecular weight of the thus-obtained compound F-4 was 400, and it was also confirmed by 1H NMR that a compound having the following structural formula was synthesized. The thus-obtained NMR spectrum is shown in FIG. 16.

[Chemical formula 8]

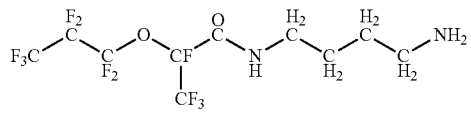

(2) Synthesis of Molybdenum-containing Nanoparticles Protected by Fluorine-containing Organic Compound F-4

A purified product which is composed of molybdenum-containing black nanoparticles was obtained in the same manner as Synthesis Example 5, except that fluorine-containing organic compound F-4 was used in place of fluorine-containing organic compound F-1.

Comparative Synthesis Example 1

Molybdenum-containing nanoparticles protected by n-hexadecylamine were synthesized in the following manner. First, 0.8 g of n-hexadecylamine (manufactured by Kanto Chemical Co., Inc.) and 12.8 g of n-octyl ether (manufactured by Tokyo Chemical Industry Co., Ltd.) were weighed out and put into a 25 ml three-necked flask. The pressure inside the flask was reduced while stirring, and the flask was left for one hour at room temperature (24° C.) for removal of low volatility components. After switching from vacuum to air atmosphere, 0.8 g of molybdenumhexacarbonyl (manufactured by Kanto Chemical Co., Inc.) was added thereto. The mixed solution was heated to 280° C. while stirring in an argon gas atmosphere, and kept at the temperature for one hour. Then, the mixed solution was cooled to room temperature (24° C.). After switching from the argon gas atmosphere to the air atmosphere, 20 g of ethanol was added to the mixed solution in a dropwise manner. The thus-produced precipitate was separated from the reaction solution by centrifugal separation and then purified by reprecipitation in the following manner.

That is, the precipitate was mixed with 3 g of chloroform to produce a dispersion liquid, and 6 g of ethanol was added to the dispersion liquid in a dropwise manner, thereby obtaining a purified precipitate.

A reprecipitation liquid obtained in this manner was centrifuged to separate a precipitate from the reaction solution, followed by drying the precipitate, thereby obtaining a purified substance which is composed of molybdenum-containing black nanoparticles.

<Particle Diameter Measurement>

The primary particle diameter of the transition metal-containing nanoparticles obtained in each of Synthesis Examples 1 to 3, 5 to 8 and Comparative Synthesis Example 1 was measured with S-4800 which is an ultra-high resolution field emission scanning electron microscope manufactured by Hitachi High-Technologies Corporation. Measurement samples were produced by putting a few drops of each of transition-metal-containing nanoparticles dispersed solutions on a commercially-available microgrid with a support film and drying the solvent under reduced pressure. Particle image observation was performed in a scanning transmission electron microscopy (STEM) mode. From the observed particles obtained in each example, 20 bright particles were selected and the average value was used as the average particle diameter. The observed particle diameter is considered to be the average particle diameter of the transition metal-containing nanoparticles from which the protective agent was removed.

The average particle diameter of the nanoparticles produced in Synthesis Example 1 was 7 nm. The average particle diameter of the nanoparticles produced in Synthesis Example 2 was 9 nm. The average particle diameter of the nanoparticles produced in Synthesis Example 3 was 15 nm. The average particle diameter of the nanoparticles produced in Synthesis Example 5 was 6 nm. The average particle diameter of the nanoparticles produced in Synthesis Example 6 was 6 nm. The average particle diameter of the nanoparticles produced in Synthesis Example 7 was 8 nm. The average particle diameter of the nanoparticles produced in Synthesis Example 8 was 5 nm. The average particle diameter of the nanoparticles produced in comparative Synthesis Example 1 was 6 nm.

<Measurement of Crystal Structure of Transition Metal-containing Nanoparticles>

The crystal structure of the above-obtained molybdenum-containing nanoparticles was identified by an X-ray powder diffraction method. RINT-1500 manufactured by Rigaku Corporation was used as the measurement apparatus. Measurement samples were produced by putting the molybdenum-containing nanoparticles obtained in each example on a glass. CuKα rays was used as the X-ray source and performed in the condition of a tube voltage of 50 kV and a tube current of 250 mA. Measurement was performed by a 2θ/θ scanning method in the condition of a scanning rate of 2° per minute and a step angle of 0.05°.

For any of the molybdenum-containing nanoparticles obtained in Synthesis Examples 1 to 2, 5 to and comparative Synthesis Example 1, a sharp peak was observed at 2θ=37.8°, 43.7°, 63.4°, 75.7°, 79.9°.

It is clear from the values in database JCPDS card No. 15-0457, the produced molybdenum-containing nanoparticles are carbonized Mo nanoparticles mainly consisting of MoC and $Mo_2C$.

The XRD chart of the tungsten-containing nanoparticles obtained in Synthesis Example 3 was too broad to identify the crystal structure. It is thus estimated that the tungsten-containing nanoparticles thus formed are amorphous nanoparticles.

<Layer Thickness Measurement>

The layer thickness was measured as follows: a single layer is formed with the material to be measured on a cleaned glass substrate with ITO; tiers were formed with a cutter knife; then, the height of the tiers was measured with a probe microscope (Nanopics 1000 manufactured by SII NanoTechnology Inc.) in a tapping mode.

<Ionization Potential Measurement>

In the present invention, a work function value measured with a photoelectron spectrometer (AC-1 manufactured by Riken Keiki Co., Ltd.) was used as the ionization potential value. Measurement was performed as follows: a single layer is formed with the material to be measured on a cleaned glass substrate with ITO (manufactured by Sanyo Vacuum Industries Co., Ltd.), and the ionization potential was determined by an energy value at which a photoelectron is released in the photoelectron spectrometer AC-1 was determined. Measurement was performed in the condition of a light intensity of 50 nW at every 0.05 eV.

The ionization potential of the hole injection transport layer formed with the device material for a hole injection transport layer obtained in Synthesis Example 1 was 5.4 eV. The ionization potential of the hole injection transport layer formed with the device material for a hole injection transport layer obtained in Synthesis Example 2 was 5.4 eV. The ionization potential of the hole injection transport layer formed with the device material for a hole injection transport layer obtained in Synthesis Example 3 was 5.6 eV. The ionization potential of the hole injection transport layer formed with the device material for a hole injection transport layer obtained in Synthesis Example 4 was 5.8 eV. The ionization potential of the hole injection transport layer formed with the device material for a hole injection transport layer obtained in Synthesis Example 5 was 5.4 eV. The ionization potential of the hole injection transport layer formed with the device material for a hole injection transport layer obtained in Synthesis Example 6 was 5.4 eV. The ionization potential of the hole injection transport layer formed with the device material for a hole injection transport layer obtained in Synthesis Example 7 was 5.4 eV. The ionization potential of the hole injection transport layer formed with the device material for a hole injection transport layer obtained in Synthesis Example 8 was 5.4 eV. The ionization potential of the hole injection transport layer formed with the device material for a hole injection transport layer obtained in comparative Synthesis Example 1 was 5.0 eV.

<Absorption Spectrum Measurement>

Absorption spectrum was measured as follows: a single layer was formed with the material to be formed on a cleaned quarts substrate, and a difference in optical absorption between the substrate with the thin layer and a reference quarts substrate was measured with UV-3100PC (manufactured by Hitachi, Ltd.)

Any of the thin layers (15 nm) formed with the device materials for a hole injection transport layer obtained in Synthesis Examples 1 to 3 and 5 to 8 had a high transmittance of 85% at a wavelength of 254 nm. The hole injection transport layer obtained in Synthesis Example 4 had a high transmittance of 80% or more at a wavelength of 254 nm.

<Measurement of Liquid Contact Angle>

The liquid contact angle was measured with a contact angle measuring apparatus (automated contact angle meter DM700 manufactured by Kyowa Interface Science Co., Ltd.) Xylene (surface tension: 28.5 mN/m) was used as the standard solution, and the contact angle five seconds after allowing two microliters of xylene to drip from a microsyringe, was measured.

<Surface Analysis of Hole Injection Transport Layer>

The valence of the transition metal contained in each of the transition metal-containing nanoparticles and the presence of fluoroalkyl groups contained in the same were measured by X-ray photoelectron spectroscopy (XPS). ESCA-3400 manufactured by Kratos Analytical Limited was used for measurement. MgKα rays was used as the X-ray source used for the measurement. No monochromator was used, and the measurement was performed in the condition of an accelerating voltage of 10 kV and a filament current of 20 mA.

<<Experiment on Device Performance>>

The organic EL device of the present invention was produced as follows: a hole injection transport layer comprising Mo-containing nanoparticles to which surface the fluorine-containing organic compound is attached, was formed on a glass substrate with a transparent anode; a photocatalytic treatment was performed thereon; then, the basic layer structure, that is, a hole transport layer, a light emitting layer, a hole blocking layer, an electron transport layer, an electron injection layer and a cathode were formed, stacked and encapsulated, thereby producing an organic EL device which emits green light. The performance and wettability of the organic EL device were analyzed.

Example 1

A glass substrate with ITO (manufactured Sanyo Vacuum Industries Co., Ltd., ITO layer thickness: 150 nm) on which a pattern is formed, was subjected to ultrasonic cleaning with a neutral detergent and then ultrapure water, and a UV ozone treatment was performed thereon.

Next, as the hole injection transport layer, a transition metal-containing nanoparticle thin layer was formed on the substrate by spin coating an ink for forming a hole injection transport layer. The ink for forming a hole injection transport layer was prepared as follows: 0.012 g of the device material for a hole injection transport layer obtained in Synthesis Example 1 was dissolved in 3.0 g of heptafluoro-n-ethyl butyrate to prepare a 0.4 wt % solution, which is the ink for forming a hole injection transport layer. After forming the layer, the layer was dried on a hot plate at 200° C. The thickness of the dried layer was 15 nm.

Next, a photomask with a photocatalyst-containing layer was fabricated. A photomask was prepared, in which a transparent region and a light shielding region are formed on a synthetic quarts substrate. A coating liquid of the following composition for forming photocatalyst-containing layers was applied on the photomask with a spin coater. A heat drying treatment was performed thereon at 150° C. for 10 minutes to develop a hydrolysis-polycondensation reaction and thus to cure the layer, thereby forming a 100 nm-thick, transparent photocatalyst-containing layer in which the photocatalyst is strongly fixed in organosiloxane.

(Coating Liquid for Forming Photocatalyst-containing Layers)

Titanium dioxide (ST-K01 manufactured by Ishihara Sangyo Kaisha, Ltd.): 2 parts by weight
Organoalkoxysilane (TSL8113 manufactured by Toshiba Silicone Co., Ltd.): 0.4 part by weight
Isopropyl alcohol: 3 parts by weight Next, the hole injection transport layer was exposed through the above-fabricated photomask with the photocatalyst-containing layer, thereby forming a pattern comprising a lyophilic region and a liquid-repellent region. Using a UV exposure apparatus equipped with a high pressure mercury lamp and a positioning mechanism for positioning the photomask with the photocatalyst-containing layer and the substrate, the photomask with the photocatalyst-containing layer and the hole injection transport layer were adjusted so that the distance between the photocatalyst-containing layer of the photomask and the hole injection transport layer is 100 μm; thereafter, light at 254 nm was applied from the back side of the photomask with the photocatalyst-containing layer for 3 minutes so that the amount of exposure to light is 5 J/cm$^2$.

Next, on the treated hole injection transport layer, a thin layer of polyvinyl carbazole (PVK) (molecular weight: 700,000) was formed by spin coating as the hole transport layer. The coating liquid was prepared by dissolving PVK in 1,2-dichloroethane. After forming the layer, the layer was dried on a hot plate at 150° C. The thickness of the dried layer was 20 nm.

Then, a thin light emitting layer was formed on the hole transport layer by spin coating, the layer comprising tris[2-(p-tolyl)pyridine)]iridium(III) (Ir(mppy)3) as a luminescent dopant and 4,4'-bis(9-carbazolyl-2,2')dimethylbiphenyl (CDBP) as the host. The coating liquid was prepared by dissolving CDBP (host) and Ir(mppy)3 (dopant) in toluene so that CDBP and Ir(mppy)3 are in the state that they are contained at a weight ratio of 20:1 and the total thickness of the layers is 40 nm when dried. After forming the layer, the layer was dried on a hot plate at 100° C.

A hole blocking layer was formed on the light emitting layer by vapor-deposition. The hole blocking layer was formed as follows: a bis(2-methyl-8-quinolinolato) (p-phenyl phenolate) aluminum complex (BAlq) was used as the block forming material and vapor-deposited by a resistance heating method in a vacuum (pressure: $1\times10^{-4}$ Pa) so that the thickness of the resulting BAlq vapor-deposited layer is 15 nm.

An electron transport layer was formed on the hole blocking layer by vapor-deposition. The electron transport layer was formed as follows: a tris(8-quinolinolato) aluminum complex (Alq3) was vapor-deposited by a resistance heating method in a vacuum (pressure: $1\times10^{-4}$ Pa) so that the thickness of the resulting Alq3 vapor-deposited layer is 20 nm.

In addition, an electron injection layer and a cathode were successively formed by vapor-deposition on the electron transport layer of the thus-produced product consisting of the glass substrate with the transparent anode/the hole injection transport layer/the hole transport layer/the light emitting layer/the hole blocking layer/the electron transport layer. The electron injection layer and cathode are vapor-deposited layers formed successively with LiF (thickness: 0.5 nm) and Al (thickness: 100 nm), respectively, by a resistance heating vapor-deposition method in a vacuum (pressure: $1\times10^{-4}$ Pa).

After forming the cathode, the layers were encapsulated with non-alkali glass and a UV-curable epoxy adhesive, inside a glove box under the condition of low oxygen and low humidity. The organic EL device of Example 1 was produced therefore, comprising the anode, electron injection layer and cathode, the anode being patterned in a line shape of a few mm width, while the electron injection layer and cathode each being formed in a line shape of a few mm width so as to be perpendicular to the anode.

The devices produced in Examples, Comparative Examples and Reference Examples were driven at 10 mA/cm$^2$ and the emission luminance and spectrum thereof were measured by a spectroradiometer SR-2 manufactured by Topcon Corporation. Any of the organic EL devices produced in Examples and Comparative Examples emitted green light derived from Ir(mppy)$_3$. Measurement results are shown in Table 1. Current efficiency was calculated from drive current and luminance.

The life of the organic EL elements was evaluated by observing the luminance decreasing gradually over time in constant current operation. Herein, the life (LT50) is the time (hr) from when the initial luminance is 2000 cd/m$^2$ till when the luminance is decreased to a retention rate of 50%.

In addition, as described above, the wettability of the hole injection transport layer before and after the photocatalytic treatment were evaluated, as well as the ionization potential of the same. The results are also shown in Table 1.

Example 2

A device was produced in the same manner as Example 1, except that the hole injection transport layer (thickness: 15 nm) was formed with the device material for a hole injection transport layer obtained in Synthesis Example 2 in place of the device material for a hole injection transport layer obtained in Synthesis Example 1. The properties of the device were evaluated, as well as the wettability and ionization potential of the hole injection transport layer.

Example 3

A device was produced in the same manner as Example 1, except that the hole injection transport layer (thickness: 15 nm) was formed with the device material for a hole injection transport layer obtained in Synthesis Example 3 in place of the device material for a hole injection transport layer obtained in Synthesis Example 1. The properties of the device were evaluated, as well as the wettability and ionization potential of the hole injection transport layer.

Example 4

A device was produced in the same manner as Example 1, except that the hole injection transport layer was exposed to vacuum ultraviolet light, in place of ultraviolet light at 253 nm, as the exposure light source. The properties of the device were evaluated, as well as the wettability and ionization potential of the hole injection transport layer. At this time, vacuum ultraviolet light having a wavelength of 172 nm was applied from the metal mask side so that the amount of exposure to light is 5 J/cm$^2$.

Example 5

A device was produced in the same manner as Example 1, except that the hole injection transport layer (thickness: 10 nm) was formed with the transition metal-containing nanoparticles obtained in Comparative Synthesis Example 1 and the device material for a hole injection transport layer obtained in Synthesis Example 3 in place of the device material for a hole injection transport layer obtained in Synthesis Example 1. The properties of the device were evaluated, as well as the wettability and ionization potential of the hole injection transport layer. In the ink for forming a hole injection transport layer obtained by mixing the materials of Comparative Synthesis Example 1 and Synthesis Example 3, the concentration of the solution was controlled by dissolving in 4.0 g of a mixed solvent of heptafluoro-n-ethyl butyrate and cyclohexanone (weight ratio 1:1) the materials of Comparative Synthesis Example 1 and Synthesis Example 3 in a total amount of 0.016 g so that the weight ratio of the material of Comparative Synthesis Example 1 to that of Synthesis Example 3 is 1:1 and the thickness of the layer is 15 nm when dried.

Example 6

A device was produced in the same manner as Example 1, except that a thin layer (thickness: 5 nm or less) was formed as the hole injection transport layer with the ink for forming a hole injection transport layer obtained in Synthesis Example 4 in place of the device material for a hole injection transport layer obtained in Synthesis Example 1. The properties of the device were evaluated, as well as the wettability and ionization potential of the hole injection transport layer.

Example 7

A device was produced in the same manner as Example 1, except that a thin layer (thickness: 5 nm or less) was formed as the hole injection transport layer with the ink for forming a hole injection transport layer obtained in Synthesis Example 5 in place of the device material for a hole injection transport layer obtained in Synthesis Example 1. The properties of the device were evaluated, as well as the wettability and ionization potential of the hole injection transport layer.

Example 8

A device was produced in the same manner as Example 1, except that a thin layer (thickness: 5 nm or less) was formed as the hole injection transport layer with the ink for forming a hole injection transport layer obtained in Synthesis Example 6 in place of the device material for a hole injection transport layer obtained in Synthesis Example 1. The properties of the device were evaluated, as well as the wettability and ionization potential of the hole injection transport layer.

Example 9

A device was produced in the same manner as Example 1, except that a thin layer (thickness: 5 nm or less) was formed as the hole injection transport layer with the ink for forming a hole injection transport layer obtained in Synthesis Example 7 in place of the device material for a hole injection transport layer obtained in Synthesis Example 1. The properties of the device were evaluated, as well as the wettability and ionization potential of the hole injection transport layer.

Example 10

A device was produced in the same manner as Example 1, except that a thin layer (thickness: 5 nm or less) was formed as the hole injection transport layer with the ink for forming a hole injection transport layer obtained in Synthesis Example 8 in place of the device material for a hole injection transport layer obtained in Synthesis Example 1. The properties of the device were evaluated, as well as the wettability and ionization potential of the hole injection transport layer.

Comparative Example 1

A device was produced in the same manner as Example 1, except that a thin layer (thickness:15 nm) was formed as the hole injection transport layer with the transition metal-containing nanoparticles obtained in Comparative Synthesis Example 1 in place of the device material for a hole injection transport layer obtained in Synthesis Example 1. The properties of the device were evaluated, as well as the wettability and ionization potential of the hole injection transport layer.

The ink for forming a hole injection transport layer comprising the transition metal-containing nanoparticles obtained in Comparative Synthesis Example 1 was produced by dissolving the material of Comparative Synthesis Example 1 in a cyclohexanone solvent so that the thickness of the layer is 15 nm when dried.

Comparative Example 2

A device was produced in the same manner as Example 1, except that a thin layer was formed as the hole injection transport layer by stacking a layer of PEDOT/PSS (AI4083 manufactured by H.C. Starck Ltd.) and another layer of 4-(3,3,4,4,5,5,6,6,7,7,8,8,9,9,10,10,10-heptadecafluorodecyl) benzylamine by spin coating, in place of the layer formed with the compound of Synthesis Example 1. The properties of the device were evaluated, as well as the wettability and ionization potential of the hole injection transport layer. The PEDOT/PSS layer was produced in such a manner that a PEDOT/PSS solution was diluted with distilled water and dissolved so that the thickness of the layer is 15 nm when dried. Next, a solution obtained by dissolving 0.4 wt % heptadecafluorodecylbenzylamine in heptafluoro-n-ethyl butyrate was applied to form a thin layer, and the layer was dried. The thickness of the dried layer was unmeasurable and 5 nm or less.

Comparative Example 3

A device was produced in the same manner as Comparative Example 2, except that, in Comparative Example 2, the hole injection transport layer was only irradiated with the ultraviolet light at 253 nm not through the photomask with the photocatalyst-containing layer. The properties of the device were evaluated, as well as the wettability and ionization potential of the hole injection transport layer.

Comparative Example 4

A device was produced in the same manner as Comparative Example 2, except that no photocatalytic treatment was performed on the hole injection transport layer. The properties of the device were evaluated, as well as the wettability and ionization potential of the hole injection transport layer.

Reference Example 1

A device was produced in the same manner as Example 1, except that no photocatalytic treatment was performed on the hole injection transport layer. The properties of the device were evaluated, as well as the wettability and ionization potential.

Reference Example 2

A device was produced in the same manner as Example 2, except that no photocatalytic treatment was performed on the hole injection transport layer in Example 2. The properties of the device were evaluated, as well as the wettability and ionization potential.

Reference Example 3

A device was produced in the same manner as Example 3, except that no photocatalytic treatment was performed on the hole injection transport layer in Example 3. The properties of the device were evaluated, as well as the wettability and ionization potential.

[Evaluation]

According to a comparison between Example 1 and Reference Example 1, the contact angle is decreased from 58° to 5° or less after the photocatalytic treatment, and the ionization potential is increased from 5.4 eV to 5.6 eV. In the device properties, the life is increased from hours to 7 hours after the photocatalytic treatment. The improvement in device properties is presumed to be because the fluoroalkyl component was decomposed by the photocatalytic treatment and the surface of the Mo-containing nanoparticles is oxidized and thus modified. The same result was also obtained in a comparison between Example 2 and Reference Example 2 and a comparison between Example 3 and Reference Example 3, which shows that there is an improvement in device properties as well.

According to a comparison between Example 4 and Reference Example 1, the contact angle is decreased from 58° to 5° or less by the vacuum ultraviolet irradiation, and the ionization potential is increased from 5.4 eV to 5.5 eV. In the device properties, the life is increased from 5 hours to 5.5 hours after the vacuum ultraviolet irradiation. The improvement in device properties is presumed to be because the fluoroalkyl component was decomposed by the vacuum ultraviolet irradiation and the surface of the Mo-containing nanoparticles is oxidized by ozone produced by the vacuum ultraviolet light.

TABLE 1

| | | Hole injection transport layer | | | Device Properties | | | |
|---|---|---|---|---|---|---|---|---|
| | Material | Initial contact angle (°) | Contact angle after treatment (°) | Ionization potential (eV) | Voltage (V) | Luminance (cd/m$^2$) | Current Efficiency (cd/A) | Time to half-luminescence (hr) |
| Example 1 | Synthesis Example 1 | 58 | <5 | 5.6 | 15 | 816 | 8.1 | 7.0 |
| Example 2 | Synthesis Example 2 | 56 | <5 | 5.6 | 15 | 805 | 8.1 | 7.1 |
| Example 3 | Synthesis Example 3 | 44 | <5 | 5.7 | 16 | 733 | 7.3 | 4.0 |
| Example 4 | Synthesis Example 1 | 58 | 22 | 5.5 | 16 | 785 | 7.9 | 5.5 |
| Example 5 | Comparative Synthesis Example 1/Synthesis Example 3 | 33 | <5 | 5.7 | 14 | 795 | 8.0 | 4.2 |
| Example 6 | Synthesis Example 4 | 35 | <5 | 5.7 | 17 | 515 | 5.2 | 3.0 |
| Example 7 | Synthesis Example 5 | 60 | <5 | 5.3 | 15 | 836 | 8.4 | 7.3 |
| Example 8 | Synthesis Example 6 | 48 | <5 | 5.4 | 15 | 802 | 8.0 | 6.9 |
| Example 9 | Synthesis Example 7 | 52 | <5 | 5.3 | 15 | 795 | 8.0 | 6.2 |
| Example 10 | Synthesis Example 8 | 53 | <5 | 5.3 | 15 | 841 | 8.4 | 9.3 |
| Comparative Example 1 | Comparative Synthesis Example 1 | 58 | — | 5.0 | 16 | 768 | 7.7 | 4.0 |
| Comparative Example 2 | PEDOT | 23 | <5 | 5.1 | 18 | 586 | 5.9 | 1.5 |
| Comparative Example 3 | PEDOT | 23 | <5 | 5.1 | 16 | 620 | 6.2 | 1.6 |
| Comparative Example 4 | PEDOT | 23 | — | 5.1 | 15 | 663 | 6.6 | 2.0 |
| Reference Example 1 | Synthesis Example 1 | 58 | — | 5.4 | 15 | 814 | 8.0 | 5.0 |
| Reference Example 2 | Synthesis Example 2 | 56 | — | 5.4 | 15 | 801 | 8.0 | 6.8 |
| Reference Example 3 | Synthesis Example 3 | 44 | — | 5.6 | 16 | 693 | 6.9 | 3.2 |

According to a comparison between Examples 1 and 5, the driving voltage decreased by 1 V in Example 5. This result suggests that in a layer formed in Example 5, the W-containing nanoparticles with fluoroalkyl have a small surface tension and float upon forming the thin layer and thus the layer has such a concentration gradient that the Mo-containing nanoparticles with no fluoroalkyl are present in large amounts on the ITO side and the W-containing nanoparticles with fluoroalkyl are present in large amounts on the hole transport layer side. This is presumed to be because the ionization potential of the W-containing nanoparticles is larger than that of the Mo-containing nanoparticles, so that there was an increase in hole injecting property and thus the device showed a low voltage.

According to a comparison between Examples, Example 10 achieved excellent results in all of luminance, current efficiency and life. This is presumed to be because the fluorine component having an ether bond is likely to be decomposed and the amount of a residual organic component on the surface the hole injection transport layer is decreased, so that there is an increase in adhesion of the interface of the thin layer and thus the device properties are improved.

According to a comparison between Example 1 and Comparative Example 1, Example 1 with a fluorinated alkyl group can be operated at a voltage which is 1 V lower than Comparative Example 1 with long-chain alkyl and has a longer life than the same. This result is presumed to be because the ionization potential is increased by the attachment of a fluoroalkyl group, so that there was an increase in hole injecting property and thus the device showed a low voltage and had a long life.

According to a comparison between Comparative Examples 2 to 4, in the case of using PEDOT/PSS for the hole injection transport layer, which is a general organic hole injection material, it is clear that a high voltage and short life were provided to the device by the light irradiation and photocatalytic treatment. This result is presumed to be because PEDOT/PSS was oxidized or decomposed by the light irradiation or the photocatalytic treatment and the hole injecting property and drive resistance of the device were deteriorated.

According to a comparison between Example 6 and Comparative Example 4, the oil-repellent property of the Mo clusters of Example 6 can be controlled as with the Mo nanoparticles of Example 1, thereby obtaining more excellent properties than the case of using PEDOT/PSS.

<<Experiment in Wettability>>

Example 11

As shown in FIG. 11, on glass substrate 41 on which ITO transparent electrode (anode) 42 is formed, a thin layer of the Mo-containing nanoparticles produced in Synthesis Example, to which surface the fluorine-containing organic compound is attached, was formed as hole injection transport layer 43 by spin coating so as to have a thickness of 10 nm. Patterned exposure was performed thereon using a photocatalyst-containing layer substrate in which a light shielding part and photocatalyst-containing layer are formed on a base (photomask 50 with a photocatalyst-containing layer). The wettability of exposed and unexposed parts were determined by contact angle measurement.

First, a thin layer of indium tin oxide (ITO) (thickness: 150 nm) was used as the transparent electrode. The glass substrate with ITO (manufactured Sanyo Vacuum Industries Co., Ltd.) was subjected to ultrasonic cleaning with a neutral detergent and then ultrapure water, and a UV ozone treatment was performed thereon.

Next, as the hole injection transport layer, a Mo-containing nanoparticle thin layer was formed on the substrate by spin coating. The ink for forming a hole injection transport layer was prepared by dissolving the Mo-containing nanoparticles obtained in Synthesis Example in heptafluoro-n-ethyl butyrate. After forming the layer, the layer was dried on a hot plate at 200° C. The thickness of the dried layer was 15 nm. The contact angle of the surface of the hole injection transport layer with respect to xylene was 58°.

Next, photomask 50 with a photocatalyst-containing layer was fabricated. A photomask was prepared, in which chrome mask 54 is formed on synthetic quarts substrate 51 so that transparent region 52 and light shielding region 53 are provided thereon. A coating liquid of the following composition for forming photocatalyst-containing layers was applied on the photomask with a spin coater. A heat drying treatment was performed thereon at 150° C. for 10 minutes to develop a hydrolysis-polycondensation reaction and thus to cure the layer, thereby forming 100 nm-thick, transparent photocatalyst-containing layer 55 in which the photocatalyst is strongly fixed in organosiloxane. Transparent region 56 was provided on the edge of synthetic quarts substrate 51, in which no photocatalyst-containing layer 55 is formed.

(Coating Liquid for Forming Photocatalyst-containing Layers)

Titanium dioxide (ST-K01 manufactured by Ishihara Sangyo Kaisha, Ltd.): 2 parts by weight Organoalkoxysilane (TSL8113 manufactured by Toshiba Silicone Co., Ltd.): 0.4 part by weight Isopropyl alcohol: 3 parts by weight Next, the thus-formed hole injection transport layer was exposed through the above-prepared photomask with the photocatalyst-containing layer, thereby forming a pattern comprising a lyophilic region and a liquid-repellent region. Using a UV exposure apparatus equipped with a high pressure mercury lamp and a positioning mechanism for positioning the photomask with the photocatalyst-containing layer and the substrate, photomask 50 with the photocatalyst-containing layer and hole injection transport layer 43 were adjusted so that the distance between photocatalyst-containing layer 55 of photomask 50 and hole injection transport layer 43 is 100 μm; thereafter, light at 254 nm was applied from the back side of photomask 55 with the photocatalyst-containing layer for three minutes so that the amount of the applied light is 5 J/cm².

Then, the static liquid contact angle of the exposed and unexposed parts on the hole injection transport layer were measured with contact angle meter (manufactured by Kyowa Interface Science Co., Ltd.) Xylene (surface tension: 28.5 mN/m) was used as the liquid.

Example 12

A pattern comprising a lyophilic region and a liquid-repellent region was formed in the same manner as Example 11, except that the hole injection transport layer was exposed to vacuum ultraviolet light, in place of ultraviolet light at 253 nm, as the exposure light source. The wettability of the pattern was evaluated. At this time, vacuum ultraviolet light having a wavelength of 172 nm was applied from the metal mask side so that the amount of the applied light is 5 J/cm², thereby forming the pattern.

Example 13

A pattern comprising a lyophilic region and a liquid-repellent region was produced in the same manner as Example 11, except that the hole injection transport layer (thickness: 15 nm) was formed with the device material for a hole injection transport layer obtained in Synthesis Example 2 in place of the device material for a hole injection transport layer obtained in Synthesis Example 1. The wettability of the pattern was evaluated.

Reference Example 4

A thin layer was formed in the same manner as Example 11, except that the hole injection transport layer was heated on a hot plate at 200° C. for one hour, without performing a photocatalytic treatment. The wettability of the thin layer was evaluated.

Reference Example 5

A thin layer was formed in the same manner as Reference Example 4, except that the hole injection transport layer (thickness: 15 nm) was formed with the device material for a hole injection transport layer obtained in Synthesis Example 2 in place of the device material for a hole injection transport layer obtained in Synthesis Example 1. The wettability of the thin layer was evaluated.

Reference Example 6

A thin layer was formed in the same manner as Reference Example 4, except that the hole injection transport layer (thickness: 15 nm) was formed with the device material for a hole injection transport layer obtained in Synthesis Example 3 in place of the device material for a hole injection transport layer obtained in Synthesis Example 1. The wettability of the thin layer was evaluated.

Reference Example 7

A thin layer was formed in the same manner as Reference Example 4, except that the hole injection transport layer (thickness: 15 nm) was formed with the device material for a hole injection transport layer obtained in Synthesis Example 4 in place of the device material for a hole injection transport layer obtained in Synthesis Example 1. The wettability of the thin layer was evaluated.

Comparative Example 5

A device was produced in the same manner as Reference Example 4, except that a thin layer was formed as the hole injection transport layer by spin coating PEDOT/PSS (AI4083 manufactured by H.C. Starck Ltd.) and 4-(3,3,4,4,5,5,6,6,7,7,8,8,9,9,10,10,10-heptadecafluorodecyl)benzylamine, instead of using the device material for a hole injection transport layer obtained in Synthesis Example 1. The wettability of the device was evaluated. The PEDOT/PSS layer was produced in such a manner that a PEDOT/PSS solution was diluted with distilled water and dissolved so that the thickness of the layer is 15 nm when dried. Next, a solution obtained by dissolving 0.4 wt % heptadecafluorodecylbenzylamine in heptafluoro-n-ethyl butyrate was applied to form a thin layer, and the layer was dried. The thickness of the dried layer was unmeasurable and 5 nm or less.

[Evaluation]

Liquid contact angles of Examples 11 to 13 are shown in Table 2, which are those of region I (a surface of the hole injection transport layer before irradiation with light), region II (a region irradiated with light and affected by the photocatalyst), region III (a region not irradiated with light and not affected by the photocatalyst) and region IV (a region irradiated with light but not affected by the photocatalyst), as shown in FIG. 11.

TABLE 2

| | | Static liquid contact angle (°) | | | |
| --- | --- | --- | --- | --- | --- |
| | | | After irradiation | | |
| | Materials of hole injection transport layer | Before irradiation Region I | Region II (Exposed part) (Photocatalyst & light) | Region III (Unexposed part) | Region IV (Exposed part) (Light only) |
| Example 11 | Synthesis Example 1 | 58 | 5 or less | 58 | 58 |
| Example 12 | Synthesis Example 1 | 58 | 5 or less | 58 | 22 |
| Example 13 | Synthesis Example 2 | 56 | 5 or less | 56 | 58 |

Liquid contact angles of Reference Examples 4 to 7 and Comparative Example 5 are shown in Table 3, which are those of the hole injection transport layers before and after heating at 200° C.

TABLE 3

| | | Liquid static contact angle (°) | |
| --- | --- | --- | --- |
| | Materials of hole injection transport layer | Before heating at 200° C. | After heating at 200° C. |
| Reference Example 4 | Synthesis Example 1 | 58 | 44 |
| Reference Example 5 | Synthesis Example 2 | 56 | 43 |
| Reference Example 6 | Synthesis Example 3 | 44 | 33 |
| Reference Example 7 | Synthesis Example 4 | 35 | 28 |
| Comparative Example 5 | PEDOT/PSS + heptadecafluorodecylbenzylamine | 23 | <5 |

In Examples 11 to 13, all of the contact angles of xylene in region II (irradiated with light in the presence of the photocatalyst) are as low as 5° or less. This result is considered to be because the fluoroalkyl component is decomposed and rendered lyophilic by superoxide radicals or hydroxy radicals produced on the photomask. It was observed by XPS measurement of the surfaces that fluoroalkyl groups are removed therefrom. On the other hand, in region III (unexposed part), all of the liquid contact angles are the same as those of the initial region I. A contrast between the liquid repellency of the unexposed part and that of the exposed part is 20° or more, so that it is clear that inks can be applied separately by the process of the present invention. In region IV of Examples 11 and 13, in an area only irradiated with light and not affected by the photocatalyst, the material was not decomposed by light at 254 nm, so that it is clear that the presence of a photocatalyst is necessary. It was observed by XPS measurement of these surfaces that fluoroalkyl groups remained in the almost same amount as the untreated layers. On the other hand, in Example 12, the contact angle is 22° in the exposed part in region IV, which is 36° lower than the unexposed part. A contrast between the liquid-repellency of the unexposed part and that of the exposed part is 20° or more, so that it is clear that in the case of vacuum ultraviolet light, inks can be applied separately without a photocatalyst. It was observed by XPS measurement of these surfaces that fluoroalkyl groups remained in a small amount. In the case of vacuum ultraviolet light, it is presumed that C—C bonds are directly cut by the energy of light. Therefore, two effects are expected in region II of Example 12, which are effects of the photocatalyst and direct decomposition by light.

In Reference Examples 4 to 7, it was observed that the contact angle of the device materials for a hole injection transport layer of the present invention decreased by about 10° by heating. Compared with the unexposed part, the contrast is 20° or more, so that it is clear that inks can be applied separately. Therefore, it is clear that liquid repellency can be maintained even when high temperature heating is needed in the process of drying or heat curing the hole transport layer. In Comparative Example 5, liquid repellency is absolutely lost by heating, so that it is clear that it is not possible to apply inks separately due to heating.

<<Production of Device on which Light Emitting Layer is Patterned>>

Example 14

Figure 12A:
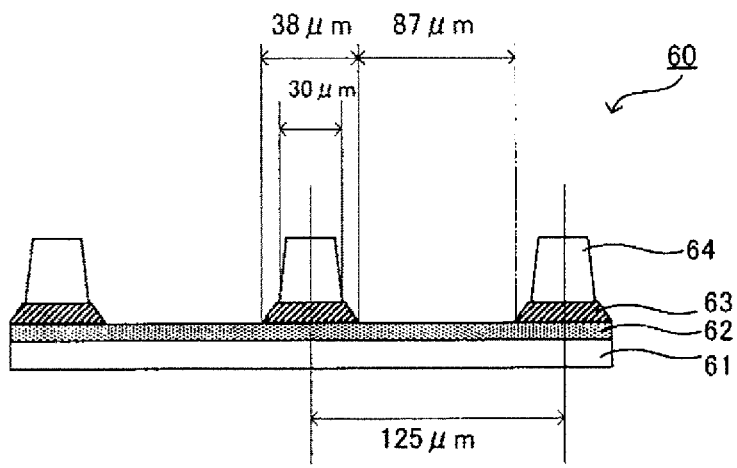
FIGS. 12(A) and 12(B) show examples of the ITO substrate used in the present invention, on which an insulation layer and a bank are formed.
Figure 12B:
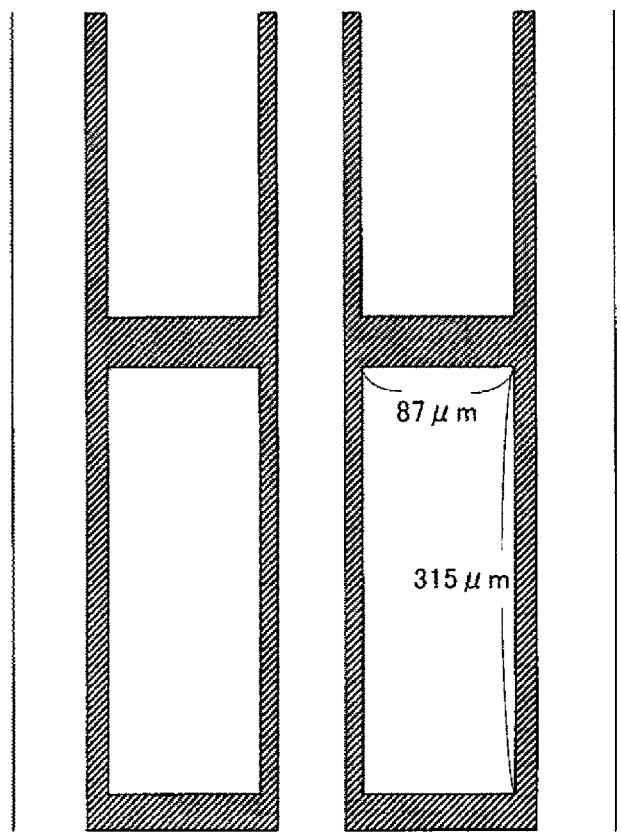

On an ITO substrate on which an insulation layer and a bank are formed (FIG. 12(A) shows a partially enlarged schematic sectional view of the same, while FIG. 12(B) shows a partially enlarged, schematic overhead plan view thereof), a hole injection transport layer was formed. The hole injection transport layer was exposed using a photomask with a photocatalyst to form a pattern with altered wettability. A hole transport layer and a light emitting layer were formed by ink jet method in a part between the banks, the part being a lyophilic part, and the basic layer structure, that is, a hole blocking layer, an electron transport layer, an electron injection layer and a cathode were formed, stacked and encapsulated, thereby producing an organic EL device which emits green light. The light emitting surface of the organic EL device was observed. The light emitting layer was formed by separately applying two colors of green and blue.

First, an ITO substrate on which an insulation layer in a grid shape and a bank in a line shape as shown in FIGS. 12(A) and 12(B) are formed, was subjected to ultrasonic cleaning with a neutral detergent and then ultrapure water, and a UV ozone treatment was finally performed thereon.

Next, as the hole injection transport layer, a Mo-containing nanoparticle thin layer was formed on the substrate by spin coating an ink for forming a hole injection transport layer. The ink for forming a hole injection transport layer was prepared as follows: 0.012 g of the device material for a hole injection transport layer obtained in Synthesis Example 1 was dissolved in 3.0 g of heptafluoro-n-ethyl butyrate to prepare a 0.4 wt % solution, which is the ink for forming a hole injection transport layer. After forming the layer, the layer was dried on a hot plate at 200° C. The thickness of the dried layer was 10 nm. As a result of measuring the contact angle in a planar part with no bank structure, the contact angle of the surface of the hole injection transport layer with respect to xylene was 58°.

Next, using a photomask in which a light shielding region in a line shape is formed so that an opening shown in FIG. 12(B) is 90 µm, the photomask is adjusted so that the opening is positioned above the bank in a line shape. Then, the substrate was exposed to form a pattern with altered wettability which have a high contrast in liquid repellency therebetween. Using a UV exposure apparatus equipped with a high pressure mercury lamp and a positioning mechanism for positioning the photomask with the photocatalyst-containing layer and the substrate, the photomask with the photocatalyst-containing layer and the hole injection transport layer were adjusted so that the distance between the photocatalyst-containing layer of the photomask and the hole injection transport layer is 100 µm; thereafter, light at 254 nm was applied from the back side of the photomask with the photocatalyst-containing layer for three minutes so that the amount of exposure to light is 5 J/cm$^2$. As a result of measuring the contact angle in the planar part with no bank structure, the part being the exposed part, the contact angle of the surface of the hole injection transport layer with respect to xylene was 5° or less and rendered lyophilic.

Next, a hole transport layer was formed by applying a coating liquid of the following composition for forming hole transport layers to the lyophilic region formed between the banks by an ink jet method. After forming the layer, the layer was dried at 200° C. for 60 minutes in a nitrogen atmosphere. The amount of the applied ink was controlled so that the thickness of the dried layer is 30 nm.

(Coating Liquid for Forming Hole Transport Layers)
    Poly[(9,9-dioctylfluorenyl-2,7-diyl)-co-(4,4'-(N-(4-sec-butylphenyl))diphenylamine)] (TFB): 1.8 parts by weight
    Methylanisole: 98.2 parts by weight Next, a coating liquid of the following composition for forming a green light emitting layer was applied onto every other line onto the hole transport layer formed between the banks by an ink jet method. Then, a coating liquid for forming a blue light emitting layer was applied by an ink jet method onto every other line where the coating liquid for forming a green light emitting layer is not applied, thereby forming a light emitting layer in which green and blue layers are aligned on every other line. After forming the layer, the layer was dried at 100° C. for 30 minutes in a nitrogen atmosphere. The applied amount of the inks were controlled so that the thickness of the dried layer is 40 nm.

(Coating Liquid for Forming a Green Light Emitting Layer)
    2-methyl-9,10-bis(naphthalene-2-yl)anthracene (MADN): 1.8 parts by weight
    9,10-bis[N,N-di-(p-tolyl)-amino]anthracene (TTPA): 0.02 part by weight
    Ethyl benzoate: 98 parts by weight
(Coating Liquid for Forming a Blue Light Emitting Layer)
    2-methyl-9,10-bis(naphthalene-2-yl)anthracene (MADN): 1.8 parts by weight
    1-tert-butyl-perylene (TBP): 0.02 part by weight
    Ethyl benzoate: 98 parts by weight A hole blocking layer was uniformly formed on the light emitting layer by vapor-deposition. The hole blocking layer was formed as follows: a bis(2-methyl-8-quinolinolato)(p-phenyl phenolate) aluminum complex (BAlq) was used as the block forming material and vapor-deposited by a resistance heating method in a vacuum (pressure: $1\times10^{-4}$ Pa) so that the thickness of the resulting BAlq vapor-deposited layer is 15 nm.

An electron transport layer was formed on the hole blocking layer by vapor-deposition. The electron transport layer was formed as follows: a tris(8-quinolinolato) aluminum complex (Alq3) was vapor-deposited by a resistance heating method in a vacuum (pressure: $1\times10^{-4}$ Pa) so that the thickness of the resulting Alq3 vapor-deposited layer is 20 nm.

In addition, an electron injection layer and a cathode were successively formed by vapor-deposition on the hole transport layer of the thus-produced product consisting of the glass substrate with the transparent anode/the hole injection transport layer/the hole transport layer/the light emitting layer/the hole blocking layer/the electron transport layer. The electron injection layer and cathode are vapor-deposited layers formed successively with LiF (thickness: 0.5 nm) and Al (thickness: 100 nm), respectively, by a resistance heating vapor-deposition method in a vacuum (pressure: $1\times10^{-4}$ Pa).

After forming the cathode, the layers were encapsulated with non-alkali glass and a UV-curable epoxy adhesive, inside a glove box under the condition of low oxygen and low humidity.

After forming the light emitting layer, the light emitting layer was observed with a fluorescence microscope. As a result, it was confirmed that green and blue layers are clearly applied separately without the green and blue inks being mixed. Moreover, as a result of observing the light emitting surface of the thus-produced device with the microscope, it was confirmed that a device which emits blue and green lights on every other line. In each pixel, light emission within the pixel is uniform, and the variation in light emission between the pixels is small, so that it was confirmed that pixels are applied separately with very high accuracy.

In this example, two colors of green and blue were applied separately. According to the method of the present invention, in principle, it is possible to easily and separately apply pixels in more colors such as three or four colors, and the method can be easily applied to the production of a panel formed by separately applying RGB pixels.

Example 15

The organic EL device of Example 15 was produced in the same manner as Example 14, except that the hole injection transport layer was exposed to vacuum ultraviolet light, in place of ultraviolet light at 253 nm, as the exposure light source and a photomask with no photocatalyst was used in place of the photomask with a photocatalyst. At this time, vacuum ultraviolet light having a wavelength of 172 nm was applied from the photomask side so that the amount of the applied light is 5 J/cm², thereby forming a pattern comprising a liquid-repellent region and a lyophilic region.

As a result of observing the light emitting surface of the thus-produced device with a microscope, it was confirmed that a device which emits blue and green lights on every other line. In each pixel, light emission within the pixel is uniform, and the variation in light emission between the pixels is small, so that it was confirmed that pixels are applied separately with very high accuracy.

In this example, two colors of green and blue pixels were applied separately. According to the method of the present invention, in principle, it is possible to easily and separately apply pixels in more colors such as three or four colors, and the method can be easily applied to the production of a panel formed by separately applying RGB pixels.

Example 16

The organic EL device of Example 16 was produced in the same manner as Example 14, except that the device material for a hole injection transport layer obtained in Synthesis Example 2 was used in place of the device material for a hole injection transport layer obtained in Synthesis Example 1.

As a result of observing the light emitting surface of the thus-produced device with a microscope, it was confirmed that a device which emits blue and green lights on every other line. In each pixel, light emission within the pixel is uniform, and the variation in light emission between the pixels is small, so that it was confirmed that pixels are applied separately with very high accuracy.

Example 17

The organic EL device of Example 17 was produced in the same manner as Example 14, except that an ITO substrate on which only an insulation layer is formed and no bank is formed, was used in place of the ITO substrate on which an insulation layer and a bank are formed.

After forming a light emitting layer, the light forming layer was observed with a fluorescence microscope. As a result, it was confirmed that although there is no bank structure, green and blue layers are clearly applied separately without the green and blue inks being mixed. Moreover, as a result of observing the light emitting surface of the thus-produced device with the microscope, it was confirmed that a device which emits blue and green lights on every other line. In each pixel, light emission within the pixel is uniform, and the variation in light emission between the pixels is small, so that it was confirmed that pixels are applied separately with very high accuracy.

In this example, two colors of green and blue were applied separately. According to the method of the present invention, in principle, it is possible to easily and separately apply pixels in more colors such as three or four colors, and the method can be easily applied to the production of a panel formed by separately applying RGB pixels.

Example 18

The organic EL device of Example 18 was formed in the same manner as Example 14, except that a photomask with a photocatalyst which has no chrome pattern was used in place of the photomask with a photocatalyst which has a chrome pattern, and light at 254 nm was applied for 9 minutes from the ITO substrate side so as to reach 15 J/cm², not from the back side of the photomask with the photocatalyst-containing layer.

As a result of observing the light emitting surface of the thus-produced device with a microscope, it was confirmed that a device which emits blue and green lights on every other line. In each pixel, light emission within the pixel is uniform, and the variation in light emission between the pixels is small, so that it was confirmed that pixels are applied separately with very high accuracy.

The device material for a hole injection transport layer obtained in Synthesis Example 1 has high transmittance at 254 nm and, as shown in the above Examples, the device properties do not degraded by UV irradiation at 254 nm, so that it is clear that the device material is advantageous in exposure from the back side.

Comparative Example 6

The organic EL device of Comparative Example 6 was produced in the same manner as Example 14, except that a thin layer was formed by spin coating PEDOT/PSS (AI4083 manufactured by H.C. Starck Ltd.) and another layer of 4-(3, 3,4,4,5,5,6,6,7,7,8,8,9,9,10,10,10-heptadecafluorodecyl)benzylamine, in place of the device material for a hole injection transport layer obtained in Synthesis Example 1. The PEDOT/PSS layer was produced in such a manner that a PEDOT/PSS solution was diluted with distilled water and dissolved so that the thickness of the layer is 15 nm when dried. Next, a solution obtained by dissolving 0.4 wt % heptadecafluorodecylbenzylamine in heptafluoro-n-ethyl butyrate was applied to form a thin layer, and the layer was dried. The thickness of the dried layer was unmeasurable and 5 nm or less.

As a result of observing the light emitting surface of the thus-produced device, it was confirmed that the green and blue inks were extremely mixed, the variation in light emission between the pixels was very large, and the liquid-repellent layer did not work at all.

REFERENCE SIGNS LIST

1. Device substrate
2. Substrate
3. First electrode layer
4. Hole injection transport layer
5. Fluorine-decomposed part of hole injection transport layer
6a. Divider (bank)
6b. Divider (insulation layer)
11. Lyophilic region
12. Liquid-repellent region
21. Photocatalyst-containing layer substrate
22. Base
23. Light shielding part
24. Photocatalyst-containing layer
27. Energy rays
28. Laser
29. Vacuum ultraviolet light
30. Metal mask
31. Organic EL device
32. Light emitting layer
33. Electron injection transport layer
34. Second electrode layer
41. Glass substrate
42. ITO transparent substrate (anode)
43. Hole injection transport layer
50. Photomask with photocatalyst-containing layer
51. Synthetic quartz substrate
52. Transparent region
53. Light shielding region
54. Chrome mask
55. Photocatalyst-containing layer
56. Transparent region in which no photocatalyst-containing layer is formed
60. ITO substrate on which insulation layer and bank are formed
61. Glass substrate
62. ITO transparent substrate (anode)
63. Divider (insulation layer)
64. Divider (bank)

The invention claimed is:
1. A device material for a hole injection transport layer, comprising:
  a transition metal-containing nanoparticle or nanocluster which contains a transition metal oxide and
  a fluorine-containing organic compound attached to the surface of the transition metal-containing nanoparticle or nanocluster by a protective agent in which a linking group which functions to link to the transition metal oxide is contained at the terminal end of a fluorine-containing organic compound;

wherein at least one kind of metal selected from the group consisting of molybdenum and vanadium is contained as the transition metal in the transition metal oxide contained in the transition metal-containing nanoparticle or nanocluster; and wherein the linking group is one or more kinds selected from the group consisting of ammonium salt and functional groups represented by the following formulae (1a) to (1l) and (1-n):

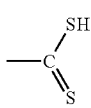

wherein Z1, Z2 and Z3 are each independently a halogen atom or alkoxy group.

2. The device material for a hole injection transport layer according to claim 1, wherein the fluorine-containing organic compound contains a fluorinated alkyl group.

3. An ink for forming a hole injection transport layer, comprising the device material for a hole injection transport layer defined by claim 1 and an organic solvent.

4. A method for producing a device comprising two or more electrodes facing each other on a substrate and a hole injection transport layer disposed between two of the electrodes, the method comprising the steps of:
forming a hole injection transport layer comprising the device material for a hole injection transport layer defined by claim 1 on a substrate on which first electrode layers are formed in a pattern, and
forming a pattern with altered wettability on a surface of the hole injection transport layer by disposing a photocatalyst-containing layer substrate in which a photocatalyst-containing layer containing at least a photocatalyst is formed on a base above the hole injection transport layer, with a gap which allows photocatalytic action associated with energy irradiation to affect the hole injection transport layer, and then by performing patterned energy irradiation.

5. The method for producing the device according to claim 4, further comprising the step of forming a divider between the first electrode layers formed in a pattern on the substrate before the step of forming a hole injection transport layer.

6. The method for producing the device according to claim 5, wherein the substrate on which the first electrode layers are formed is a transparent substrate; the divider is a divider which reflects or absorbs the energy rays applied in the step of forming a pattern with altered wettability; and in the step of forming a pattern with altered wettability, the pattern with altered wettability is formed on a surface of the hole injection transport layer by applying energy from the transparent substrate side.

7. The method for producing the device according to claim 4, wherein the method of performing patterned energy irradiation in the step of forming a pattern with altered wettability is a method of performing patterned energy irradiation using a mask.

8. The method for producing the device according to claim 4, wherein the method of performing patterned energy irradiation in the step of forming a pattern with altered wettability is a method of performing patterned energy irradiation by scanning ultraviolet laser in a pattern.

9. A method for producing a device comprising two or more electrodes facing each other on a substrate and a hole injection transport layer disposed between two of the electrodes, the method comprising the steps of:
forming a hole injection transport layer comprising the device material for a hole injection transport layer defined by claim 1 on a substrate on which electrode layers are formed in a pattern, and
forming a pattern with altered wettability on a surface of the hole injection transport layer by patterned vacuum ultraviolet irradiation.

10. The method for producing the device according to claim 4, wherein the hole injection transport layer forming step comprises the steps of preparing an ink for forming a hole injection transport layer, which comprises a device material for a hole injection transport layer, wherein a fluorine-containing organic compound is attached to the surface of a transition metal-containing nanoparticle or nanocluster which contains at least a transition metal oxide and an organic solvent, and heating the ink in the presence of oxygen.

11. A device comprising two or more electrodes facing each other on a substrate and a hole injection transport layer disposed between two of the electrodes,
wherein the hole injection transport layer comprises a device material for a hole injection transport layer, comprising: a transition metal-containing nanoparticle or nanocluster which contains a transition metal oxide, and a fluorine-containing organic compound attached to the surface of the transition metal-containing nanoparticle or nanocluster, in which at least one kind of metal selected from the group consisting of molybdenum and vanadium is contained as the transition metal in the transition metal oxide contained in the transition metal-containing nanoparticle or nanocluster, and
wherein the fluorine-containing organic compound of the device material in the surface part of the hole injection transport layer is decomposed and removed.

12. A device comprising two or more electrodes facing each other on a substrate and a hole injection transport layer disposed between two of the electrodes,
wherein the device has a divider between the first electrode layers formed in a pattern on the substrate, and the device has the continuous hole injection transport layer on the first electrode layers in an opening of the divider and on the divider;
wherein the hole injection transport layer on the top of the divider contains a device material for a hole injection transport layer, comprising a transition metal-containing nanoparticle or nanocluster which contains a transition metal oxide, and a fluorine-containing organic compound attached to the surface of the transition metal-containing nanoparticle or nanocluster, in which at least one kind of metal selected from the group consisting of molybdenum and vanadium is contained as the transition metal in the transition metal oxide contained in the transition metal-containing nanoparticle or nanocluster; and
wherein, in the hole injection transport layer on the first electrode layers in the opening of the divider and on the side of the divider, at least part of the fluorine-containing organic compound of the device for a hole injection transport layer is decomposed and removed.

13. The device according to claim 11, wherein the device is an organic EL device comprising an organic layer which comprises at least a light emitting layer.

14. The device according to claim 12, wherein the device is an organic EL device comprising an organic layer which comprises at least a light emitting layer.

15. The method for producing the device according to claim 9 wherein the hole injection transport layer forming step comprises the steps of preparing an ink for forming a hole injection transport layer, which comprises a device material for a hole injection transport layer, wherein a fluorine-containing organic compound is attached to the surface of a transition metal-containing nanoparticle or nanocluster which contains at least a transition metal oxide and an organic solvent, and heating the ink in the presence of oxygen.

16. A device material for a hole injection transport layer, comprising:
   a transition metal-containing nanoparticle or nanocluster which contains tungsten oxide and
   a fluorine-containing organic compound attached to the surface of the transition metal-containing nanoparticle or nanocluster by a protective agent in which a linking group links to the tungsten oxide, and is contained at the terminal end of a fluorine-containing organic compound, and
   wherein the linking group is one or more functional groups represented by the following formulae:

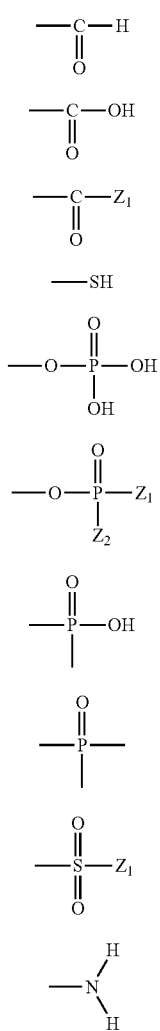

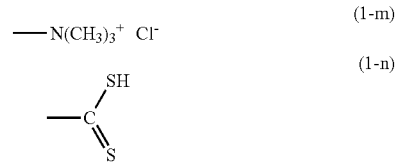

wherein $Z_1$ and $Z_2$ are each independently a halogen atom or alkoxy group.

17. The device material for a hole injection transport layer according to claim 16, wherein the protective agent is represented by the following general formula (I):

$$Y\text{-}Q\text{-}(A'\text{-}FQ')_n\text{-}(A\text{-}FQ) \qquad \text{General formula (I)}$$

wherein Y is the linking group; Q is a linear, branched or cyclic aliphatic hydrocarbon group, aromatic hydrocarbon group, aliphatic heterocyclic group, aromatic heterocyclic group or a combination thereof, or a direct bond; A and A' are each independently —NH—, —N=, —S—, —O—, —NH(C=O)—, —O—(C=O)—, —O—(SO$_2$)—, —O—(C=O)—O—, —S—(C=O)—O— or a direct bond; FQ and FQ' are each independently the fluorine-containing organic compound; and n is an integer of 0 or 1 or more.

18. An ink for forming a hole injection transport layer, comprising the device material for a hole injection transport layer defined by claim 16 and an organic solvent.

19. A device comprising two or more electrodes facing each other on a substrate and a hole injection transport layer disposed between two of the electrodes,
   wherein the hole injection transport layer comprises the device material for a hole injection transport layer defined by claim 16, and the fluorine-containing organic compound of the device material in the surface part of the hole injection transport layer is decomposed and removed.

20. A device comprising two or more electrodes facing each other on a substrate and a hole injection transport layer disposed between two of the electrodes,
   wherein the device has a divider between the first electrode layers formed in a pattern on the substrate, and the device has the continuous hole injection transport layer on the first electrode layers in an opening of the divider and on the divider, and
   wherein, in the hole injection transport layer on the first electrode layers in the opening of the divider and on the side of the divider, at least part of the fluorine-containing organic compound of the device material for a hole injection transport layer defined by claim 16 is decomposed and removed, and the hole injection transport layer on the top of the divider contains the device material for a hole injection transport layer defined by claim 16.

* * * * *